US009952509B2

(12) United States Patent
Kato et al.

(10) Patent No.: US 9,952,509 B2
(45) Date of Patent: Apr. 24, 2018

(54) PATTERN FORMING METHOD, ACTINIC RAY-SENSITIVE OR RADIATION-SENSITIVE RESIN COMPOSITION, METHOD FOR MANUFACTURING ELECTRONIC DEVICE, AND ELECTRONIC DEVICE

(71) Applicant: FUJIFILM Corporation, Tokyo (JP)

(72) Inventors: Keita Kato, Shizuoka (JP); Keiyu Ou, Shizuoka (JP); Michihiro Shirakawa, Shizuoka (JP); Akiyoshi Goto, Shizuoka (JP); Masafumi Kojima, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/200,059

(22) Filed: Jul. 1, 2016

(65) Prior Publication Data

US 2016/0313645 A1 Oct. 27, 2016

Related U.S. Application Data

(63) Continuation of application No. PCT/JP2014/084449, filed on Dec. 26, 2014.

(30) Foreign Application Priority Data

Jan. 29, 2014 (JP) .................................. 2014-014773

(51) Int. Cl.
G03F 7/26 (2006.01)
G03F 7/004 (2006.01)
G03F 7/32 (2006.01)
G03F 7/11 (2006.01)
G03F 7/039 (2006.01)
G03F 7/20 (2006.01)

(52) U.S. Cl.
CPC .......... *G03F 7/0397* (2013.01); *G03F 7/0045* (2013.01); *G03F 7/0046* (2013.01); *G03F 7/11* (2013.01); *G03F 7/2035* (2013.01); *G03F 7/2041* (2013.01); *G03F 7/322* (2013.01); *G03F 7/325* (2013.01)

(58) Field of Classification Search
CPC . G03F 7/26; G03F 7/40; G03F 7/0397; G03F 7/2041; G03F 7/325; G03F 7/0045
USPC ...................... 430/270.1, 325, 921, 922, 910
See application file for complete search history.

(56) References Cited

U.S. PATENT DOCUMENTS

| 2010/0221659 A1* | 9/2010 | Ebata ..................... C07C 309/19 430/270.1 |
| 2012/0135350 A1 | 5/2012 | Kobayashi et al. |
| 2012/0164582 A1* | 6/2012 | Maruyama ............ C07C 307/06 430/285.1 |
| 2013/0130183 A1 | 5/2013 | Kobayashi et al. |
| 2013/0149644 A1* | 6/2013 | Maruyama ............... C07C 25/18 430/270.1 |
| 2013/0344435 A1 | 12/2013 | Utsumi et al. |
| 2014/0199629 A1 | 7/2014 | Ohashi et al. |
| 2014/0212808 A1 | 7/2014 | Fumatsu et al. |
| 2014/0248562 A1 | 9/2014 | Shibuya et al. |
| 2014/0255843 A1 | 9/2014 | Kobayashi et al. |
| 2014/0322650 A1 | 10/2014 | Ohashi et al. |
| 2016/0103395 A1 | 4/2016 | Tsubaki et al. |

FOREIGN PATENT DOCUMENTS

| JP | 2008-292975 A | 12/2008 |
| JP | 2011-186247 A | 9/2011 |
| JP | 2012-113143 A | 6/2012 |
| JP | 2013-105165 A | 5/2013 |
| JP | 2014-002323 A | 1/2014 |
| JP | 2014-6491 A | 1/2014 |

(Continued)

OTHER PUBLICATIONS

International Search Report for PCT/JP2014/084449 dated Feb. 10, 2015 [PCT/ISA/210].
Written Opinion for PCT/JP2014/084449 dated Feb. 10, 2015 [PCT/ISA/237].
Communication dated Sep. 21, 2016, issued by the Korean Intellectual Property Office in corresponding Korean Application No. 10-2016-7017683.
Office Action dated Jan. 18, 2017, from the Korean Intellectual Property Office in counterpart Korean Application No. 10-2016-7017683.

(Continued)

*Primary Examiner* — John S Chu
(74) *Attorney, Agent, or Firm* — Sughrue Mion, PLLC

(57) ABSTRACT

The present invention relates to a pattern forming method including:
forming a film using an actinic ray-sensitive or radiation-sensitive resin composition that includes a (A) resin which has an increase in the polarity by the action of an acid, and thus, has a decrease in the solubility in a developer containing an organic solvent, a (B) compound capable of generating an acid upon irradiation with specific actinic ray or radiation, and a (C) solvent, exposing the film, and
developing the exposed film using a developer including an organic solvent, in which
the resin (A) has a structure in which a polar group is protected with a leaving group which decomposes to leave by the action of an acid, and the leaving group is a group represented by the following General Formula (I).

(I)

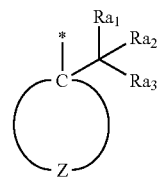

6 Claims, No Drawings

(56) References Cited

FOREIGN PATENT DOCUMENTS

| JP | 2014-133723 A | 7/2014 |
|---|---|---|
| JP | 2014-145809 A | 8/2014 |
| JP | 2014-170167 A | 9/2014 |
| JP | 2014-225005 A | 12/2014 |
| KR | 10-2014-0091443 A | 7/2014 |
| TW | 201211689 A1 | 3/2012 |

OTHER PUBLICATIONS

Office Action dated Feb. 28, 2017 issued by the Japanese Patent Office in counterpart Japanese Application No. 2014-014773.
Office Action dated Nov. 29, 2017, issued by the Intellectual Property Office of Taiwan in counterpart Taiwanese Application No. 104100254 English Translation.

\* cited by examiner

PATTERN FORMING METHOD, ACTINIC RAY-SENSITIVE OR RADIATION-SENSITIVE RESIN COMPOSITION, METHOD FOR MANUFACTURING ELECTRONIC DEVICE, AND ELECTRONIC DEVICE

CROSS-REFERENCE TO RELATED APPLICATIONS

This application is a Continuation of PCT International Application No. PCT/JP2014/84449, filed on Dec. 26, 2014, which claims priority under 35 U.S.C. § 119(a) to Japanese Patent Application No. 2014-14773, filed on Jan. 29, 2014. Each of the above application(s) is hereby expressly incorporated by reference, in its entirety, into the present application.

BACKGROUND OF THE INVENTION

1. Field of the Invention

The present invention relates to a pattern forming method and an actinic ray-sensitive or radiation-sensitive resin composition for use in the method. More specifically, the present invention relates to a negative type pattern forming method which is suitably used for a process for manufacturing a semiconductor such as an IC, a process for manufacture of liquid crystals and a circuit board for a thermal head or the like, and a process used in other lithographic processes of photofabrication; and an actinic ray-sensitive or radiation-sensitive resin composition used in the same. In addition, the present invention further relates to a method for manufacturing an electronic device, including the pattern forming method, and an electronic device manufactured by the method.

2. Description of the Related Art

Since a resist for a KrF excimer laser (248 nm) was developed, a pattern forming method using chemical amplification has been used in order to complement desensitization caused by light absorption. For example, in a positive type chemical amplification method, first, a photoacid generator included in an exposed area decomposes upon irradiation with light and generates an acid. Thereafter, in a process such as post exposure bake (PEB), and the like, an alkali-insoluble group included in the actinic ray-sensitive or radiation-sensitive resin composition is changed to an alkali-soluble group by the catalytic action of the generated acid. Subsequently, development is carried out, using, for example, an alkali solution. Accordingly, the exposed area is removed to obtain a desired pattern.

In the above method, various alkali developers have been suggested as an alkali developer. For example, as the alkali developer, a water-based alkaline developer with 2.38% by mass of an aqueous tetramethylammonium hydroxide solution (TMAH) is universally used.

In order to make semiconductor elements finer, a wavelength of an exposure light source has been shortened and a projection lens with a high numerical aperture (high NA) has been advanced. Thus, an exposure machine using an ArF excimer laser having a wavelength of 193 nm as a light source has been currently developed. As a technique for further improving resolving power, a method (that is, a liquid immersion method) of filling a liquid having a high refractive index (hereinafter also referred to as an "immersion liquid") between a projection lens and a sample has been proposed. In addition, EUV lithography that performs exposure with ultraviolet rays at a shorter wavelength (13.5 nm) has also been proposed.

Under these circumstances, various configurations have been proposed as a positive type resist composition. In addition, a pattern forming method using not only the current mainstream positive type but also a negative type developer, which is a developer containing an organic solvent is being developed (see, for example, JP2013-105165A and JP2008-292975A). This reflects the situation in which in the manufacture of a semiconductor element or the like, while there is a demand for the formation of a pattern with various configurations such as a line, a trench, and a hole, there exist patterns which are hardly formed with current positive type resists.

SUMMARY OF THE INVENTION

However, from the viewpoints of overall performance as a resist, it is very difficult to discover appropriate combinations of resins to be used, photoacid generators, basic compounds, additives, solvents, and the like, which are still insufficient at present. For example, in a pattern forming method using a developer containing an organic solvent, there is a demand of developing a resist composition having excellent post exposure heating (PEB) temperature dependence (hereinafter also referred to as PEBs) and density dependence.

The present invention has been made in consideration of the problems, and has an object to provide a pattern forming method satisfying both of excellent PEB temperature dependence and excellent density dependence to a high degree; an actinic ray-sensitive or radiation-sensitive resin composition used in the pattern forming method; and a method for manufacturing an electronic device, using the pattern forming method, and an electronic device.

The present invention has the following configuration, and thus, the problems of the present invention are solved.

[1] A pattern forming method comprising:

forming a film using an actinic ray-sensitive or radiation-sensitive resin composition including (A) a resin which has an increase in the polarity by the action of an acid, and thus, has a decrease in the solubility in a developer containing an organic solvent, (B) a compound capable of generating an acid upon irradiation with actinic ray or radiation, represented by the following General Formula (ZI-3) or (ZI-4), and (C) a solvent, exposing the film, and developing the exposed film using a developer including an organic solvent, in which the resin (A) has a structure in which a polar group is protected with a leaving group that decomposes to leave by the action of an acid, and the leaving group is a group represented by the following General Formula (I):

in General Formula (I), Z represents a group which is combined with a carbon atom to form a ring structure, $Ra_1$ to $Ra_3$ each independently represent an organic group, at least two members out of $Ra_1$ to $Ra_3$ may be bonded to each other to form a ring, and * represents a direct bond;

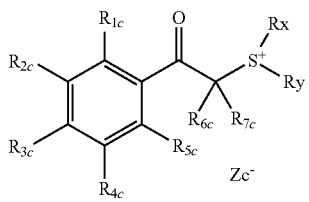

(ZI-3)

in General Formula (ZI-3), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group, $R_{6c}$ and $R_{7c}$ each independently represent a hydrogen atom, an alkyl group, a cycloalkyl group, a halogen atom, a cyano group, or an aryl group.

Rx and Ry each independently represent an alkyl group, a cycloalkyl group, a 2-oxoalkyl group, a 2-oxocycloalkyl group, an alkoxycarbonylalkyl group, an allyl group, or a vinyl group, among any two or more members out of $R_{1c}$ to $R_{5c}$, $R_{5c}$ and $R_{6c}$, $R_{6c}$ and $R_{7c}$, $R_{5c}$ and Rx, and Rx and Ry each may be bonded to each other to form a ring structure, and the ring structure may contain an oxygen atom, a sulfur atom, a ketone group, an ester bond, or an amide bond, $Zc^-$ represents a non-nucleophilic anion:

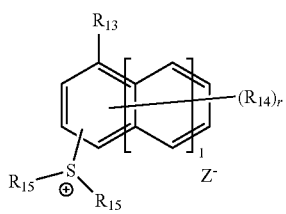

(ZI-4)

in General Formula (ZI-4), $R_{13}$ represents a group having a hydrogen atom, a fluorine atom, a hydroxyl group, an alkyl group, a cycloalkyl group, an alkoxy group, an alkoxycarbonyl group, or a cycloalkyl group, $R_{14}$'s, in the case where they are present in plural numbers, each independently represent a group having a hydroxyl group, an alkyl group, a cycloalkyl group, an alkoxy group, an alkoxycarbonyl group, an alkylcarbonyl group, an alkylsulfonyl group, a cycloalkylsulfonyl group, or a cycloalkyl group, $R_{15}$'s each independently represent an alkyl group, a cycloalkyl group, or a naphthyl group, two $R_{15}$'s may be bonded to each other to form a ring, and the ring structure may contain an oxygen atom, a sulfur atom, a ketone group, an ester bond, or an amide bond.

l represents an integer of 0 to 2, r represents an integer of 0 to 8, and $Z^-$ represents a non-nucleophilic anion.

[2] The pattern forming method as described in [1], in which the compound (B) is a compound capable of generating an acid represented by the following General Formula (II) upon irradiation with actinic ray or radiation:

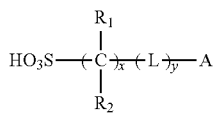

(II)

in General Formula (II), $R_1$ and $R_2$ each independently represent a hydrogen atom, a fluorine atom, or an alkyl group, and $R_1$ and $R_2$, in the case where they are present in plural numbers, may be the same as or different from each other, L represents a divalent linking group and L's in the case where they are present in plural numbers may be the same as or different from each other, A represents a cyclic organic group, x represents an integer of 0 to 20, and y represents an integer of 0 to 10.

[3] The pattern forming method as described in [1] or [2], in which the content of the compound (B) is more than 5% by mass with respect to the total solid content of the actinic ray-sensitive or radiation-sensitive resin composition.

[4] The pattern forming method as described in any one of [1] to [3], in which the actinic ray-sensitive or radiation-sensitive resin composition further includes an onium salt composed of a relatively weak acid with respect to the acid generated from the compound (B) upon irradiation with actinic ray or radiation.

[5] The pattern forming method as described in any one of [1] to [4], in which the developer including an organic solvent is a developer containing at least one kind of solvent selected from a ketone-based solvent, an ester-based solvent, an alcohol-based solvent, an amide-based solvent, and an ether-based solvent.

[6] An active light sensitive or radiation sensitive resin composition used in the pattern forming method as described in any one of [1] to [5].

[7] A method for manufacturing an electronic device, comprising the pattern forming method as described in any one of [1] to [5].

[8] An electronic device manufactured by the method for manufacturing an electronic device as described in [7].

According to the present invention, it is possible to provide a pattern forming method satisfying both of excellent PEB temperature dependence and excellent density dependence to a high degree; an actinic ray-sensitive or radiation-sensitive resin composition used in the pattern forming method; and a method for manufacturing an electronic device, using the pattern forming method, and an electronic device.

DESCRIPTION OF THE PREFERRED EMBODIMENTS

Hereinafter, suitable embodiments of the present invention will be described in detail.

In citations for a group and an atomic group in the present specification, in the case where the group is denoted without specifying whether it is substituted or unsubstituted, the group includes both a group and an atomic group not having a substituent, and a group and an atomic group having a substituent. For example, an "alkyl group" which is not denoted about whether it is substituted or unsubstituted includes not only an alkyl group not having a substituent (unsubstituted alkyl group), but also an alkyl group having a substituent (substituted alkyl group).

In the present invention, "actinic ray" or "radiation" means, for example, a bright line spectrum of a mercury lamp, far ultraviolet rays represented by an excimer laser, extreme ultraviolet rays (EUV light), X-rays, and particle rays such as electron beams, ion beams, or the like. In addition, in the present invention, "light" means actinic ray or radiation.

Furthermore, "exposure" in the present specification includes, unless otherwise specified, not only exposure by a mercury lamp, far ultraviolet rays represented by an excimer laser, X-rays, extreme ultraviolet rays (EUV light), or the like, but also writing by particle rays such as electron beams and ion beams.

In the present specification. "(meth)acrylate" means "at least one of acrylate and methacrylate".

The pattern forming method of the present invention comprises:

forming a film using an actinic ray-sensitive or radiation-sensitive resin composition including (A) a resin which has an increase in the polarity by the action of an acid, and thus, has a decrease in the solubility in a developer containing an organic solvent, (B) a compound capable of generating an acid upon irradiation with actinic ray or radiation, represented by the following General Formula (ZI-3) or (ZI-4), and (C) a solvent, exposing the film, and developing the exposed film using a developer including an organic solvent, in which the resin (A) has a structure in which a polar group is protected with a leaving group that decomposes to leave by the action of an acid, and the leaving group is a group represented by the following General Formula (I).

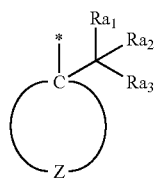

In General Formula (I), Z represents a group which is combined with a carbon atom to form a ring structure. $Ra_1$ to $Ra_3$ each independently represent an organic group, at least two members out of $Ra_1$ to $Ra_3$ may be bonded to each other to form a ring, and * represents a direct bond.

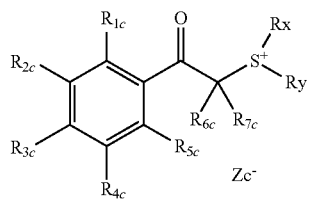

In General Formula (ZI-3), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group, $R_{6c}$ and $R_{7c}$ each independently represent a hydrogen atom, an alkyl group, a cycloalkyl group, a halogen atom, a cyano group, or an aryl group.

Rx and Ry each independently represent an alkyl group, a cycloalkyl group, a 2-oxoalkyl group, a 2-oxocycloalkyl group, an alkoxycarbonylalkyl group, an allyl group, or a vinyl group, among any two or more members out of $R_{1c}$ to $R_{5c}$, $R_{5c}$ and $R_{6c}$, $R_{6c}$ and $R_{7c}$, $R_{5c}$ and Rx, and Rx and Ry each may be bonded to each other to form a ring structure, and the ring structure may contain an oxygen atom, a sulfur atom, a ketone group, an ester bond, or an amide bond, and $Zc^-$ represents a non-nucleophilic anion.

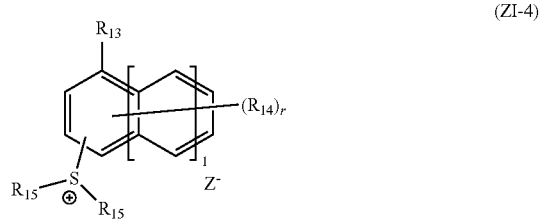

In General Formula (ZI-4), $R_{13}$ represents a group having a hydrogen atom, a fluorine atom, a hydroxyl group, an alkyl group, a cycloalkyl group, an alkoxy group, an alkoxycarbonyl group, or a cycloalkyl group, $R_{14}$'s, in the case where they are present in plural numbers, each independently represent a group having a hydroxyl group, an alkyl group, a cycloalkyl group, an alkoxy group, an alkoxycarbonyl group, an alkylcarbonyl group, an alkylsulfonyl group, a cycloalkylsulfonyl group, or a cycloalkyl group, $R_{15}$'s each independently represent an alkyl group, a cycloalkyl group, or a naphthyl group, two $R_{15}$'s may be bonded to each other to form a ring, and the ring structure may contain an oxygen atom, a sulfur atom, a ketone group, an ester bond, or an amide bond, l represents an integer of 0 to 2, r represents an integer of 0 to 8, and $Z^-$ represents a non-nucleophilic anion.

Hereinafter, first, the actinic ray-sensitive or radiation-sensitive resin composition which can be used in the present invention will be described.

Furthermore, the present invention also relates to an actinic ray-sensitive or radiation-sensitive resin composition which will be described later.

The actinic ray-sensitive or radiation-sensitive resin composition (hereinafter also simply referred to as a "composition") according to the present invention is used for negative type development (development in which the composition has a decrease in the solubility with respect to a developer at a time of exposure, and thus, an exposed area leaves as a pattern and an unexposed area is removed). That is, the actinic ray-sensitive or radiation-sensitive resin composition according to the present invention can be an actinic ray-sensitive or radiation-sensitive resin composition for development in an organic solvent, which is used for development using a developer including an organic solvent (in other words, an actinic ray-sensitive or radiation-sensitive resin composition used in the pattern forming method of the present invention). Here, being for development in an organic solvent means an application in a step of performing development using a developer including at least an organic solvent.

The actinic ray-sensitive or radiation-sensitive resin composition of the present invention is typically a resist composition, and is particularly preferably a negative type resist composition (that is, a resist composition for development in an organic solvent) in terms of obtaining significant effects. Further, the composition according to the present invention is typically a chemical amplification resist composition.

[1] (A) Resin which has Increase in Polarity by Action of Acid, and Thus, has Decrease in Solubility in Developer Containing Organic Solvent The composition of the present invention includes (A) a resin which has an increase in the polarity by the action of an acid, and thus, has a decrease in the solubility in a developer containing an organic solvent.

Here, the resin (A) has a structure in which a polar group is protected with a leaving group which decomposes to leave by the action of an acid, in which the leaving group is a group represented by the following General Formula (I).

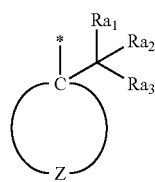

(I)

In General Formula (I), Z represents a group which is combined with a carbon atom to form a ring structure, $Ra_1$ to $Ra_3$ each independently represent an organic group, at least two members out of $Ra_1$ to $Ra_3$ may be bonded to each other to form a ring, and * represents a direct bond.

Examples of the organic group as $Ra_1$ to $Ra_3$ include a functional group (for example, an alkyl group, a cycloalkyl group, an aryl group, and a group formed by a combination of these groups) containing at least one carbon atom, and the group may contain a hetero atom (for example, an oxygen atom and a sulfur atom).

The organic group is preferably an organic group having 1 to 5 carbon atoms (more preferably an organic group having 1 to 3 carbon atoms), and more preferably an alkyl group having 1 to 5 carbon atoms (more preferably an alkyl group having 1 to 3 carbon atoms).

Examples of the ring which may be formed by the mutual bonding of at least two members out of $Ra_1$ to $Ra_3$ include an aromatic or non-aromatic hydrocarbon ring, an aromatic or non-aromatic heterocycle, and a polycyclic fused ring formed by combination of two or more members out of these rings. Examples of the ring structure include 3- to 10-membered rings, with 4- to 8-membered rings being preferable, and 5- or 6-membered rings being more preferable.

Among these, as the ring structure, a monocyclic alicyclic structure or a polycyclic alicyclic structure is preferable. As the monocyclic alicyclic structure, the structure having 3 to 8 carbon atoms is preferable, the structure having 5 to 8 carbon atoms is more preferable, the structure having 5 or 6 carbon atoms is still more preferable, and the structure having 5 carbon atoms is particularly preferable (further, the number of carbon atoms is a number inclusive of the number of carbon atoms linked to $Ra_1$ to $Ra_3$). As the polycyclic alicyclic structure, a norbomyl group, a tetracyclodecanyl group, a tetracylododecanyl group, or an adamantyl group is preferable.

Z represents a group which is combined with a carbon atom to form a ring structure. The ring structure may be monocyclic or polycyclic, and is preferably a monocyclic or polycyclic aliphatic hydrocarbon structure.

The ring structure may further have a substituent, and examples of the substituent include a hydroxyl group, a halogen atom (a fluorine atom, a chlorine atom, a bromine atom, an iodine atom, and the like), a nitro group, an alkyl group (s methyl group, an ethyl group, a propyl group, an n-butyl group, a sec-butyl group, a hexyl group, a 2-ethylhexyl group, an octyl group, and the like), a cyano group, an alkoxy group (a methoxy group, an ethoxy group, a hydroxyethoxy group, a propoxy group, a hydroxypropoxy group, a butoxy group, and the like), an alkoxycarbonyl group (a methoxycarbonyl group, an ethoxycarbonyl group, and the like), an acyl group (a formyl group, an acetyl group, a benzoyl group, and the like), an acyloxy group (an acetoxy group, a butyryloxy group, and the like), a cycloalkyl group (a cyclopentyl group, a cyclohexyl group, and the like), an aryl group (a phenyl group, a naphthyl group, and the like), and a carboxy group.

The number of carbon atoms in the ring member of the monocyclic aliphatic hydrocarbon structure is preferably 3 to 10.

Specific examples of the monocyclic aliphatic hydrocarbon structure which may have a substituent include a cyclopropyl group, a cyclobutyl group, a cyclopentyl group, a cyclohexyl group, a cycloheptyl group, a cyclooctyl group, a cyclododecanyl group, a cyclopentenyl group, a cyclohexenyl group, and a cyclooctadienyl group, with the cyclopropyl group, the cyclopentyl group, the cyclohexyl group, and the cyclooctyl group being particularly preferable.

The number of carbon atoms in the ring member of the polycyclic aliphatic hydrocarbon structure is preferably 6 to 20.

Specific examples of the polycyclic aliphatic hydrocarbon structure which may have a substituent include a bicyclo [4.3.0]nonanyl group, a naphthalenyl group, a decahydronaphthalenyl group, a 1,2,3,4-tetrahydronaphthalenyl group, a tricyclo[5.2.1.0$^{2,6}$]decanyl group, a bornyl group, an isobornyl group, a norbornyl group, an adamantyl group, a noradamantyl group, a 1,7,7-trimethyltricyclo[2.2.1.0$^{2,6}$] heptanyl group, and a 3,7,7-trimethylbicyclo[4.1.0]heptanyl group, with the norbomyl group, the adamantly group, and the noradamantyl group being particularly preferable.

Suitable Examples of the monocyclic or polycyclic aliphatic hydrocarbon structure include the following cyclic structures.

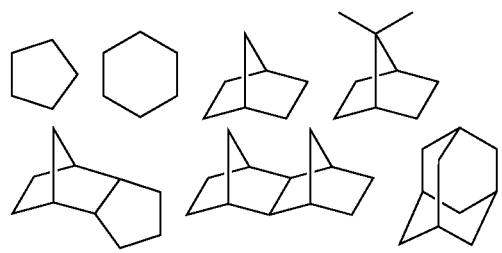

The ring structure in the "group which is combined with a carbon atom to form a ring structure" as Z may include a hetero atom such as an oxygen atom and a sulfur atom as a ring member.

The polar group in the "structure in which a polar group is protected with a leaving group which decomposes to leave by the action of an acid" is not particularly limited as long as the polar group is a group capable of being sparingly solubilized or insolubilized in a developer including an organic solvent, and examples thereof include an acidic group (a group capable of dissociating in 2.38% by mass of an aqueous tetramethylammonium hydroxide solution which has been used as a developer of a resist in the related art) such as a phenolic hydroxyl group, a carboxyl group, a fluorinated alcohol group (preferably a hexafluoroisopropanol group), a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group, or an alcoholic hydroxyl group.

Furthermore, the alcoholic hydroxyl group refers to a hydroxyl group bonded to a hydrocarbon group, which is other than a hydroxyl group (a phenolic hydroxyl group) directly bonded on an aromatic ring, and excludes an aliphatic alcohol (for example, a fluorinated alcohol group (a hexafluoroisopropanol group or the like)), of which the α-position is substituted with an electron withdrawing group such as a fluorine atom as a hydroxyl group. As the alcoholic hydroxyl group, a hydroxyl group having a pKa ranging from 12 to 20 is preferable.

Preferred examples of the polar group include a carboxyl group, a fluorinated alcohol group (preferably a hexafluoroisopropanol group), and a sulfonic acid group.

The resin (A) is preferably a resin having an acid-decomposable group (hereinafter also referred to as a "specific acid-decomposable group") having the "structure in which a polar group is protected with a leaving group which decomposes to leave by the action of an acid".

Suitable embodiments of the acid-decomposable group include a group represented by the following General Formula (Z).

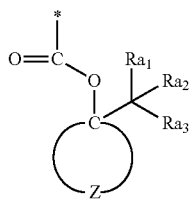

(Z)

In General Formula (Z), Z and $Ra_1$ to $Ra_3$ have the same definitions as in General Formula (I). At least two members out of $Ra_1$ to $Ra_3$ may be bonded to each other to form a ring. * represents a direct bond.

Specific examples of the ring which may be formed by the mutual bonding of at least two members out of Z, $Ra_1$ to $Ra_3$, and $Ra_1$ to $Ra_3$ in General Formula (Z), and preferred examples thereof are the same as described in General Formula (I).

The skeleton structure of the main chain of the resin having a partial structure represented by General Formula (Z) is not particularly limited, and examples thereof include a cycloolefin resin skeleton, a polyimide resin skeleton, an epoxy resin skeleton, a polyethylene resin skeleton, a polyester resin skeleton, a urethane resin skeleton, a novolac resin skeleton, a cresol resin skeleton, a (meth)acryl resin skeleton, and a styrene resin skeleton. Among these, in terms of easy synthesis, a (meth)acryl resin skeleton ((meth)acryl main chain structure) is preferable.

The acid-decomposable group may be included as a side chain bonded to the main chain of the resin (A), or may be included as being bonded to the main chain at a terminal. Preferably, the resin (A) having a repeating unit having the specific acid-decomposable group is preferable.

Among these, the resin (A) is preferably a resin having a repeating unit represented by General Formula (W).

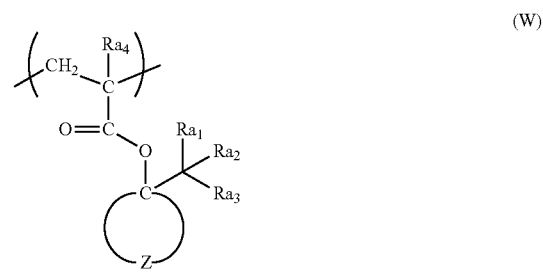

(W)

In General Formula (W), Z and $Ra_1$ to $Ra_3$ have the same definitions as in General Formula (I). At least two members out of $Ra_1$ to $Ra_3$ may be bonded to each other to form a ring.

In General Formula (W), $Ra_4$ represents a hydrogen atom or an alkyl group which may have a substituent.

Specific examples of a the ring which may be formed by the mutual bonding of at least two members out of Z, $Ra_1$ to $Ra_3$, and $Ra_1$ to $Ra_3$ in General Formula (W), and preferred examples thereof are the same as described in General Formula (I).

The alkyl group which may have a substituent as $Ra_4$ in General Formula (W) is preferably an alkyl group having 1 to 3 carbon atoms, and more preferably a methyl group.

A method for synthesizing the resin (A) is not particularly limited, and the resin (A) can be synthesized by polymerization of monomers including the specific acid-decomposable group.

Specific examples of the repeating unit having the specific acid-decomposable group are set forth below, but the present invention is not limited thereto.

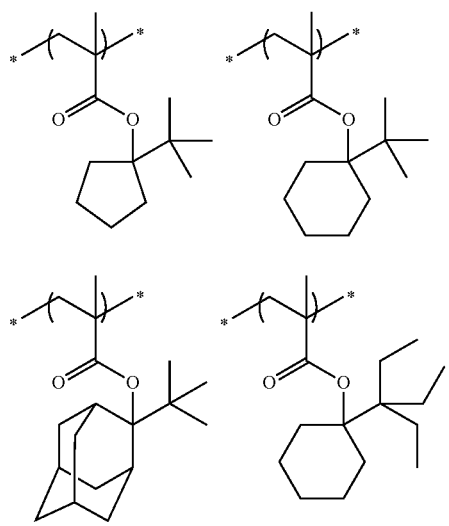

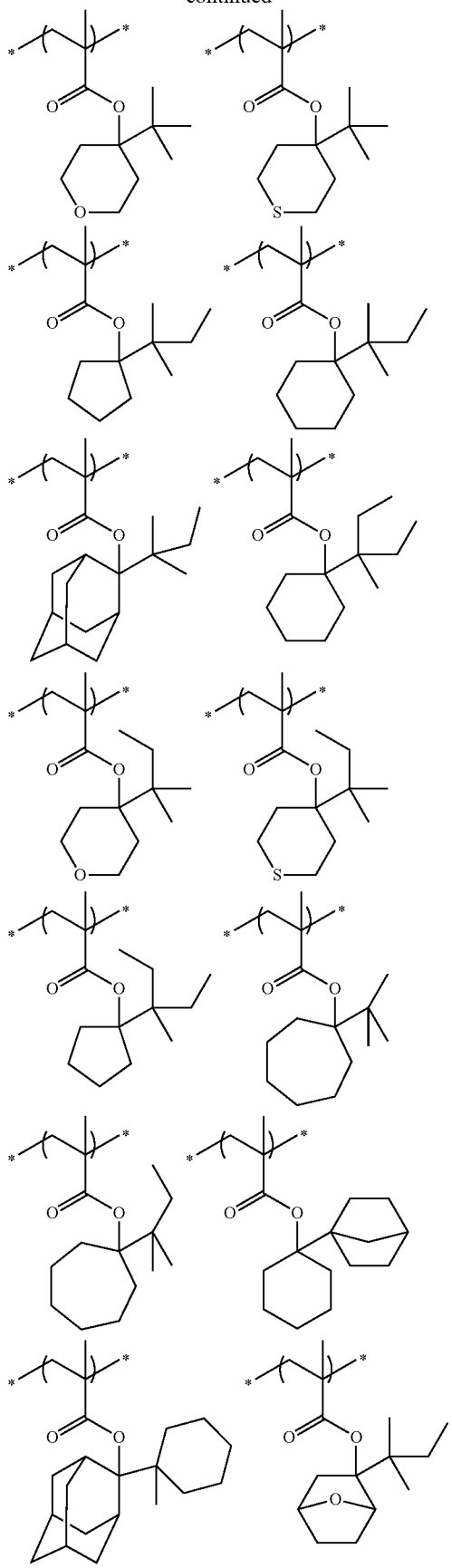
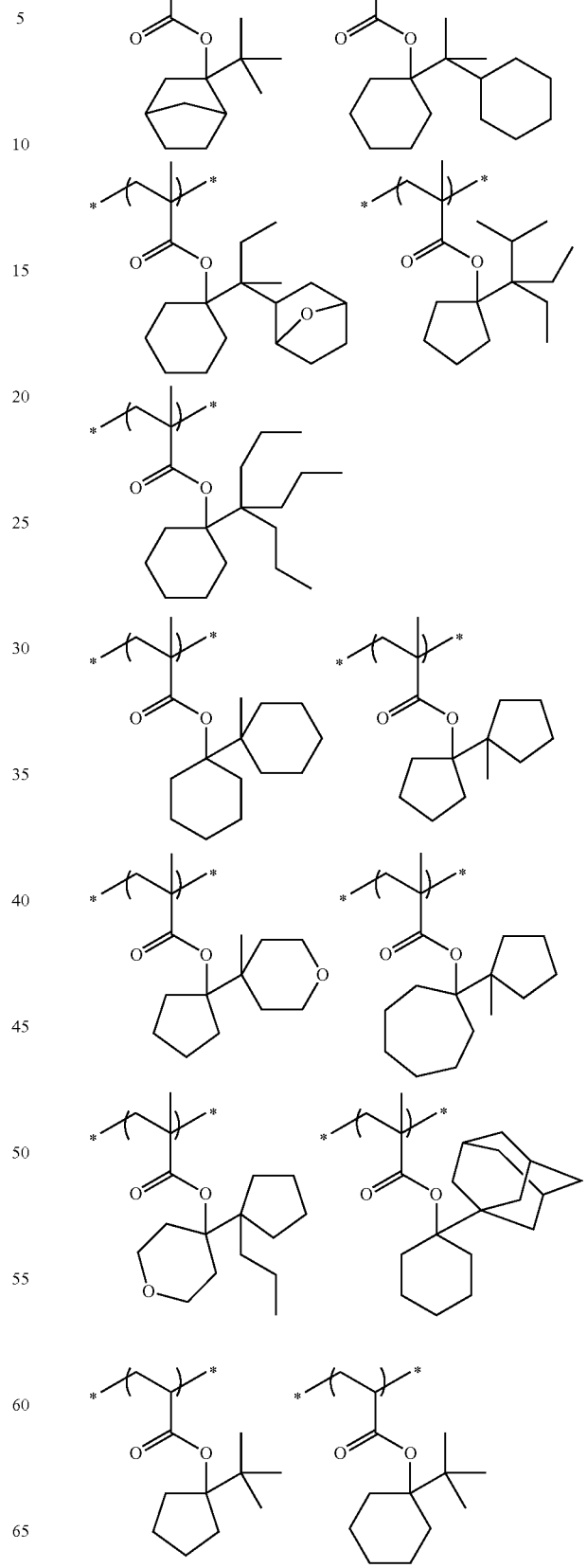

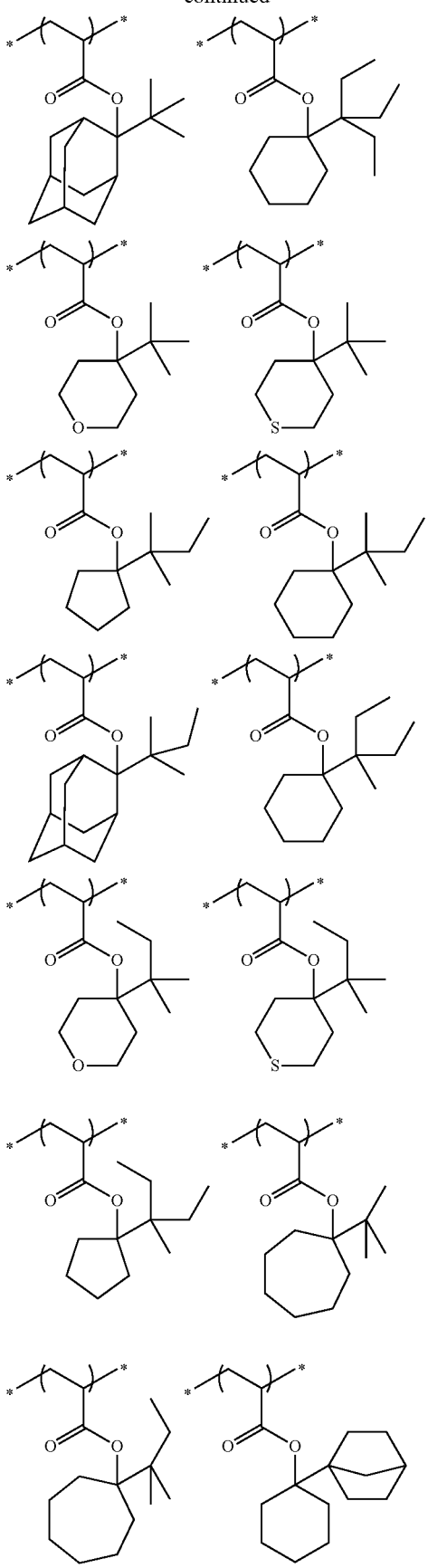

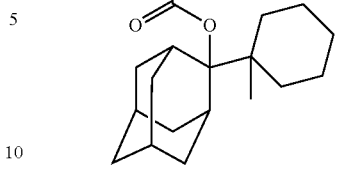

The resin (A) may have one kind or two or more kinds of repeating unit having the specific acid-decomposable group.

The content of the repeating unit having the specific acid-decomposable group in the resin (A) is not particularly limited, and it is preferably 5% by mole to 70% by mole, more preferably 10% by mole to 60% by mole, and still more preferably 10% by mole to 50% by mole, with respect to all the repeating units in the resin (A).

The resin (A) may be a resin which further has an acid-decomposable group having "a structure in which the leaving group is a group other than the group represented by General Formula (I) as a structure in which a polar group is protected with a leaving group which decomposes to leave by the action of an acid" (hereinafter also referred to as "another acid-decomposable group"). In this case, the resin (A) is preferably a resin having a repeating unit having another acid-decomposable group.

Specific examples of the polar group in another acid-decomposable group, and preferred examples thereof are the same as described in the specific acid-decomposable group.

Examples of the leaving group in another acid-decomposable group include —$C(R_{36})(R_{37})(R_{38})$, —$C(R_{36})(R_{37})(OR_{39})$, and —$C(R_{01})(R_{02})(OR_{39})$.

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ to $R_{02}$ each independently represent a hydrogen atom, an alkyl group, a cycloalkyl group, an aryl group, an aralkyl group, or an alkenyl group.

The acid-decomposable group is preferably a cumyl ester group, an enol ester group, an acetal ester group, a tertiary alkyl ester group, or the like, and more preferably a tertiary alkyl ester group.

Furthermore, a repeating unit represented by the following General Formula (AI) is preferable as the repeating unit having another acid-decomposable group, which can be contained in the resin (A).

(AI)

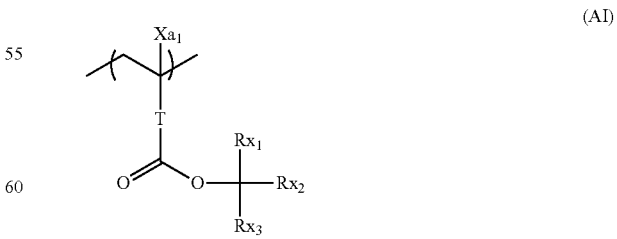

In General Formula (AI), $Xa_1$ represents a hydrogen atom, or an alkyl group which may have a substituent, T represents a single bond or a divalent linking group, Rx₁ to Rx₃ each independently represent an (linear or branched) alkyl group or a (monocyclic or polycyclic) cycloalkyl group, and two members out of Rx₁ to Rx₃ may be bonded to each other to form a (monocyclic or polycyclic) cycloalkyl group. In this case, a group not contributing to formation of a cycloalkyl group out of Rx₁ to Rx₃ does not correspond to the group represented by —C(Ra₁)(Ra₂)(Ra₃) in General Formula (I).

Examples of the alkyl group which may have a substituent, represented by Xa₁, include a methyl group and a group represented by —CH₂—R₁₁. R₁₁ represents a halogen atom (a fluorine atom or the like), a hydroxyl group, or a monovalent organic group, and examples thereof include an alkyl group having 5 or less carbon atoms, and an acyl group having 5 or less carbon atoms, preferably an alkyl group having 3 or less carbon atoms, and more preferably a methyl group. In one aspect, Xa₁ is preferably a hydrogen atom, a methyl group, a trifluoromethyl group, a hydroxymethyl group, or the like.

Examples of the divalent linking group of T include an alkylene group, a —COO—Rt- group, and an —ORt- group. In the formulae, Rt represents an alkylene group or a cycloalkylene group.

T is preferably a single bond or a —COO—Rt- group. Rt is preferably an alkylene group having 1 to 5 carbon atoms, and more preferably a —CH₂— group, a —(CH₂)₂— group, or a —(CH₂)₃— group.

As the alkyl group of Rx₁ to Rx₃, an alkyl group having 1 to 4 carbon atoms, such as a methyl group, an ethyl group, a n-propyl group, an isopropyl group, a n-butyl group, an isobutyl group, and a t-butyl group is preferable.

As the cycloalkyl group of Rx₁ to Rx₃, a monocyclic cycloalkyl group such as a cyclopentyl group and a cyclohexyl group, and a polycyclic cycloalkyl group such as a norbornyl group, a tetracyclodecanyl group, a tetracyclododecanyl group, and an adamantyl group are preferable.

As the cycloalkyl group formed by the mutual bonding of two members of Rx₁ to Rx₃, a monocyclic cycloalkyl group such as a cyclopentyl group and a cyclohexyl group, and a polycyclic cycloalkyl group such as a norbornyl group, a tetracyclodecanyl group, a tetracyclododecanyl group, and an adamantyl group are preferable, and a monocyclic cycloalkyl group having 5 or 6 carbon atoms is particularly preferable.

In the cycloalkyl group formed by the mutual bonding of two members of Rx₁ to Rx₃, for example, one of the methylene groups constituting the ring may be substituted with a hetero atom such as an oxygen atom, or with a group having a hetero atom, such as a carbonyl group.

An aspect of the repeating unit represented by General Formula (AI), for example, in which Rx₁ is a methyl group or an ethyl group, and Rx₂ and Rx₃ are bonded to form the afore-mentioned cycloalkyl group, is preferable.

Each of the groups may have a substituent, and examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms), with those having 8 or less carbon atoms being preferable.

The resin (A) may or may not contain a repeating unit having another acid-decomposable group, and in the case of containing the repeating unit, the total content of the repeating unit having another acid-decomposable group is preferably 10% by mole to 50% by mole, more preferably 10% by mole to 40% by mole, and still more preferably 10% by mole to 30% by mole, with respect to all the repeating units in the resin (A).

Specific preferred examples of the repeating unit having another acid-decomposable group are set forth below, but the present invention is not limited thereto.

In the specific examples, Rx and Xa₁ each represent a hydrogen atom, CH₃, CF₃, or CH₂OH. Rxa and Rxb each represent an alkyl group having 1 to 4 carbon atoms, provided that in repeating units 1, 3 to 8, 12 to 14, 17, and 21 below, Rxa does not correspond to a group represented by —C(Ra₁)(Ra₂)(Ra₃) in General Formula (I). Z represents a substituent, and in the case where they are present in plural numbers, they may be the same as or different from each other, p represents 0 or a positive integer. Specific examples of Z and preferred examples thereof are each the same as the specific examples and the preferred examples of the substituent which may contained in R₁ to R₃ and the like.

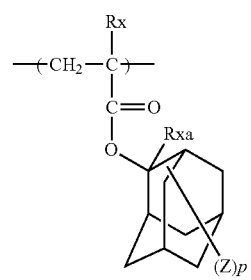

1

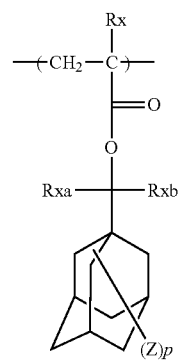

2

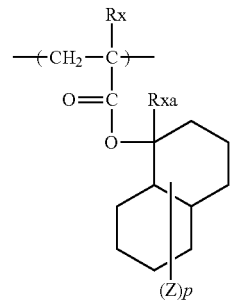

3

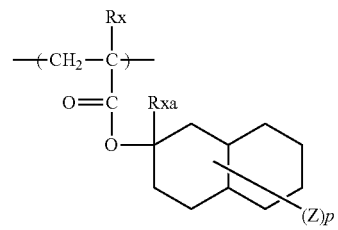

4

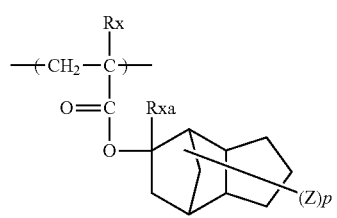
5
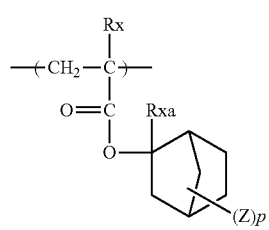
6
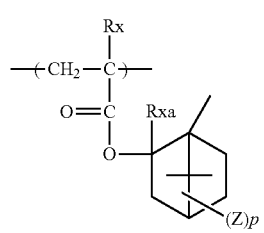
7
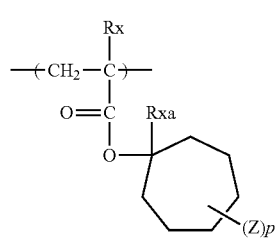
8
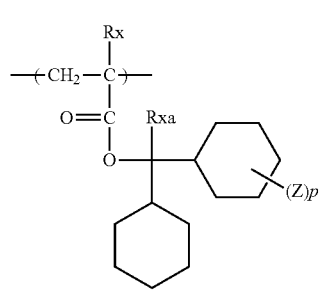
9
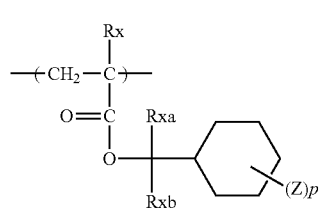
10
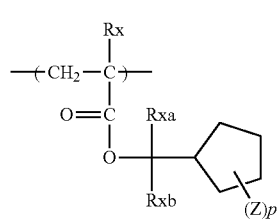
11
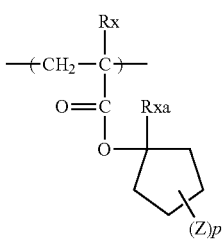
12
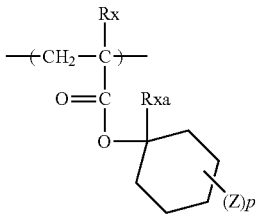
13
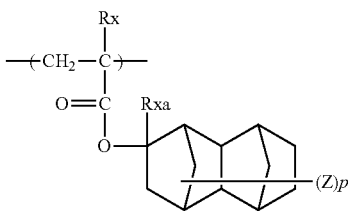
14
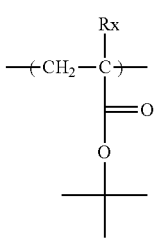
15
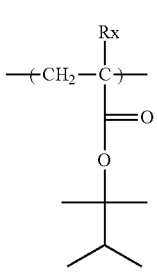
16
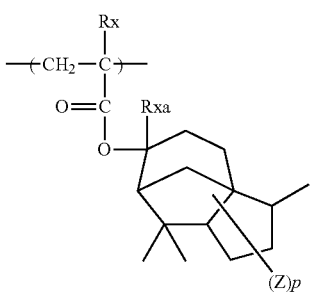
17

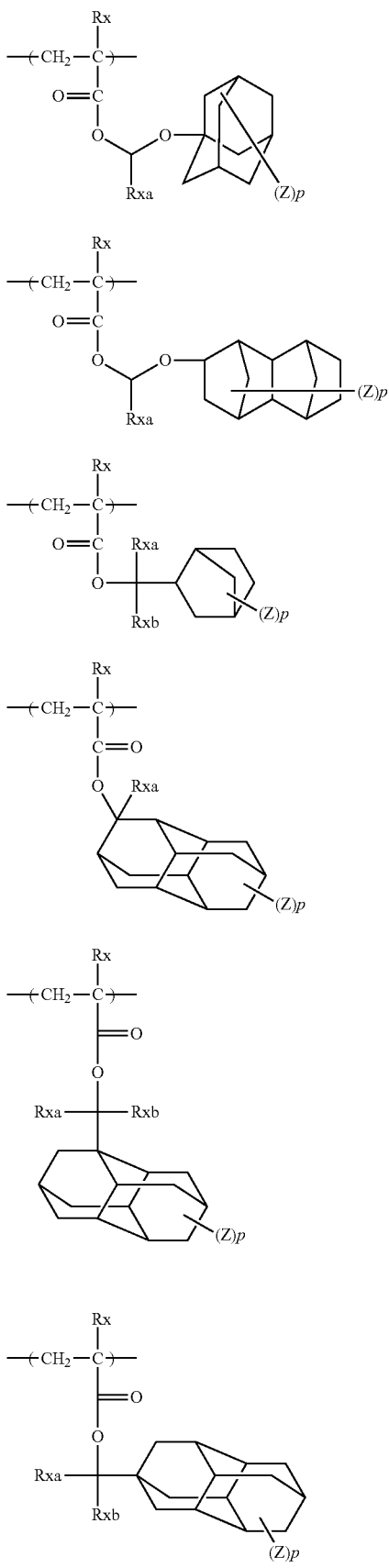

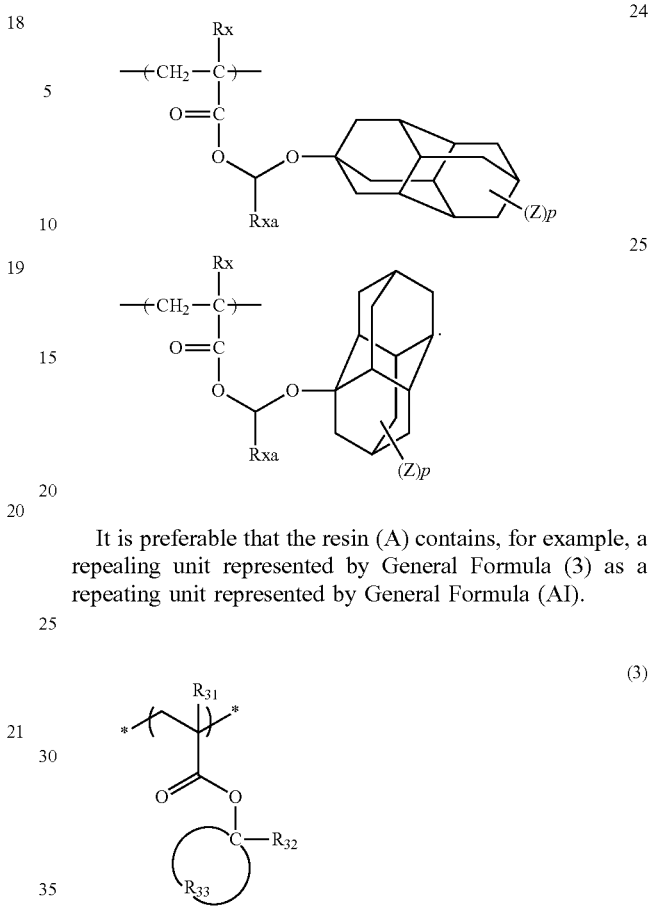

It is preferable that the resin (A) contains, for example, a repeating unit represented by General Formula (3) as a repeating unit represented by General Formula (AI).

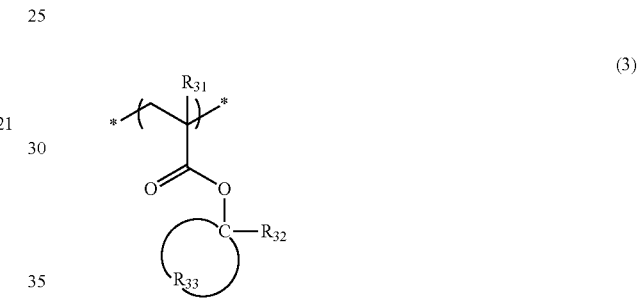

In General Formula (3), $R_{31}$ represents a hydrogen atom or an alkyl group, $R_{32}$ represents a methyl group, an ethyl group, a n-propyl group, an isopropyl group, a n-butyl group, an isobutyl group, or a sec-butyl group, $R_{33}$ represents an atomic group required for forming a monocyclic alicyclic hydrocarbon structure together with carbon atoms to which $R_{32}$ is bonded. In the alicyclic hydrocarbon structure, a part of carbon atoms constituting a ring may be substituted with a hetero atom, or a group having a hetero atom.

The alkyl group of $R_{31}$ may have a substituent and examples of the substituent include a fluorine atom and a hydroxyl group. $R_{31}$ preferably represents a hydrogen atom, a methyl group, a trifluoromethyl group, or a hydroxymethyl group.

$R_{32}$ is preferably a methyl group, an ethyl group, a n-propyl group, or an isopropyl group, and more preferably a methyl group or an ethyl group.

The monocyclic alicyclic hydrocarbon structure formed by $R_{33}$ together with carbon atoms is preferably a 3- to 8-membered ring, and more preferably a 5- or 6-membered ring.

In the monocyclic alicyclic hydrocarbon structure formed by $R_{33}$ together with carbon atoms, examples of the hetero atom which can constitute a ring include an oxygen atom and a sulfur atom, and examples of the group having a hetero atom include a carbonyl group. However, it is preferable that the group having a hetero atom is not an ester group (ester bond).

The monocyclic alicyclic hydrocarbon structure formed by $R_{33}$ together with carbon atoms is preferably formed with only carbon atoms and hydrogen atoms.

It is preferable that the repeating unit represented by General Formula (3) is a repeating unit represented by the following General Formula (3').

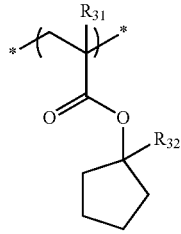

(3')

In General Formula (3'), $R_{31}$ and $R_{32}$ have the same definitions as those in General Formula (3), respectively.

Specific examples of the repeating unit having the structure represented by General Formula (3) are set forth below, but are not limited thereto.

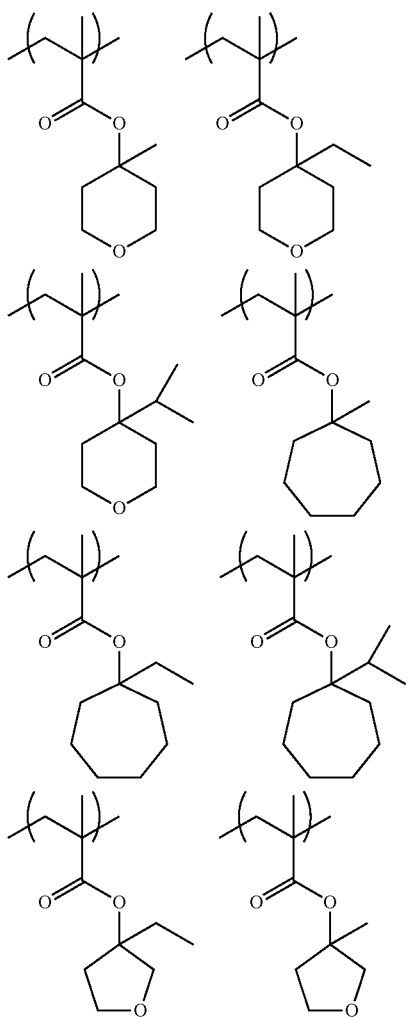

-continued

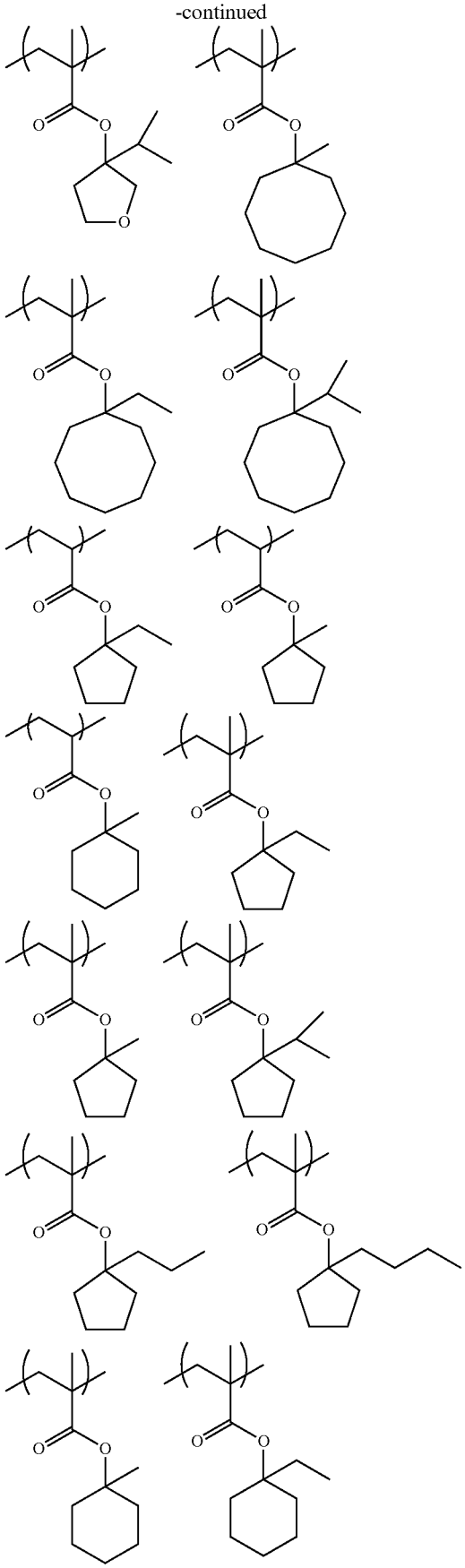

-continued

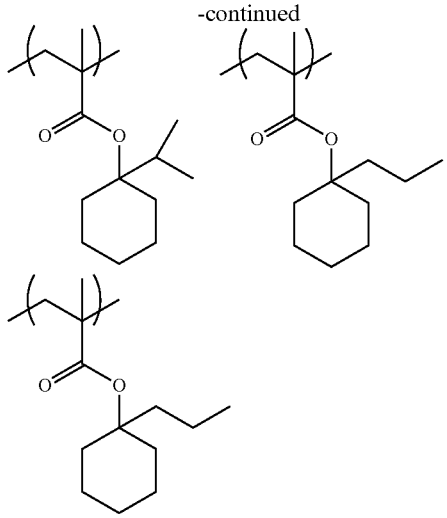

In one aspect, it is preferable that the resin (A) contains a repeating unit having a cyclic carbonic acid ester structure. This cyclic carbonic acid ester structure is a structure having a ring including a bond represented by —O—C(=O)—O— as an atomic group constituting the ring. The ring including a bond represented by —O—C(=O)—O— as an atomic group constituting the ring is preferably a 5- to 7-membered ring, and most preferably a 5-membered ring. Such a ring may be fused with another ring to form a fused ring.

The resin (A) may have one kind or two or more kinds of repeating unit having a cyclic carbonic acid ester structure.

The content of the repeating unit having a cyclic carbonic acid ester structure is preferably 5% by mole to 60% by mole, preferably 10% by mole to 50% by mole, and particularly preferably 20% by mole to 40% by mole, with respect to all the repeating units of the resin (A).

It is preferable that the resin (A) contains a repeating unit having a lactone structure or a sultone (cyclic sulfonic acid ester) structure.

As the lactone group or the sultone group, any group may be used as long as it has a lactone structure or a sultone structure, and the structure is preferably a 5- to 7-membered ring lactone structure or sultone structure, and more preferably a 5- to 7-membered ring lactone structure or sultone structure to which another ring structure is fused in the form of forming a bicyclo structure or a spiro structure. The resin (A) still more preferably has a repeating unit having a lactone structure or a sultone structure represented by any one of the following General Formulae (LC1-1) to (LC1-17), (SL1-1), and (SL1-2). Further, the lactone structure or the sultone structure may be bonded directly to the main chain. The lactone structures or the sultone structures are preferably (LC1-1), (LC1-4), (LC1-5), and (LC1-8), and more preferably (LC1-4). By using such a specific lactone structure or sultone structure, LWR and development defects are relieved.

LC1-1

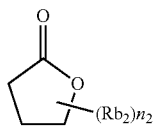

LC1-2

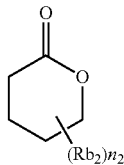

LC1-3

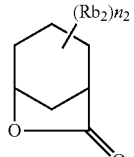

LC1-4

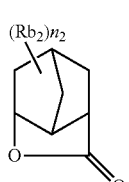

LC1-5

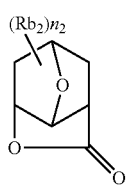

LC1-6

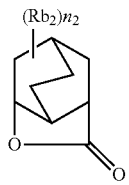

LC1-7

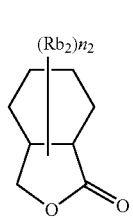

LC1-8

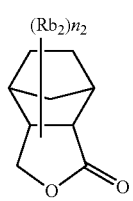

LC1-9

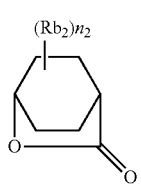

LC1-10
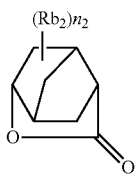

LC1-11
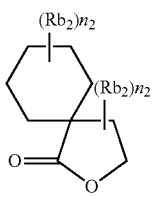

LC1-12
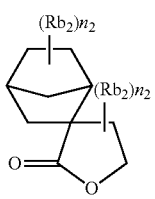

LC1-13
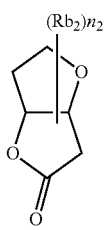

LC1-14
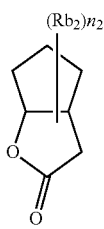

LC1-15
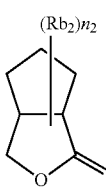

LC1-16
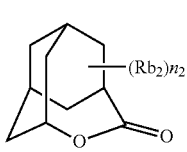

LC1-17
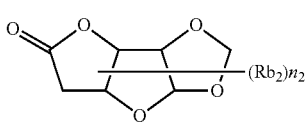

SL1-1
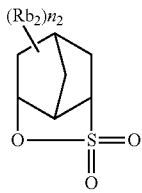

SL1-2
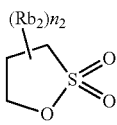

The lactone structure moiety or the sultone structure moiety may or may not have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-decomposable group. Among these, an alkyl group having 1 to 4 carbon atoms, a cyano group, and an acid-decomposable group are more preferable. $n_2$ represents an integer of 0 to 4. When $n_2$ is 2 or more, the substituents ($Rb_2$) which are present in plural numbers may be the same as or different from each other, and further, the substituents ($Rb_2$) which are present in plural numbers may be bonded to each other to form a ring.

It is preferable that the resin (A) contains a repeating unit having a lactone structure or a sultone structure, represented by the following General Formula (III).

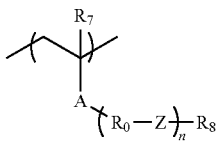 (III)

In Formula (III),

A represents an ester bond (a group represented by —COO—) or an amide bond (a group represented by —CONH—), in the case where $R_0$'s are present in plural numbers, they each independently represent an alkylene group, a cycloalkylene group, or a combination thereof, and in the case where Z's are present in plural numbers, they each independently represent a single bond, an ether bond, an ester bond, an amide bond, an urethane bond, a group represented by:

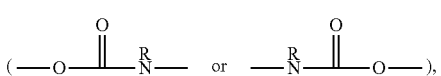

or a urea bond, a group represented by:

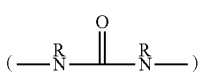

Here, R's each independently represent a hydrogen atom, an alkyl group, a cycloalkyl group, or an aryl group.

$R_8$ represents a monovalent organic group having a lactone structure or a sultone structure.

n is the repetition number of the structure represented by —$R_0$—Z—, and represents an integer of 0 to 2.

$R_7$ represents a hydrogen atom, a halogen atom, or an alkyl group.

The alkylene group and the cycloalkylene group of $R_0$ may have a substituent.

Z is preferably an ether bond or an ester bond, and more preferably an ester bond.

The alkyl group of $R_7$ is preferably an alkyl group having 1 to 4 carbon atoms, more preferably a methyl group or an ethyl group, and particularly preferably a methyl group. The alkylene group and the cycloalkylene group of $R_0$, and the alkyl group in $R_7$ may be each substituted, and examples of the substituent include a halogen atom such as a fluorine atom, a chlorine atom, and a bromine atom, an alkoxy group such as a mercapto group, a hydroxy group, a methoxy group, an ethoxy group, an isopropoxy group, a t-butoxy group, and a benzyloxy group, and an acetoxy group such as an acetyloxy group and a propionyloxy group. $R_7$ is preferably a hydrogen atom, a methyl group, a trifluoromethyl group, or a hydroxymethyl group.

The preferred chained alkylene group in $R_0$ is chained alkylene, preferably having 1 to 10 carbon atoms, and more preferably having 1 to 5 carbon atoms, and examples thereof include a methylene group, an ethylene group, and a propylene group. Preferred examples of the cycloalkylene group include a cycloalkylene group having 3 to 20 carbon atoms, and examples thereof include a cyclohexylene group, a cyclopentylene group, a norbornylene group, and an adamantylene group. In order to express the effects of the present invention, a chained alkylene group is more preferable, and a methylene group is particularly preferable.

The monovalent organic group having a lactone structure or a sultone structure represented by $R_8$ is not limited as long as it has a lactone structure or a sultone structure. Specific examples thereof include ones having lactone structures or sultone structures represented by General Formulae (LC1-1) to (LC1-17), (SL1-1), and (SL1-2), and the structure represented by (LC1-4) is particularly preferable. Further, $n_2$ in (LC1-1) to (LC1-17), (SL1-1), and (SL1-2) is preferably 2 or less.

Furthermore, $R_8$ is preferably a monovalent organic group having an unsubstituted lactone structure or sultone structure, or a monovalent organic group having a lactone structure or a sultone structure having a methyl group, a cyano group, or an alkoxycarbonyl group as a substituent, and more preferably a monovalent organic group having a lactone structure having a cyano group as a substituent (cyanolactone) or a sultone structure having a cyano group as a substituent (cyanosultone).

In General Formula (III), n is preferably 1 or 2.

Specific examples of the repeating unit having a group having the lactone structure or sultone structure represented by General Formula (III) are set forth below, but the present invention is not limited thereto.

In the following specific examples, R represents a hydrogen atom, an alkyl group which may have a substituent, or a halogen atom, and preferably represents a hydrogen atom, a methyl group, a hydroxymethyl group, or an acetoxymethyl group.

In the following formulae, Me represents a methyl group.

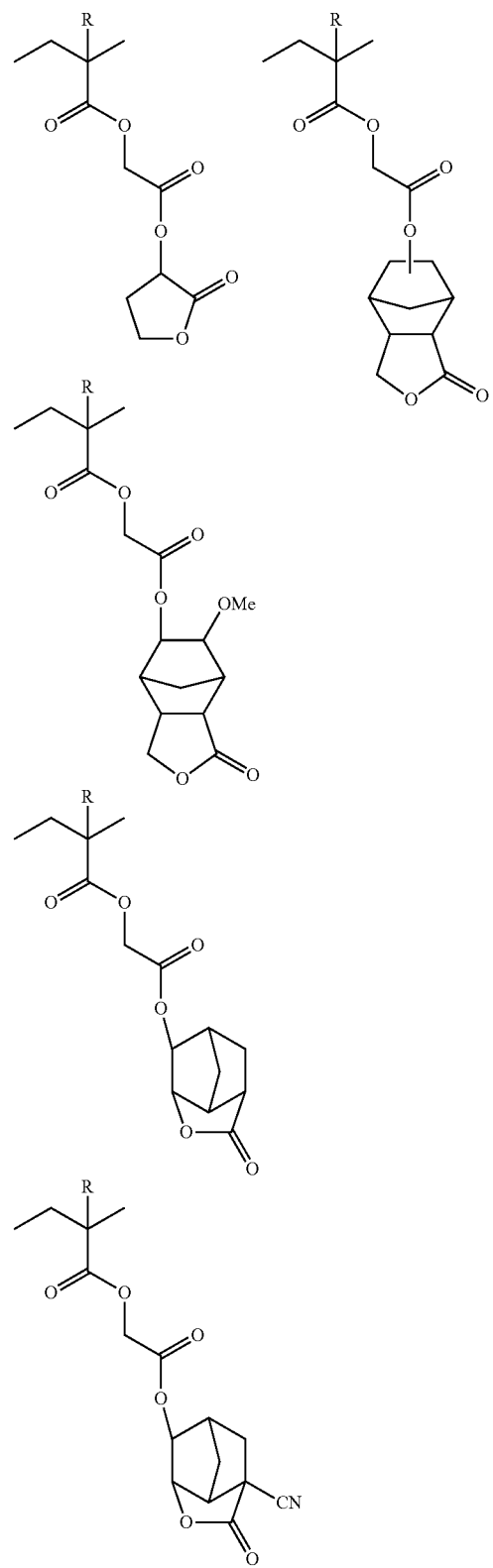

As the repeating unit having a lactone structure or a sultone structure, a repeating unit represented by the following General Formula (III-1) or (III-1') is more preferable.

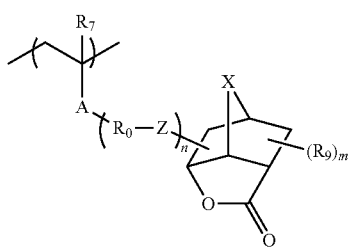

(III-1)

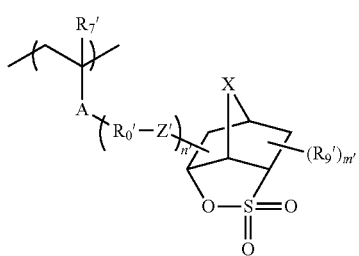

(III-1')

In General Formulae (III-1) and (III-1'), $R_7$, A, $R_0$, Z, and n have the same definitions as in General Formula (III).

$R_7'$, A', $R_0'$, Z', and n' each have the same definitions $R_7$, A, $R_0$, Z, and n in General Formula (III).

In the case where $R_9$ are in plural numbers, they each independently represent an alkyl group, a cycloalkyl group, an alkoxycarbonyl group, a cyano group, a hydroxyl group, or an alkoxy group, and in the case where they are in plural numbers, two $R_9$'s may be bonded to each other to form a ring.

In the case where $R_9$'s are in plural numbers, they each independently represent an alkyl group, a cycloalkyl group, an alkoxycarbonyl group, a cyano group, a hydroxyl group, or an alkoxy group, and in the case where they are in plural numbers, two $R_9$'s may be bonded to each other to form a ring.

X and X' each independently represent an alkylene group, an oxygen atom, or a sulfur atom.

m and m' are each the number of substituents, and each independently represent an integer of 0 to 5. m and m' are each independently preferably 0 or 1.

As the alkyl group of $R_9$ and $R_9'$, an alkyl group having 1 to 4 carbon atoms is preferable, a methyl group and an ethyl group are more preferable, and a methyl group is most preferable. Examples of the cycloalkyl group include a cyclopropyl group, a cyclobutyl group, a cyclopentyl group, and a cyclohexyl group. Examples of the alkoxycarbonyl group include a methoxycarbonyl group, an ethoxycarbonyl group, a n-butoxycarbonyl group, and a t-butoxycarbonyl group. Examples of the alkoxy group include a methoxy group, an ethoxy group, a propoxy group, an isopropoxy group, and a butoxy group. These groups may have a substituent, and examples of the substituent include an alkoxy group such as a hydroxy group, a methoxy group, and an ethoxy group, a cyano group, and a halogen atom such as a fluorine atom. $R_9$ and $R_9'$ are each more preferably a methyl group, a cyano group, or an alkoxycarbonyl group, and still more preferably a cyano group.

Examples of the alkylene group of X and X' include a methylene group and an ethylene group. X and X' are preferably an oxygen atom or a methylene group, and more preferably a methylene group.

In the case where m and m' are 1 or more, at least one of $R_9$ and $R_9'$ are preferably substituted at the α- or β-position of the carbonyl group of the lactone, and particularly preferably at the α-position.

Specific examples of the group having a lactone structure or the repeating unit having a sultone structure, represented by General Formula (III-1) or (III-1'), are set forth below, but the present invention is not limited thereto. In the following specific examples, R represents a hydrogen atom, an alkyl group which may have a substituent, or a halogen atom, and preferably represents a hydrogen atom, a methyl group, a hydroxymethyl group, or an acetoxymethyl group.

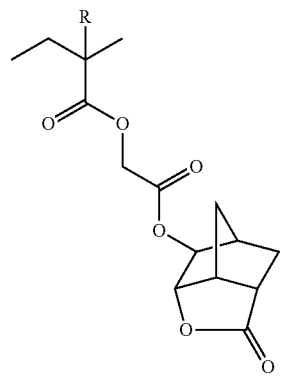

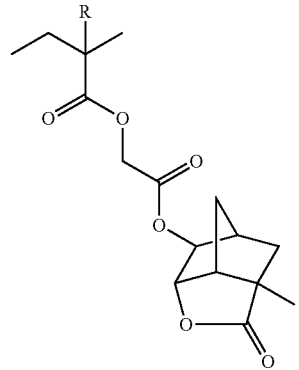

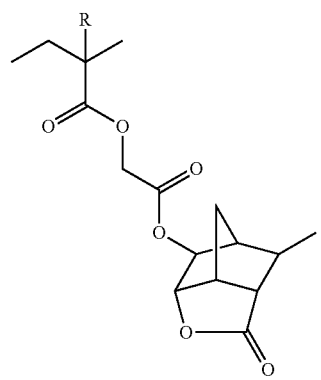

31
-continued
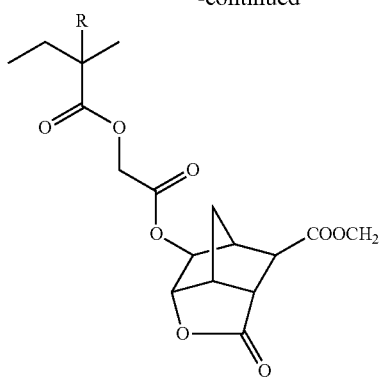
32
-continued
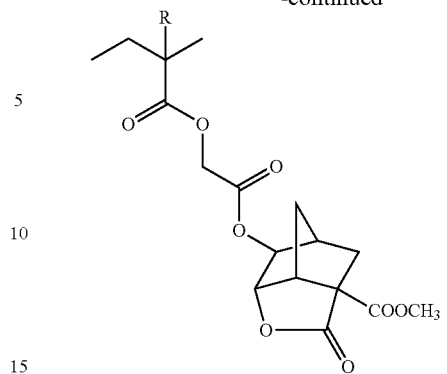
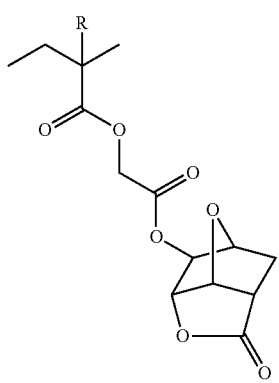
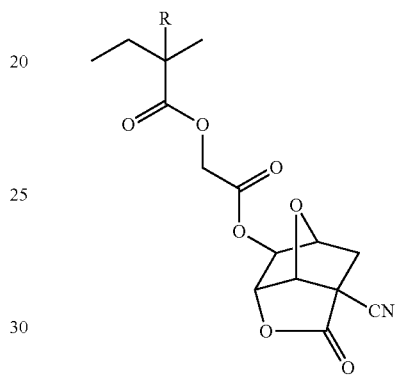
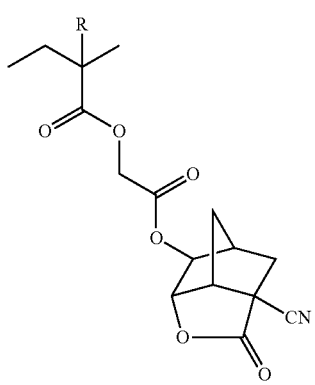
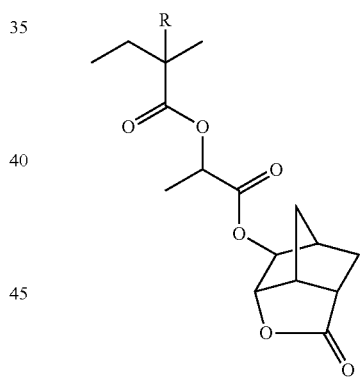
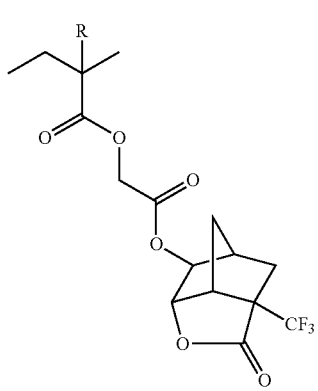
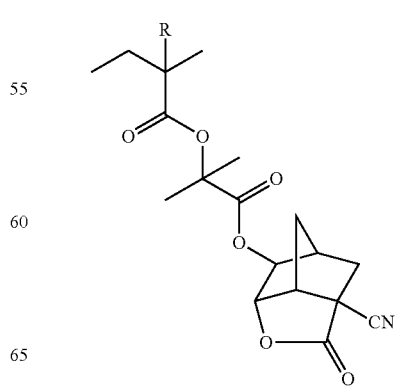

33
-continued
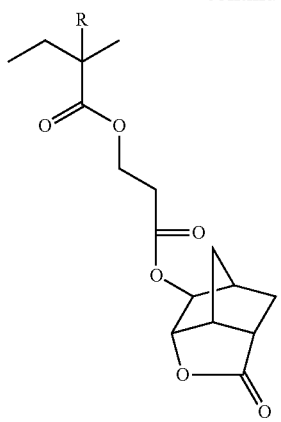
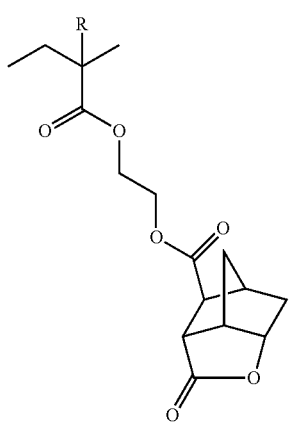
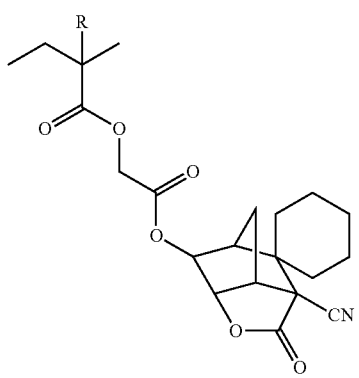
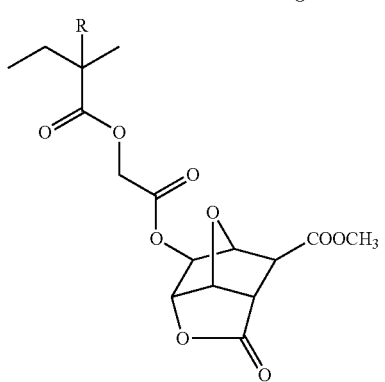
34
-continued
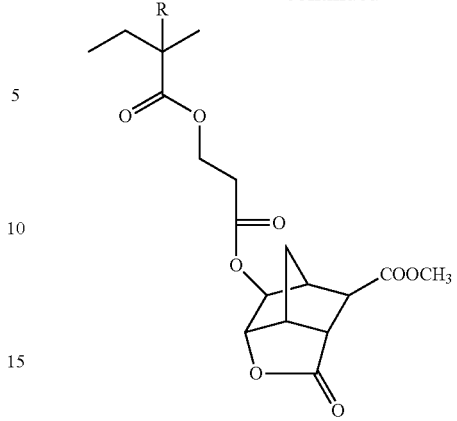
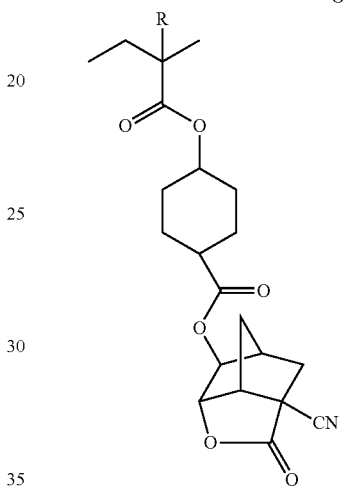
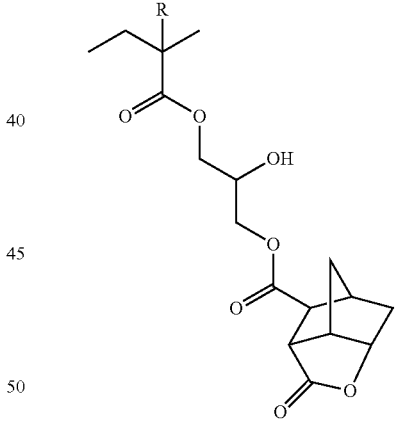
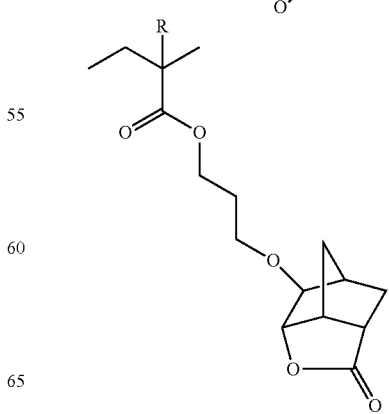

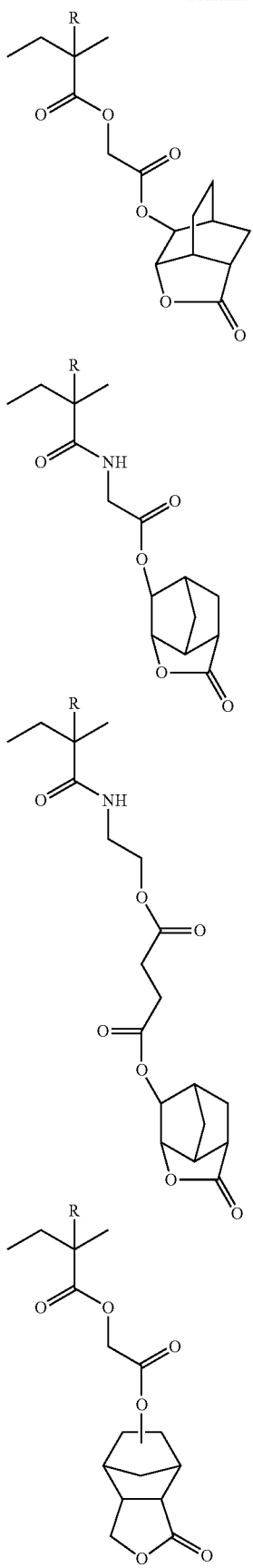
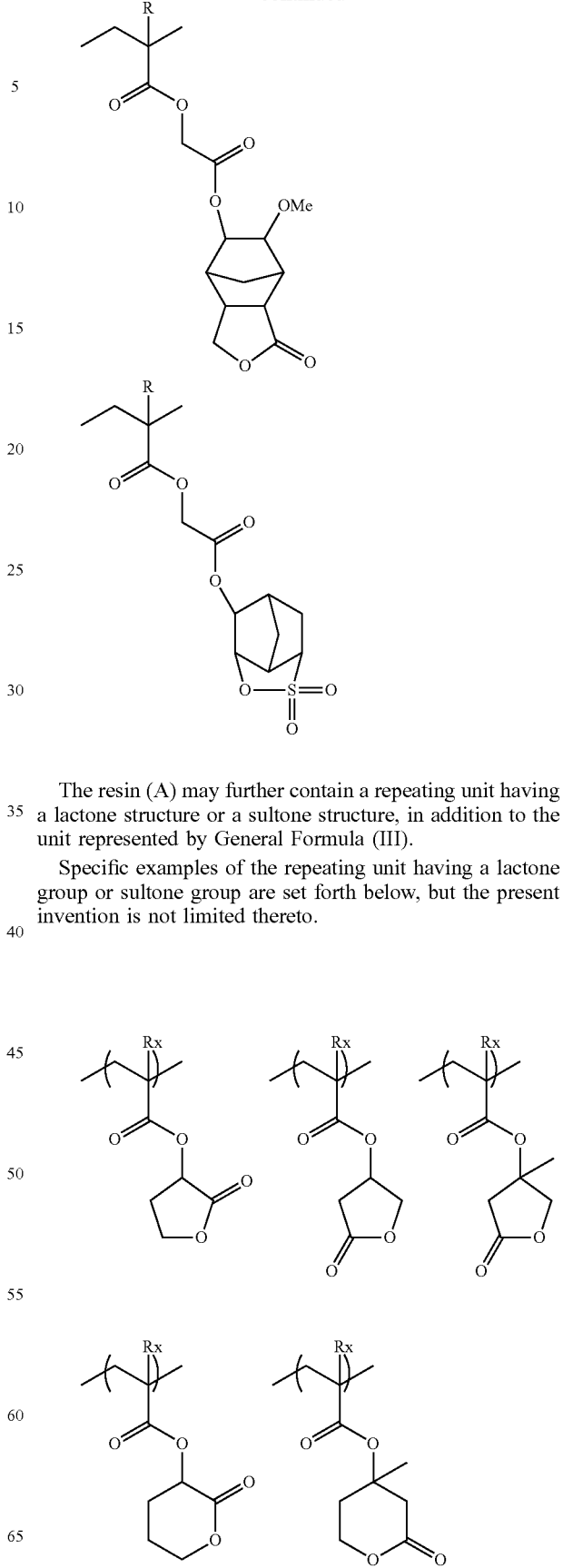
The resin (A) may further contain a repeating unit having a lactone structure or a sultone structure, in addition to the unit represented by General Formula (III).
Specific examples of the repeating unit having a lactone group or sultone group are set forth below, but the present invention is not limited thereto.

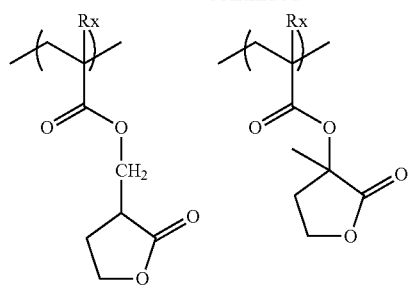
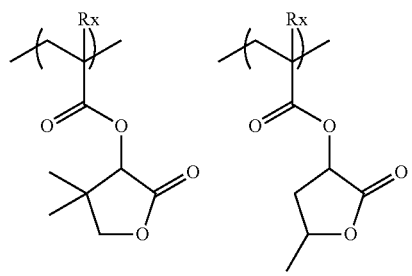
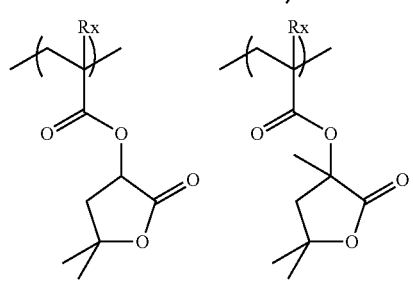
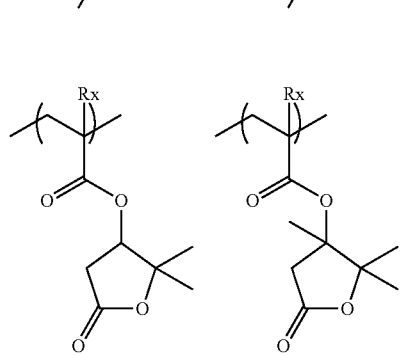
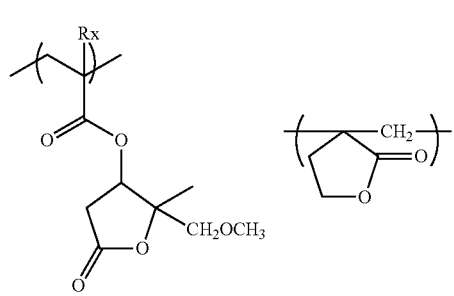
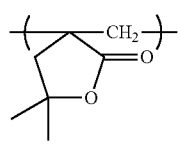
(in the formulae, Rx represents H, CH₃, CH₂OH, or CF₃)
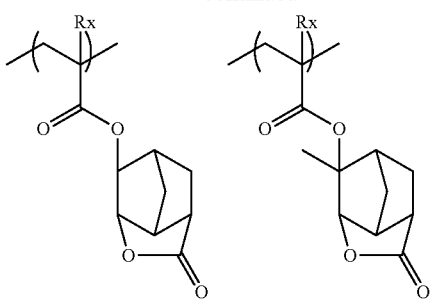
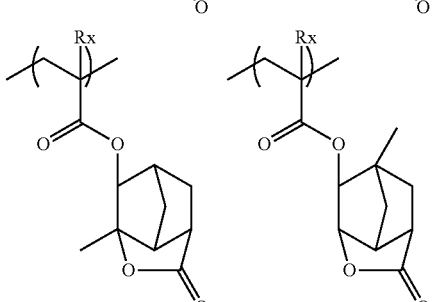
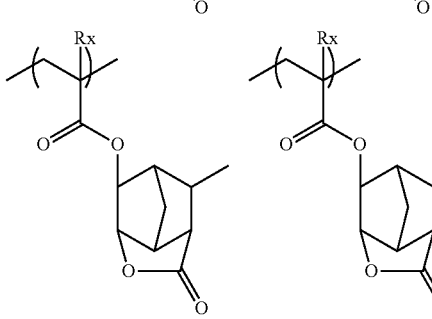
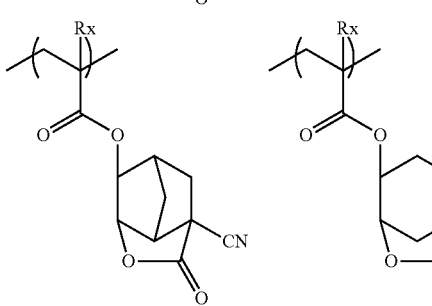
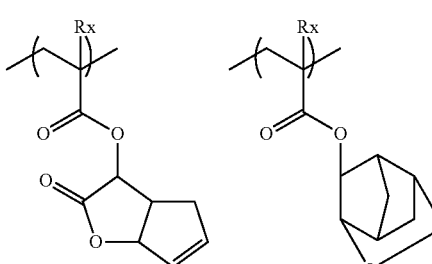
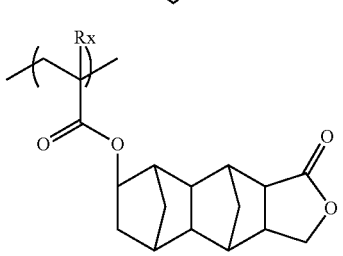

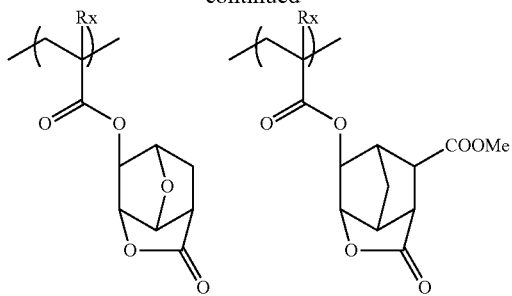
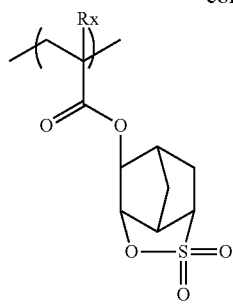
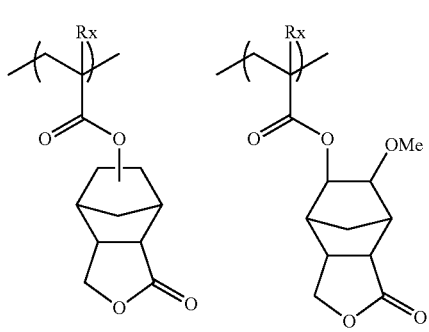
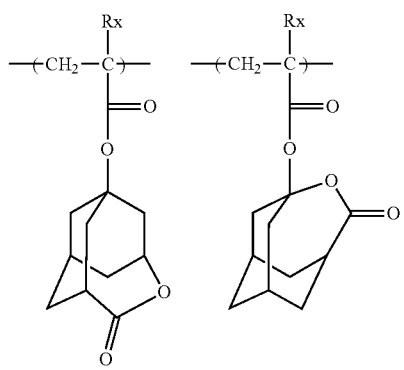
(in the formulae, Rx represents H, CH₃, CH₂OH, or CF₃)
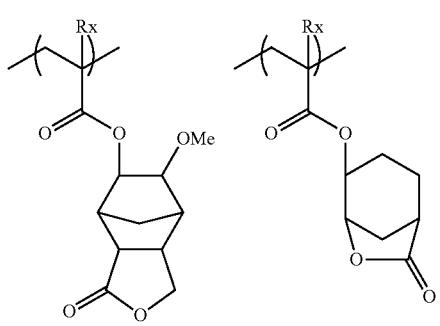
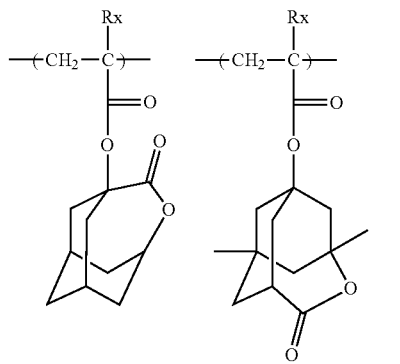
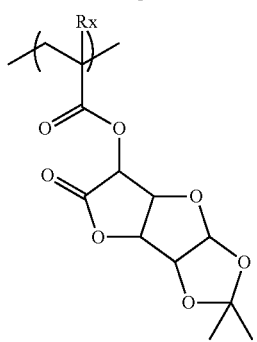
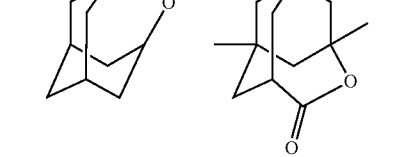
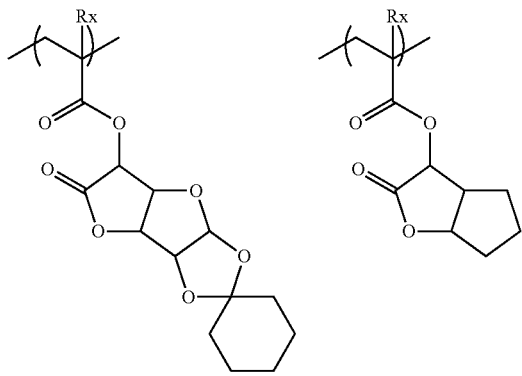
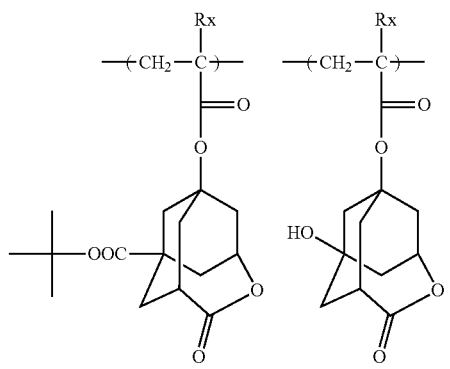

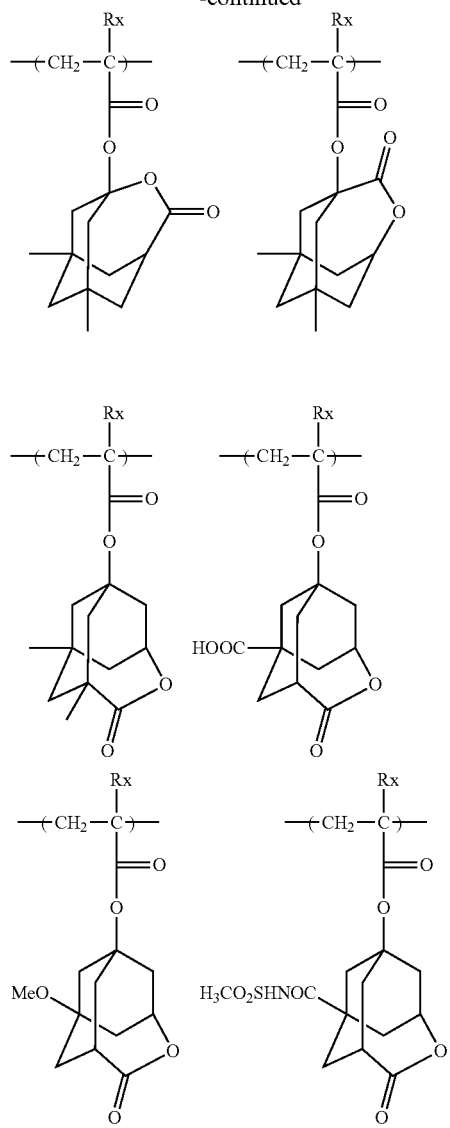

(in the formulae, Rx represents H, CH₃, CH₂OH, or CF₃)

Particularly preferred examples of the repeating units in the specific examples include the following repeating units. By selecting optimal lactone groups or sultone groups, a pattern profile and a density dependence are improved.

(in the formulae, Rx represents H, CH₃, CH₂OH, or CF₃)

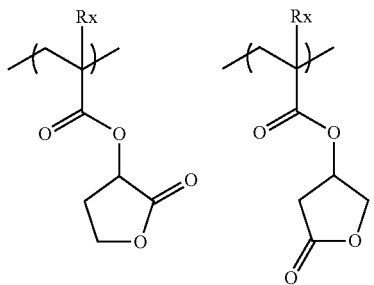

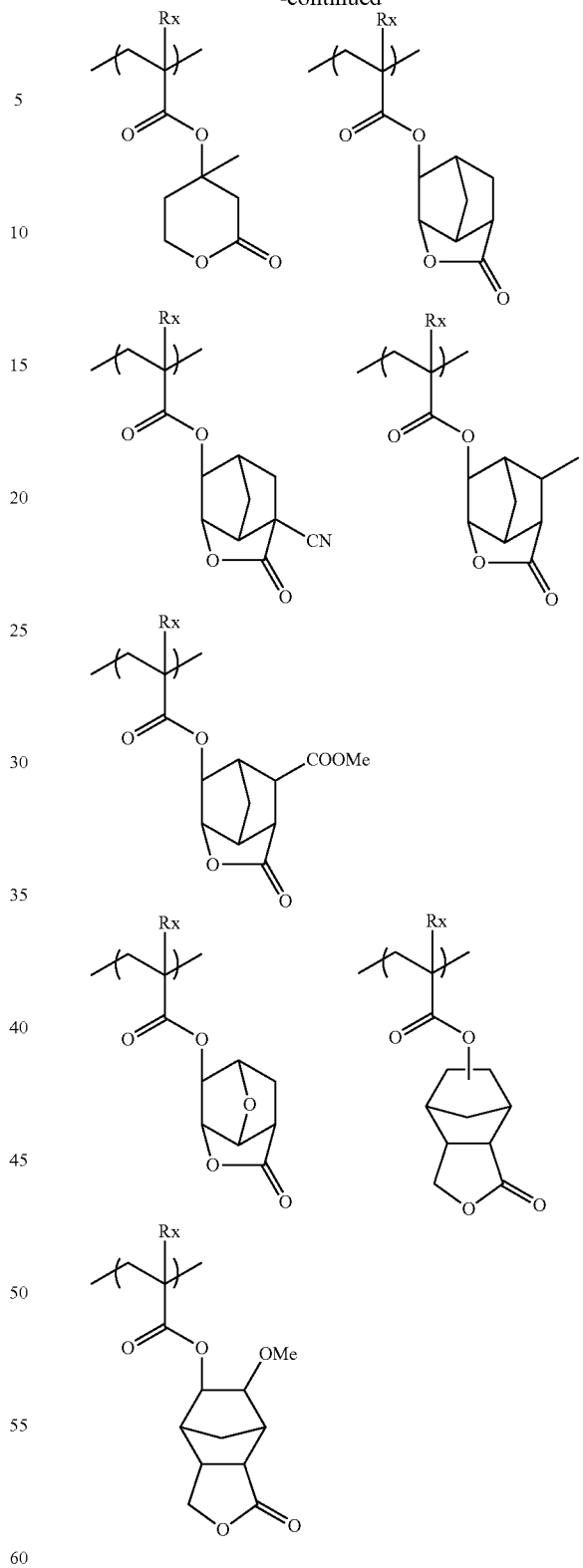

The repeating unit having a lactone group or a sultone group usually has an optical isomer, and any optical isomer may be used. Further, one kind of optical isomer may be used one kind of optical isomer, the optical purity (ee) thereof is preferably 90% or more, and more preferably 95% or more.

The resin (A) may have one kind or two or more kinds of repeating unit having a lactone group or a sultone group.

The content of the repeating unit having a lactone structure or a sultone structure is preferably 15% by mole to 60% by mole, more preferably 20% by mole to 50% by mole, and still more preferably 30% by mole to 50% by mole, with respect to all the repeating units in the resin, in the case where two or more kinds of repeating units are contained.

For the resin (A), it is possible to use two or more kinds of the repeating units having a lactone structure or a sultone structure represented by General Formula (III) in combination.

The resin (A) may have a repeating unit having a hydroxyl group or a cyano group. With the repeating unit, the adhesion to a substrate and the developer affinity are enhanced. The repeating unit having a hydroxyl group or a cyano group is preferably a repeating unit having an alicyclic hydrocarbon structure substituted with a hydroxyl group or a cyano group, and preferably has no acid-decomposable group. An alicyclic hydrocarbon structure, in which the alicyclic hydrocarbon structure is substituted with a hydroxyl group or a cyano group, is preferably an adamantyl group, a diamantyl group, or a norbornane group. The alicyclic hydrocarbon structures substituted with a hydroxyl group or a cyano group are preferably partial structures represented by the following General Formulae (VIIa) to (VIId).

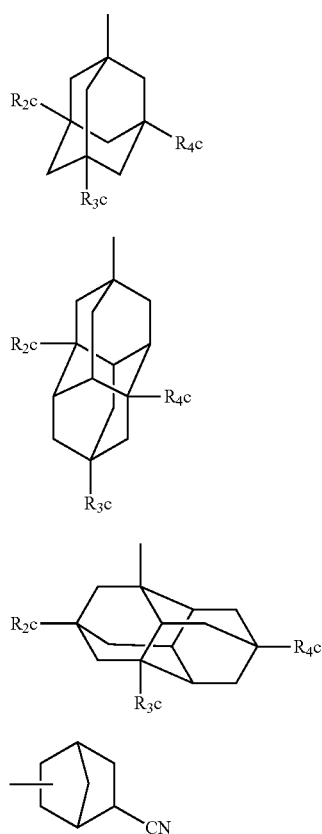

In General Formulae (VIIa) to (VIIc), $R_2c$ to $R_4c$ each independently represent a hydrogen atom, a hydroxyl group, or a cyano group, provided that at least one of $R_2c$, . . . , or $R_4c$ represents a hydroxyl group or a cyano group. It is preferable that one or two members out of $R_2c$ to $R_4c$ are a hydroxyl group and the remainders are a hydrogen atom. In General Formula (VIIa), it is more preferable that two members out of $R_2c$ to $R_4c$ are a hydroxyl group and the remainder is a hydrogen atom.

Examples of the repeating unit having a partial structure represented by General Formulae (VIIa) to (VIId) include repeating units represented by the following General Formulae (AIIa) to (AIId).

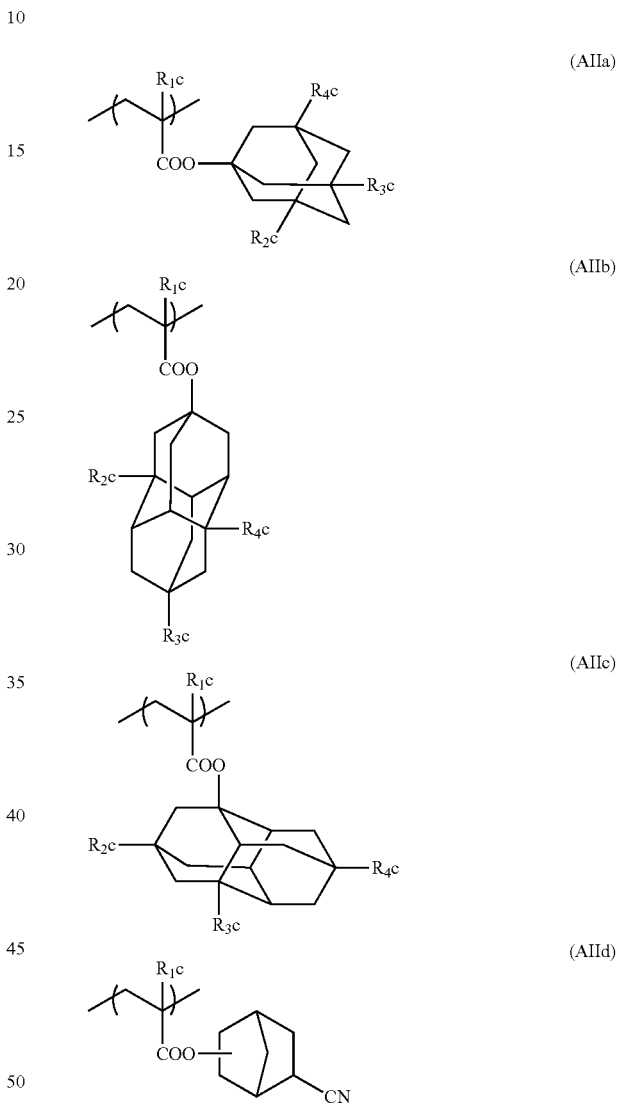

In General Formulae (AIIa) to (AIId), $R_1c$ represents a hydrogen atom, a methyl group, a trifluoromethyl group, or a hydroxymethyl group, and $R_2c$ to $R_4c$ have the same meanings as $R_2c$ to $R_4c$ in General Formulae (VIIa) to (VIIc).

The content of the repeating unit having a hydroxyl group or a cyano group is preferably 5% by mole to 40% by mole, more preferably 5% by mole to 30% by mole, and still more preferably 10% by mole to 25% by mole, with respect to all the repeating units in the resin (A).

Specific examples of the repeating unit having a hydroxyl group or a cyano group are set forth below, but the present invention is not limited thereto.

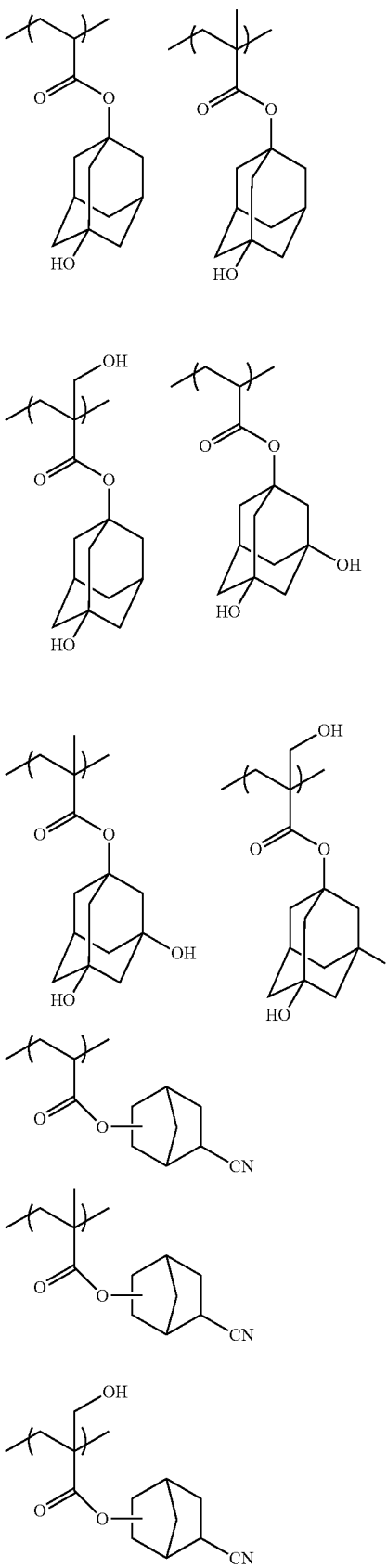
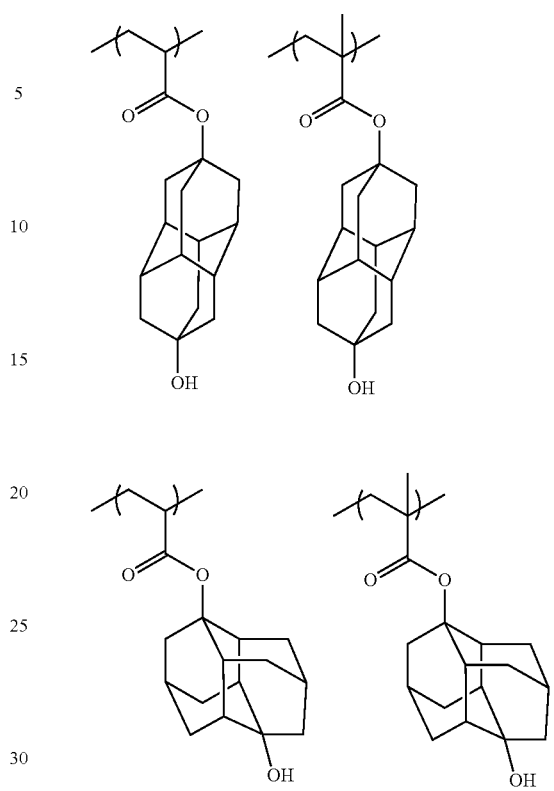

The resin (A) used in the composition of the present invention may have a repeating unit having an acid group. Examples of the acid group include a carboxyl group, a sulfonamide group, a sulfonylimide group, a bisulfonylimide group, and an aliphatic alcohol group with the α-position being substituted with an electron-withdrawing group (for example, a hexafluoroisopropanol group). The resin (A) more preferably has a repeating unit having a carboxyl group. By virtue of containing a repeating unit having an acid group, the resolution increases in the usage of forming contact holes. As the repeating unit having an acid group, all of a repeating unit in which an acid group is directly bonded to the main chain of the resin, such as a repeating unit by an acrylic acid or a methacrylic acid, a repeating unit in which an acid group is bonded to the main chain of the resin through a linking group, and a repeating unit in which an acid group is introduced into the polymer chain terminal by using a polymerization initiator, or a chain transfer agent having an acid group at the polymerization, are preferable. The linking group may have a monocyclic or polycyclic hydrocarbon structure. A repeating unit by an acrylic acid or a methacrylic acid is particularly preferable.

The content of the repeating unit having an acid group is preferably 0% by mole to 20% by mole, more preferably 3% by mole to 15% by mole, and still more preferably 5% by mole to 10% by mole, with respect to all the repeating units in the resin (A).

Specific examples of the repeating unit having an acid group are set forth below, but the present invention is not limited thereto.

In the specific examples, Rx represents H, $CH_3$, $CH_2OH$, or $CF_3$.

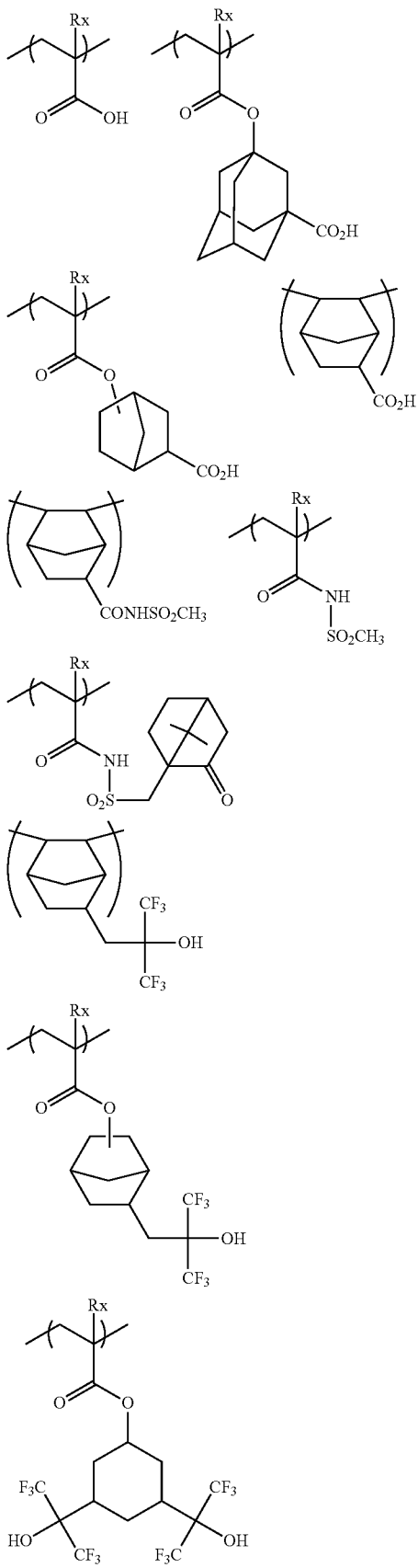

The resin (A) may further have a repeating unit which has an alicyclic hydrocarbon structure not having a polar group (for example, an acid group, a hydroxyl group, and a cyano group) and does not exhibit acid decomposability. Examples of such a repeating unit include a repeating unit represented by General Formula (IV).

In General Formula (IV), $R_5$ represents a hydrocarbon group having at least one cyclic structure and not having a polar group.

Ra represents a hydrogen atom, an alkyl group, or a —$CH_2$—O—$Ra_2$ group. In the formula, $Ra_2$ represents a hydrogen atom, an alkyl group, or an acyl group. $Ra_2$ is preferably a hydrogen atom, a methyl group, a hydroxymethyl group, or a trifluoromethyl group, and particularly preferably a hydrogen atom or a methyl group.

The cyclic structure contained in $R_5$ includes a monocyclic hydrocarbon group and a polycyclic hydrocarbon group. Examples of the monocyclic hydrocarbon group include a cycloalkyl group having 3 to 12 carbon atoms, such as a cyclopentyl group, a cyclohexyl group, a cycloheptyl group, and a cyclooctyl group, and a cycloalkenyl group having 3 to 12 carbon atoms, such as a cyclohexenyl group. A preferred monocyclic hydrocarbon group is a monocyclic hydrocarbon group having 3 to 7 carbon atoms, and more preferred examples thereof include a cyclopentyl group and a cyclohexyl group.

Examples of the polycyclic hydrocarbon group include a ring-assembly hydrocarbon group and a crosslinked cyclic hydrocarbon group. Examples of the ring-assembly hydrocarbon group include a bicyclohexyl group and a perhydronaphthalenyl group, and examples of the crosslinked cyclic hydrocarbon ring include bicyclic hydrocarbon rings such as a pinane ring, a bornane ring, a norpinane ring, a norbornane ring, and a bicyclooctane ring (a bicyclo[2.2.2] octane ring, a bicyclo[3.2.1]octane ring, or the like); tricyclic hydrocarbon rings such as a homobledane ring, an adamantine ring, a tricyclo[5.2.1.0$^{2,6}$]decane ring, and a tricyclo[4.3.1.1$^{2,5}$] undecane ring, and tetracyclic hydrocarbon rings such as a tetracyclo[4.4.0.1$^{2,5}$.1$^{7,10}$]dodecane ring and a perhydro-1,4-methano-5,8-methanonaphthalene ring. Other examples of the crosslinked cyclic hydrocarbon ring include fused cyclic hydrocarbon rings, and more specifically fused rings formed by fusing a plurality of 5- to 8-membered cycloalkane rings, such as a perhydronaphthalene (decalin) ring, a perhydroanthracene ring, a perhydrophenanthrene ring, a perhydroacenaphthene ring, a perhydrofluorenone ring, a perhydroindene ring, and a perhydrophenalene ring.

Preferred examples of the crosslinked cyclic hydrocarbon ring include a norbornyl group, an adamantyl group, a bicyclooctanyl group, and a tricyclo[5,2,1,0$^{2,6}$]decanyl group. More preferred examples of the crosslinked cyclic hydrocarbon rings include a norbornyl group and an adamantyl group.

The crosslinked cyclic hydrocarbon rings may have a substituent, and preferred examples of the substituent include a halogen atom, an alkyl group, a hydroxyl group with a hydrogen atom being substituted, and an amino group with a hydrogen atom being substituted. Preferred examples of the halogen atom include a bromine atom, a chlorine atom, and a fluorine atom, and preferred examples of the alkyl group include a methyl group, an ethyl group, a butyl group, and a t-butyl group. The alkyl group may further have a substituent, and examples of the substituent, which the alkyl group may further have, may include a halogen atom, an alkyl group, a hydroxyl group with a hydrogen atom being substituted, and an amino group with a hydrogen atom being substituted.

Examples of the group with a hydrogen atom being substituted include an alkyl group, a cycloalkyl group, an aralkyl group, a substituted methyl group, a substituted ethyl group, an alkoxycarbonyl group, and an aralkyloxycarbonyl group. Preferred examples of the alkyl group include an alkyl group having 1 to 4 carbon atoms, preferred examples of the substituted methyl group include a methoxymethyl group, a methoxythiomethyl group, a benzyloxymethyl group, a t-butoxymethyl group, and a 2-methoxyethoxymethyl group, examples of the substituted ethyl group include a 1-ethoxy ethyl group and a 1-methyl-1-methoxyethyl group, preferred examples of the acyl group include an aliphatic acyl group having 1 to 6 carbon atoms, such as a formyl group, an acetyl group, a propionyl group, a butyryl group, an isobutyryl group, a valeryl group, and a pivaloyl group, and preferred examples of the alkoxycarbonyl group include an alkoxycarbonyl group having 1 to 4 carbon atoms.

The resin (A) may or may not contain a repeating unit which has an alicyclic hydrocarbon structure not having a polar group and does not exhibit acid decomposability, and in the case where the resin (A) contains the repeating unit, the content of the repeating unit is preferably 1% by mole to 40% by mole, and more preferably 2% by mole to 20% by mole, with respect to all the repeating units in the resin (A).

Specific examples of the repeating unit, which has an alicyclic hydrocarbon structure not having a polar group and does not exhibit acid decomposability, are set forth below, but the present invention is not limited thereto. In the formulae, Ra represents H, CH$_3$, CH$_2$OH, or CF$_3$.

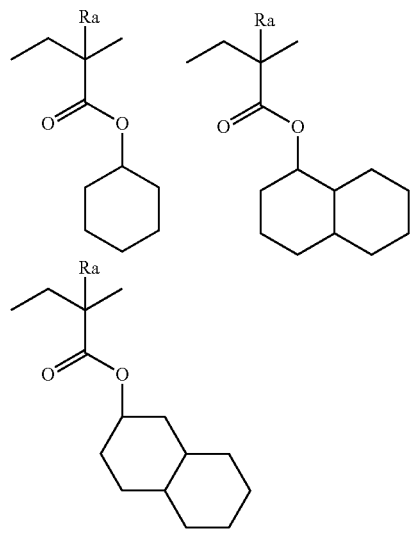

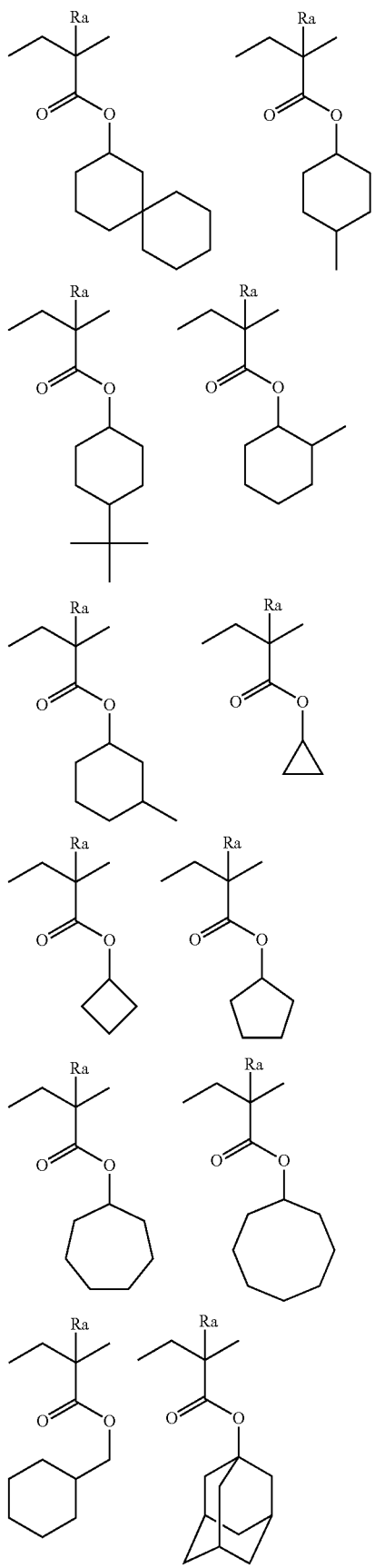

-continued

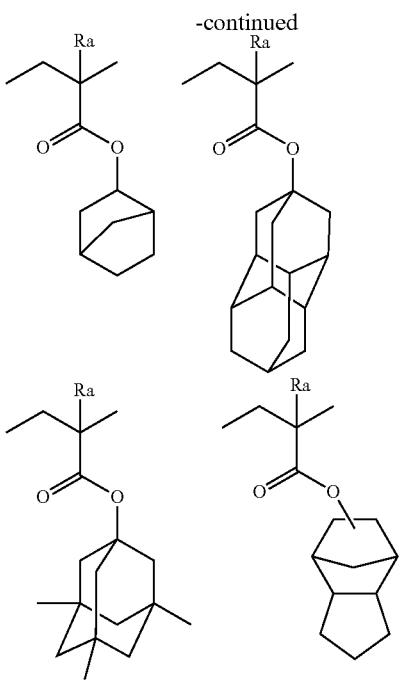

The resin (A) may contain a repeating unit represented by the following General Formula (nI) or (nII).

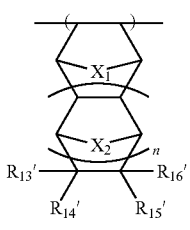

(nI)

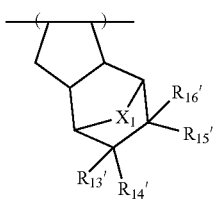

(nII)

In General Formulae (nI) and (nII), $R_{13}'$ to $R_{16}'$ each independently represent a hydrogen atom, a halogen atom, a cyano group, a hydroxyl group, a carboxyl group, an alkyl group, a cycloalkyl group, an alkoxy group, an alkoxycarbonyl group, an alkylcarbonyl group, a group having a lactone structure, or a group having an acid-decomposable group, $X_1$ and $X_2$ each independently represent a methylene group, an ethylene group, an oxygen atom, or a sulfur atom, and n represents an integer of 0 to 2.

Examples of the acid-decomposable group in the group having an acid-decomposable group as $R_{13}'$ to $R_{16}'$ include a cumyl ester group, an enol ester group, an acetal ester group, and a tertiary alkyl ester group, and the acid-decomposable group is preferably a tertiary alkyl ester group represented by —C(=O)—O—$R_0$.

In the formula, $R_0$ represents a tertiary alkyl group such as a t-butyl group and a t-amyl group, an isoboronyl group, a 1-alkoxyethyl group such as a 1-ethoxyethyl group, a 1-butoxyethyl group, a 1-isobutoxyethyl group, and a 1-cyclohexyloxyethyl group, an alkoxymethyl group such as a 1-methoxymethyl group and a 1-ethoxymethyl group, a 3-oxoalkyl group, a tetrahydropyranyl group, a tetrahydrofuranyl group, a trialkylsilyl ester group, a 3-oxocyclohexyl ester group, a 2-methyl-2-adamantyl group, and a mevalonic lactone residue.

At least one of $R_{13}'$ to $R_{16}'$ is preferably a group having an acid-decomposable group.

Examples of the halogen atom in $R_{13}'$ to $R_{16}'$ include a chlorine atom, a bromine atom, a fluorine atom, and an iodine atom.

The alkyl group of $R_{13}'$ to $R_{16}'$ is more preferably a group represented by the following General Formula (F1).

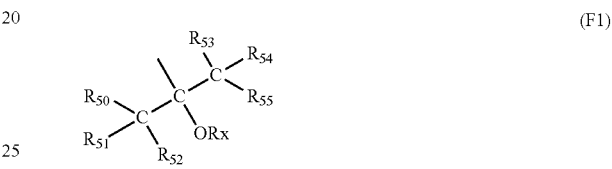

(F1)

In General Formula (F1), $R_{50}$ to $R_{55}$ each independently represent a hydrogen atom, a fluorine atom, or an alkyl group. However, at least one of $R_{50}$ to $R_{55}$ represents a fluorine atom or an alkyl group having at least one hydrogen atom substituted with a fluorine atom; and Rx represents a hydrogen atom or an organic group (preferably an acid-decomposable protecting group, an alkyl group, a cycloalkyl group, an acyl group, or an alkoxycarbonyl group), and preferably a hydrogen atom.

It is preferable that all of $R_{50}$ to $R_{55}$ are fluorine atoms.

Examples of the repeating unit represented by General Formula (nI) or General Formula (nII) include the following specific examples, but the present invention is not limited to these compounds. Among those, repeating units represented by (II-f-16) to (II-f-19) are preferable.

(II-a-1)

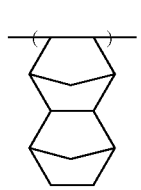

(II-a-2)

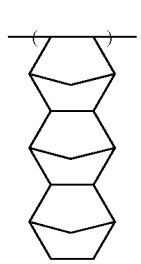

(II-a-3)

-continued
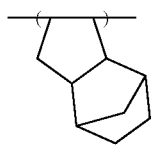
(II-a-4)
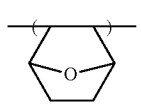
(II-a-5)
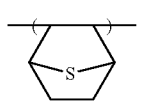
(II-a-6)
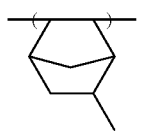
(II-a-7)
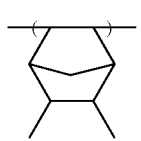
(II-a-8)
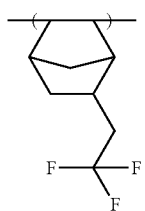
(II-a-9)
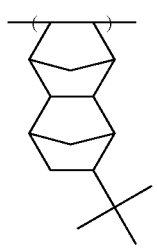
(II-a-10)
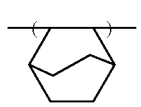
(II-a-11)
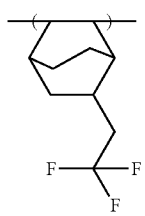
(II-a-12)
-continued
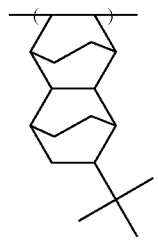
(II-a-13)
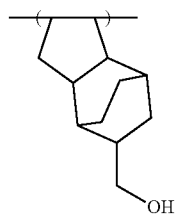
(II-a-14)
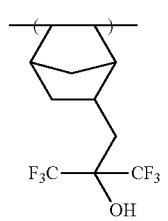
(II-b-1)
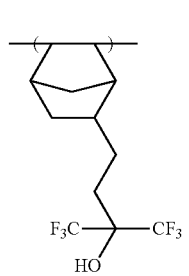
(II-b-2)
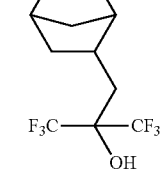
(II-b-3)
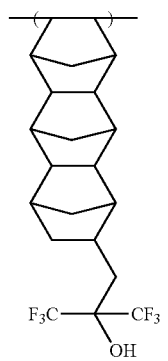
(II-b-4)

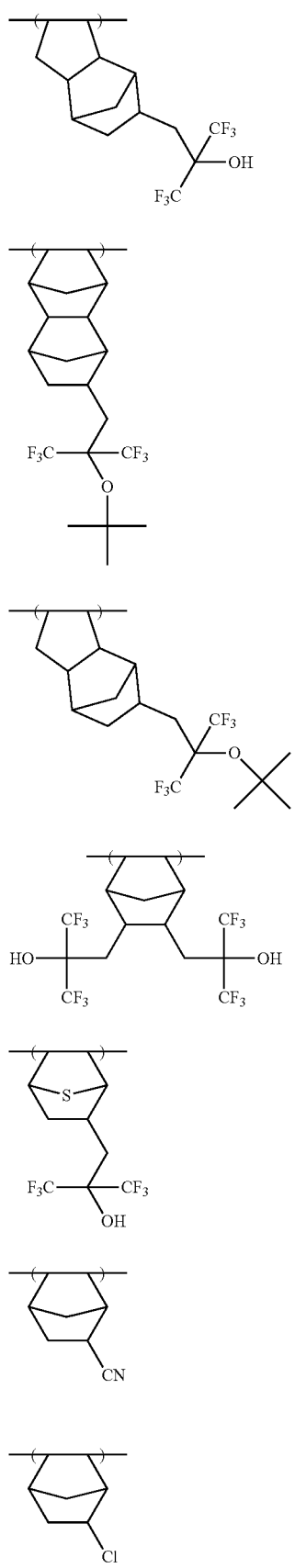
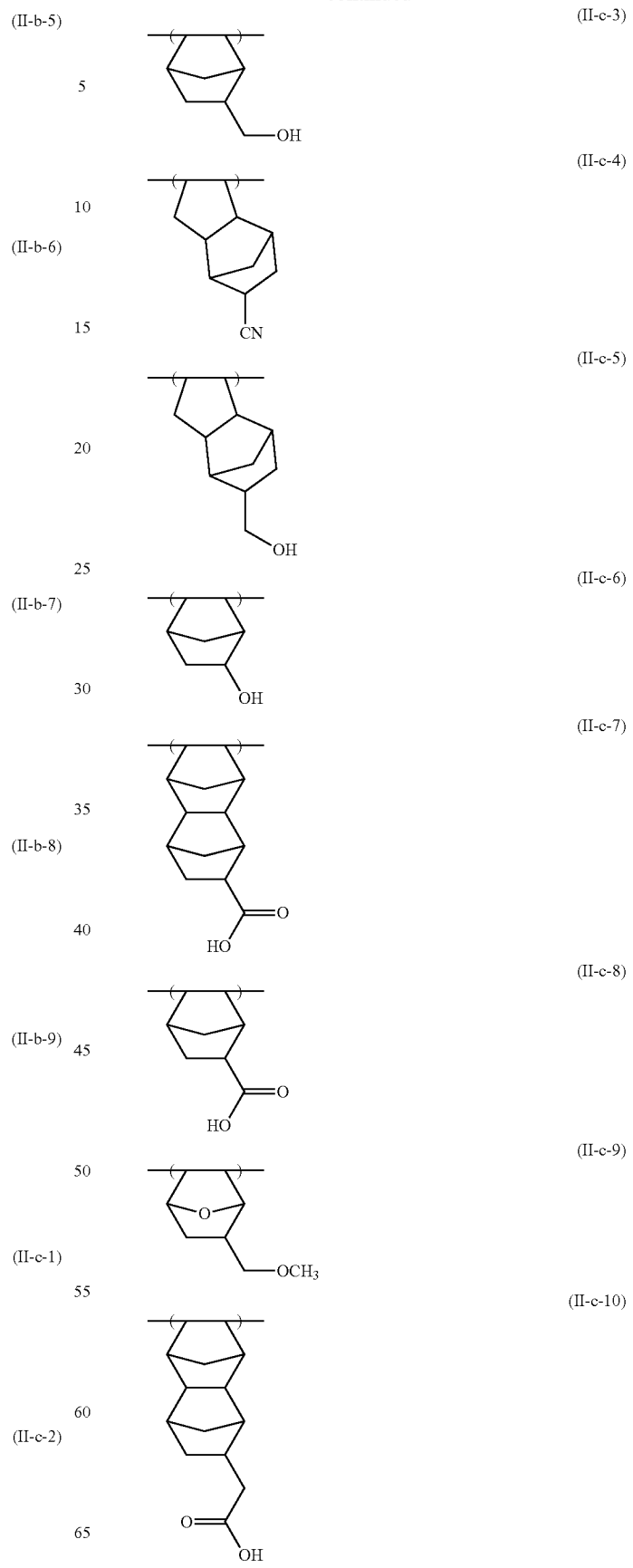

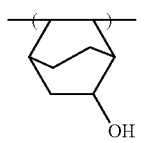 (II-c-11)
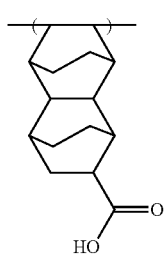 (II-c-12)
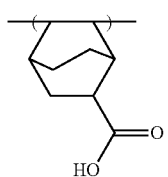 (II-c-13)
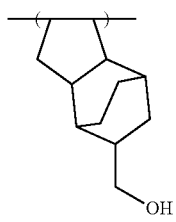 (II-c-14)
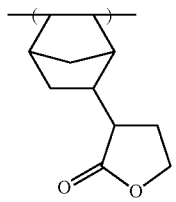 (II-d-1)
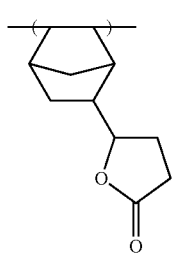 (II-d-2)
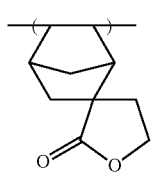 (II-d-3)
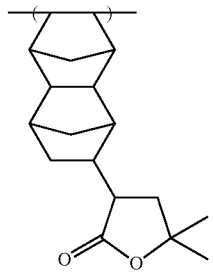 (II-d-4)
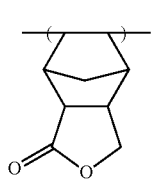 (II-d-5)
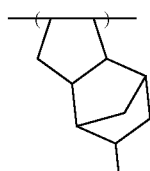 (II-d-6)
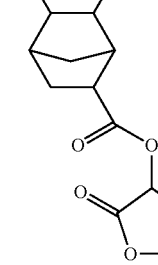 (II-d-7)
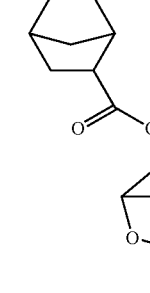 (II-d-8)

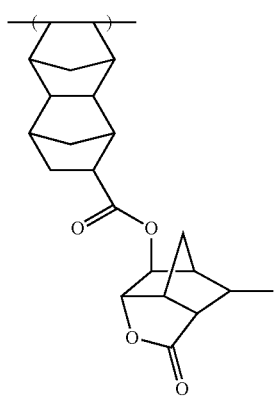 (II-d-9)
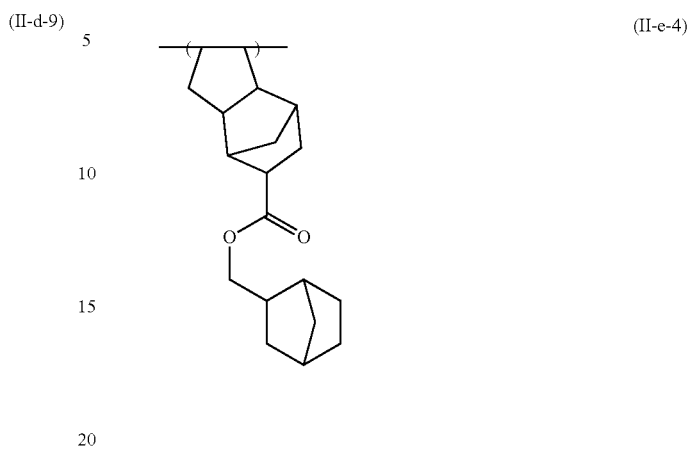 (II-e-4)
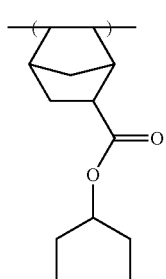 (II-e-1)
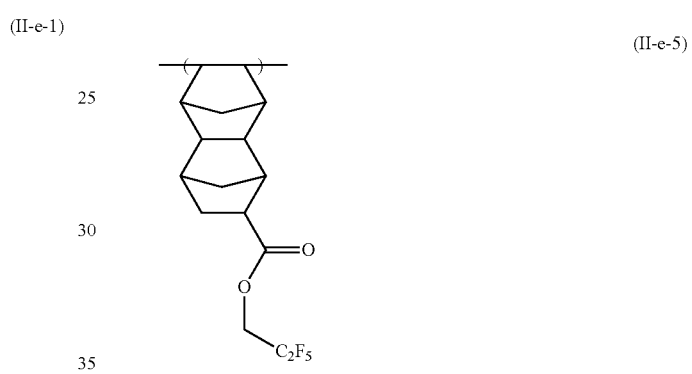 (II-e-5)
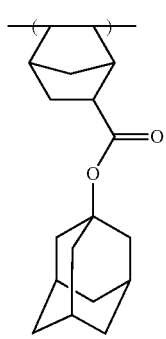 (II-e-2)
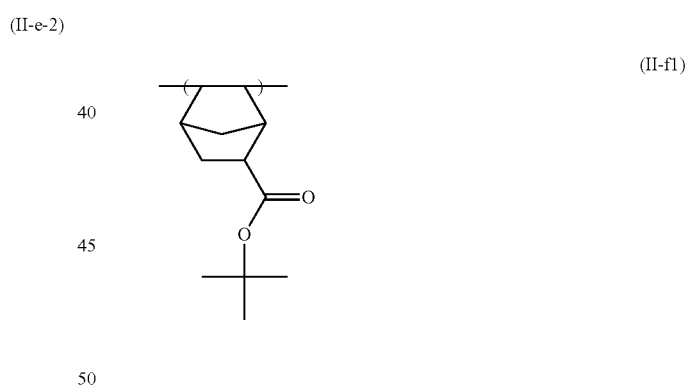 (II-f1)
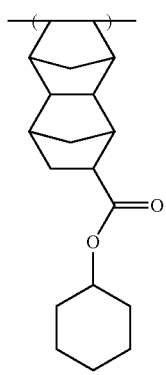 (II-e-3)
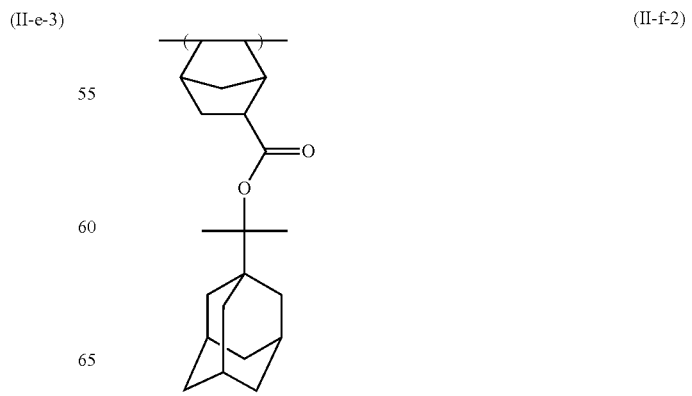 (II-f-2)

(II-f-3) 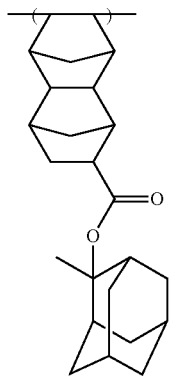
(II-f-4) 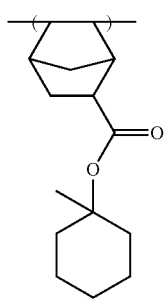
(II-f-5) 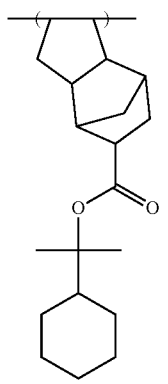
(II-f-6) 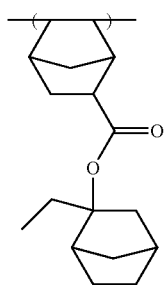
(II-f-7) 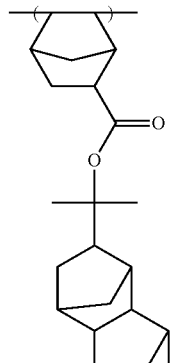
(II-f-8) 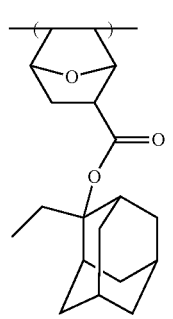
(II-f-9) 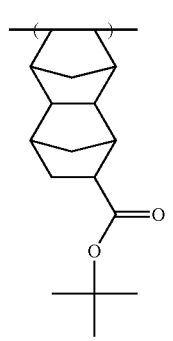
(II-f-10) 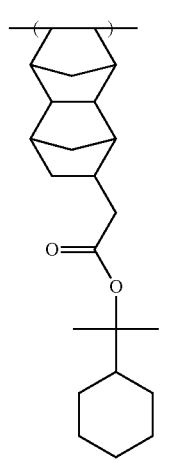

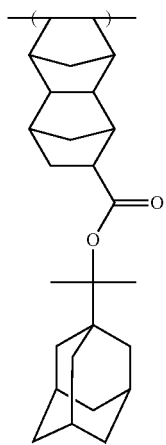 (II-f-11)
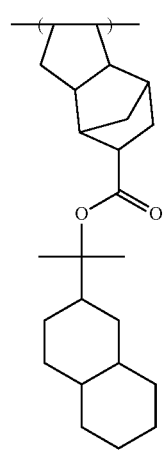 (II-f-15)
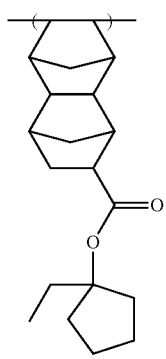 (II-f-12)
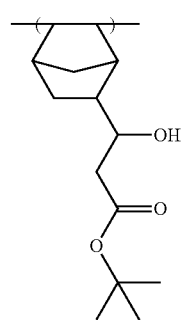 (II-f-16)
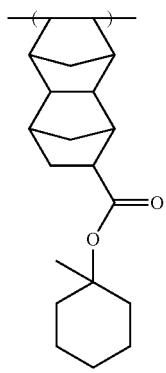 (II-f-13)
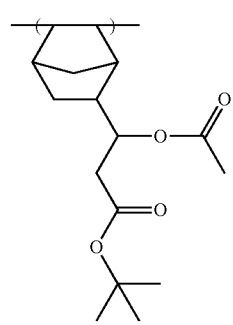 (II-f-17)
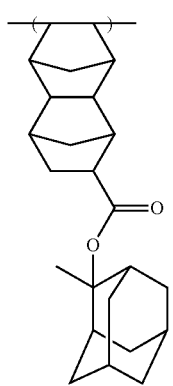 (II-f-14)
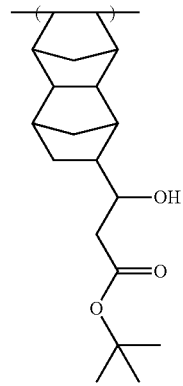 (II-f-18)

(II-f-19)

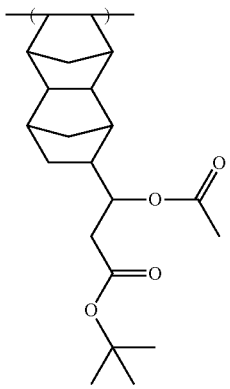

In addition to the repeating structural units, the resin (A) used in the composition of the present invention can have a variety of repeating structural units for the purpose of adjusting dry etching resistance, suitability for a standard developer, adhesion to a substrate, and a resist profile, and in addition, resolving power, heat resistance, sensitivity, and the like, which are characteristics generally required for the resist. Examples of such repeating structural units include, but are not limited to, repeating structural units corresponding to the following monomers.

Thus, it becomes possible to perform fine adjustments to performance required for the resin used in the composition of the present invention, in particular, (1) solubility with respect to a coating solvent, (2) film-forming properties (glass transition point), (3) alkali developability, (4) film reduction (selection of hydrophilic, hydrophobic, or alkali-soluble groups), (5) adhesion of an unexposed area to a substrate, (6) dry etching resistance, and the like.

Examples of such a monomer include a compound having one addition-polymerizable unsaturated bond selected from acrylic esters, methacrylic esters, acrylamides, methacrylamides, allyl compounds, vinyl ethers, and vinyl esters.

In addition to these, an addition-polymerizable unsaturated compound that is copolymerizable with the monomers corresponding to various repeating structural units as described above may be copolymerized.

In the resin (A) used in the composition of the present invention, the molar ratio of each repeating structural unit content is appropriately set in order to adjust dry etching resistance, suitability for a standard developer, adhesion to a substrate, and a resist profile of the resist, and in addition, resolving power, heat resistance, sensitivity, and the like, which are characteristics generally required for the resist.

When the composition of the present invention is for ArF exposure, it is preferable that the resin (A) used in the composition of the present invention has substantially no aromatic rings in terms of transparency to ArF light. More specifically, the proportion of repeating units having an aromatic group in all the repeating units of the resin (A) is preferably 5% by mole or less, more preferably 3% by mole or less, and ideally 0% by mole of all the repeating units, that is, the resin (A) does not have a repeating unit having an aromatic group.

In the case of irradiating the composition of the present invention with KrF excimer laser light, electron beams, X-rays, or high-energy beams at a wavelength of 50 nm or less (for example, EUV), it is preferable that the resin (A) contains a hydroxystyrene repeating unit. The resin (A) is more preferably a copolymer of hydroxystyrene with hydroxystyrene protected with a group capable of leaving by the action of an acid, or a copolymer of hydroxystyrene with tertiary alkyl (meth)acrylate ester.

Specific examples of such a resin include a resin having a repeating unit represented by the following General Formula (A).

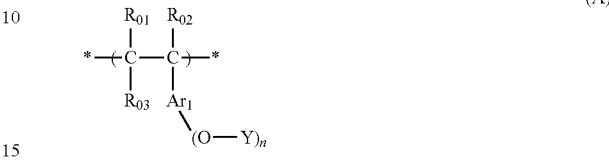

(A)

In the formula, $R_{01}$, $R_{02}$, and $R_{03}$ each independently represent, for example, a hydrogen atom, an alkyl group, a cycloalkyl group, a halogen atom, a cyano group, or an alkoxycarbonyl group. $Ar_1$ represents, for example, an aromatic ring group. Further, $R_{03}$ and $Ar_1$ are each an alkylene group, or both of them may be bonded to each other, together with a —C—C— chain, to form a 5- or 6-membered ring.

Y's in the number of n each independently represent a hydrogen atom or a group capable of leaving by an action of an acid, provided that at least one Y represents a group capable of leaving by an action of an acid.

n represents an integer of 1 to 4, and is preferably 1 or 2, and more preferably 1.

The alkyl group as $R_{01}$ to $R_{03}$ is, for example, preferably an alkyl group having 20 or less carbon atoms, preferably a methyl group, an ethyl group, a propyl group, an isopropyl group, a n-butyl group, a sec-butyl group, a hexyl group, a 2-ethylhexyl group, an octyl group, or a dodecyl group, and more preferably an alkyl group having 8 or less carbon atoms. Further, these alkyl groups may have substituents.

The alkyl group included in the alkoxycarbonyl group is preferably the same as the alkyl group in $R_{01}$ to $R_{03}$.

The cycloalkyl group may be a monocyclic cycloalkyl group or a polycyclic cycloalkyl group. Preferred examples thereof include a monocyclic cycloalkyl group having 3 to 8 carbon atoms, such as a cyclopropyl group, a cyclopentyl group, and a cyclohexyl group. Further, these cycloalkyl groups may have a substituent.

Examples of the halogen atom include a fluorine atom, a chlorine atom, a bromine atom and an iodine atom, and a fluorine atom is more preferable.

In the case where $R_{03}$ represents an alkylene group, preferred examples of the alkylene group include an alkylene group having 1 to 8 carbon atoms, such as a methylene group, an ethylene group, a propylene group, a butylene group, a hexylene group, and an octylene group.

The aromatic ring as $Ar_1$ is preferably an aromatic ring having 6 to 14 carbon atoms, and examples thereof include a benzene ring, a toluene ring, and a naphthalene ring. Here, these aromatic ring groups may have a substituent.

Examples of the group Y capable of leaving by an action of an acid include a group represented by —C($R_{36}$)($R_{37}$)($R_{38}$), —C(=O)—O—C($R_{36}$)($R_{37}$)($R_{38}$), —C($R_{01}$)($R_{02}$)(O$R_{39}$), —C($R_{01}$)($R_{02}$)—C(=O)—O—C($R_{36}$)($R_{37}$)($R_{38}$), or —CH($R_{36}$)(Ar).

In the formula, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring structure.

$R_{01}$ and $R_{02}$ each independently represent a hydrogen atom, an alkyl group, a cycloalkyl group, an aryl group, an aralkyl group, or an alkenyl group.

Ar represents an aryl group.

As the alkyl group as $R_{36}$ to $R_{39}$, $R_{01}$, or $R_{02}$, an alkyl group having 1 to 8 carbon atoms is preferable and examples thereof include a methyl group, an ethyl group, a propyl group, a n-butyl group, a sec-butyl group, a hexyl group, and an octyl group.

A cycloalkyl group as $R_{36}$ to $R_{39}$, $R_{01}$, or $R_{02}$ may be a monocyclic cycloalkyl group or a polycyclic cycloalkyl group. As the monocyclic cycloalkyl group, a cycloalkyl group having 3 to 8 carbon atoms is preferable, and examples thereof include a cyclopropyl group, a cyclobutyl group, a cyclopentyl group, a cyclohexyl group, and a cyclooctyl group. As the polycyclic cycloalkyl group, a cycloalkyl group having 6 to 20 carbon atoms is preferable, and examples thereof include an adamantyl group, a norbornyl group, an isobornyl group, a camphonyl group, a dicyclopentyl group, an α-pinanyl group, a tricyclodecanyl group, a tetracyclododecyl group, and an androstanyl group. Further, some of the carbon atoms in the cycloalkyl group may be substituted with hetero atoms such as an oxygen atom.

An aryl group as $R_{36}$ to $R_{39}$, $R_{01}$, $R_{02}$, or Ar is preferably an aryl group with 6 to 10 carbon atoms and examples thereof include a phenyl group, a naphthyl group, and an anthryl group.

An aralkyl group as $R_{36}$ to $R_{39}$, $R_{01}$, or $R_{02}$ is preferably an aralkyl group with 7 to 12 carbon atoms and for example, a benzyl group, a phenethyl group, and a naphthylmethyl group are preferable.

An alkenyl group as $R_{36}$ to $R_{39}$, $R_{01}$, or $R_{02}$ is preferably an alkenyl group with 2 to 8 carbon atoms and examples thereof include a vinyl group, an allyl group, a butenyl group, and a cyclohexenyl group.

A ring which can be formed by the mutual bonding of $R_{36}$ and $R_{37}$ may be monocyclic or may be polycyclic. As the monocyclic ring, a cycloalkane structure having 3 to 8 carbon atoms is preferable, and examples thereof include a cyclopropane structure, a cyclobutane structure, a cyclopentane structure, a cyclohexane structure, a cycloheptane structure, and a cyclooctane structure. As the polycyclic ring, a cycloalkane structure having 6 to 20 carbon atoms is preferable, and examples thereof include an adamantane structure, a norbornane structure, a dicyclopentane structure, a tricyclodecane structure, and a tetracyclododecane structure. Further, some of the carbon atoms in the ring structure may be substituted with hetero atoms such as an oxygen atom.

Each of the groups described above may have a substituent. Examples of the substituent include an alkyl group, a cycloalkyl group, an aryl group, an amino group, an amido group, an ureido group, an urethane group, a hydroxyl group, a carboxyl group, a halogen atom, an alkoxy group, a thioether group, an acyl group, an acyloxy group, an alkoxycarbonyl group, a cyano group, and a nitro group. These substituents preferably have 8 or less carbon atoms.

As a group Y capable of leaving by an action of an acid, a structure represented by the following General Formula (B) is more preferable.

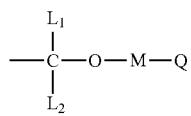

(B)

In the formula, $L_1$ and $L_2$ each independently represent a hydrogen atom, an alkyl group, a cycloalkyl group, an aryl group, or an aralkyl group, M represents a single bond or a divalent linking group, and Q represents an alkyl group, a cycloalkyl group, a cyclic aliphatic group, an aromatic ring group, an amino group, an ammonium group, a mercapto group, a cyano group, or an aldehyde group. Further, these cyclic aliphatic groups and aromatic ring groups may include hetero atoms.

Furthermore, at least two members out of Q, M, and $L_1$ may be bonded to each other to form a 5- or 6-membered ring.

An alkyl group as $L_1$ and $L_2$ is, for example, an alkyl group having 1 to 8 carbon atoms, and specific examples thereof include a methyl group, an ethyl group, a propyl group, a n-butyl group, a sec-butyl group, a hexyl group, and an octyl group.

A cycloalkyl group as $L_1$ and $L_2$ is, for example, a cycloalkyl group having 3 to 15 carbon atoms, and specific examples thereof include a cyclopentyl group, a cyclohexyl group, a norbornyl group, and an adamantyl group.

An aryl group as $L_1$ and $L_2$ is, for example, an aryl group having 6 to 15 carbon atoms, and specific examples thereof include a phenyl group, a tolyl group, a naphthyl group, and an anthryl group.

An aralkyl group as $L_1$ and $L_2$ is, for example, an aralkyl group having 6 to 20 carbon atoms, and specific examples thereof include a benzyl group and a phenethyl group.

A divalent linking group as M is, for example, an alkylene group (for example, a methylene group, an ethylene group, a propylene group, a butylene group, a hexylene group, or an octylene group), a cycloalkylene group (for example, a cyclopentylene group or a cyclohexylene group), an alkenylene group (for example, an ethylene group, a propenylene group, or a butenylene group), an arylene group (for example, a phenylene group, a tolylene group, or a naphthylene group), —S—, —O—, —CO—, —SO$_2$—, —N($R_0$)—, and a combination of two or more thereof. Here, $R_0$ is a hydrogen atom or an alkyl group. The alkyl group as $R_0$ is, for example, an alkyl group having 1 to 8 carbon atoms, and specific examples thereof include a methyl group, an ethyl group, a propyl group, a n-butyl group, a sec-butyl group, a hexyl group, and an octyl group.

The alkyl group and the cycloalkyl group as Q are the same as each group as $L_1$ and $L_2$ described above.

Examples of the cyclic aliphatic group or the aromatic ring group as Ω include the cycloalkyl group and the aryl group as $L_1$ and $L_2$ described above. The cycloalkyl group and the aryl group are preferably groups having 3 to 15 carbon atoms.

Examples of the cyclic aliphatic group or the aromatic ring group, containing a hetero atom, as Q include groups such as thiirane, cyclothiolane, thiophene, furan, pyrrole, benzothiophene, benzofuran, benzopyrrole, triazine, imidazole, benzimidazole, triazole, thiadiazole, thiazole, pyrrolidone, and the like which have a heterocyclic structure. However, the cyclic aliphatic group or the aromatic ring group is not limited thereto as long as it is a ring which is formed by carbon and hetero atoms or a ring which is formed by only hetero atoms. Examples of a ring structure which at least two members out of Q, M, and $L_1$ may form by being bonded to each other include a 5- or 6-membered ring structure which is formed by these forming a propylene group or a butylene group. Here, the 5- or 6-membered ring structure contains an oxygen atom.

Each of the groups represented by $L_1$, $L_2$, M, and Q in General Formula (B) may have a substituent. Examples of the substituent include an alkyl group, a cycloalkyl group, an aryl group, an amino group, an amido group, an ureido group, an urethane group, a hydroxyl group, a carboxyl group, a halogen atom an alkoxy group, a thioether group, an acyl group, an acyloxy group, an alkoxycarbonyl group, a cyano group, and a nitro group. The substituents preferably have 8 or less carbon atoms.

As a group represented by -(M-Q), a group having 1 to 20 carbon atoms is preferable, a group having 1 to 10 carbon atoms is more preferable, and a group having 1 to 8 carbon atoms is still more preferable.

In these specific examples, tBu represents a t-butyl group.

Furthermore, it is preferable that the resin (A) contains neither a fluorine atom nor a silicon atom from the viewpoint of compatibility with a hydrophobic resin (D) which will be described later.

The resin (A) used in composition of the present invention is preferably a resin in which all the repeating units are composed of (meth)acrylate-based repeating units. In this case, all the repeating units may be methacrylate-based repeating units, all the repeating units may be acrylate-based repeating units, or all the repeating units may be composed of methacrylate-based repeating units and acrylate-based repeating units, and the acrylate-based repeating units preferably accounts for 50% by mole or less with respect to all the repeating units. Further, a copolymerization polymer including 20% by mole to 50% by mole a (meth)acrylate-based repeating unit having an acid-decomposable group, 20% by mole to 50% by mole of a (meth)acrylate-based repeating unit having a lactone group, and 5% by mole to 30% by mole of a (meth)acrylate-based repeating unit having an alicyclic hydrocarbon structure substituted with a hydroxyl group or a cyano group, and in addition to these, 0% by mole to 20% by mole of other (meth)acrylate-based repeating units are also preferable.

The resin (A) in the present invention can be synthesized in accordance with an ordinary method (for example, radical polymerization). Examples of the general synthesis method include a bulk polymerization method in which polymerization is carried out by dissolving monomer species and an initiator in a solvent and heating the solution, a dropwise addition polymerization method in which a solution of monomer species and an initiator is added dropwise to a heating solvent for 1 hour to 10 hours, with the dropwise addition polymerization method being preferable. Examples of the reaction solvent include ethers such as tetrahydrofuran, 1,4-dioxane, and diisopropyl ether, ketones such as methyl ethyl ketone and methyl isobutyl ketone, ester solvents such as ethyl acetate, amide solvents such as dimethyl formamide and dimethyl acetamide, and a solvent which dissolves the composition of the present invention, such as propylene glycol monomethyl ether acetate, propylene glycol monomethyl ether, and cyclohexanone, which will be described later. It is more preferable to perform polymerization using the same solvent as the solvent used in the composition of the present invention. Thus, generation of the particles during storage can be inhibited.

It is preferable that the polymerization reaction is carried out in an inert gas atmosphere such as nitrogen and argon. As the polymerization initiator, commercially available radical initiators (an azo-based initiator, peroxide, or the like) are used to initiate the polymerization. As the radical initiator, an azo-based initiator is preferable, and the azo-based initiator having an ester group, a cyano group, or a carboxyl group is preferable. Preferable initiators include azobisisobutyronitrile, azobisdimethylvaleronitrile, dimethyl 2,2'-azobis(2-methyl propionate), or the like. The initiator is added or added in portionwise, as desired, a desired polymer is recovered after the reaction is completed, the reaction mixture is poured into a solvent, and then a method such as powder or solid recovery is used. The concentration of the reactant is 5% by mass to 50% by mass and preferably 10% by mass to 30% by mass. The reaction temperature is normally 10° C. to 150° C., preferably 30° C. to 120° C., and more preferably 60° C. to 100° C.

The weight-average molecular weight of the resin (A) in the present invention is preferably 1,000 to 200,000, more preferably 2,000 to 20,000, still more preferably 3,000 to 15,000, and particularly preferably 3,000 to 11,000 in terms of polystyrene by means of a GPC method. By setting the weight-average molecular weight to 1,000 to 200,000, it is possible to prevent the deterioration of heat resistance or dry-etching resistance, and also prevent the deterioration of film forming properties due to deterioration of developability or increased viscosity.

The dispersity (molecular weight distribution: Mw/Mn) is usually in the range of 1.0 to 3.0, preferably 1.0 to 2.6, more preferably 1.0 to 2.0, and particularly preferably 1.1 to 2.0. The smaller the molecular weight distribution is, the better the resolution and the resist shape are, the smoother the side wall of the resist pattern is, and the better roughness is. In the present invention, the weight-average molecular weight (Mw) and the number average molecular weight (Mn) of the resin (A) can be determined using HLC-8120 (manufactured by Tosoh Corporation), TSK gel Multipore HXL-M (manufactured by Tosoh Corporation, 7.8 mmID×30.0 cm) as a column, and tetrahydrofuran (THF) as an eluant.

The content of the resin (A) in the total composition is preferably 30% by mass to 99% by mass, and more preferably 50% by mass to 95% by mass, with respect to the total solid contents.

Furthermore, the resin (A) may be used alone or in combination of two or more kinds thereof.

[2] (B) Compound Capable of Generating Acid Upon Irradiation with Actinic Ray or Radiation, Represented by General Formula (ZI-3) or (ZI-4)

The actinic ray-sensitive or radiation-sensitive resin composition used in the present invention contains a compound capable of generating an acid upon irradiation with actinic ray or radiation, represented by the following General Formula (ZI-3) or (ZI-4) (hereinafter also referred to as a "compound (B)"). As the compound (B), a compound capable of generating an organic acid upon irradiation with actinic ray or radiation is preferable.

The compound (B) may be a form of a low molecular compound or a form introduced into a part of a polymer. Further, a combination of the form of a low molecular compound and the form introduced into a part of a polymer may also be used.

In the case where the compound (B) is in the form of a low molecular compound, the molecular weight is preferably 3,000 or less, more preferably 2,000 or less, and still more preferably 1,000 or less.

In the case where the compound (B) is in the form introduced into a part of a polymer, it may be introduced into a part of the resin (A) or into a resin other than the resin (A).

In the present invention, the compound (B) is preferably in the form of a low molecular compound.

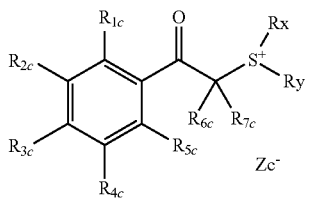

(ZI-3)

In General Formula (ZI-3), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group, $R_{6c}$ and $R_{7c}$ each independently represent a hydrogen atom, an alkyl group, a cycloalkyl group, a halogen atom, a cyano group, or an aryl group, Rx and Ry each independently represent an alkyl group, a cycloalkyl group, a 2-oxoalkyl group, a 2-oxocycloalkyl group, an alkoxycarbonylalkyl group, an allyl group, or a vinyl group, any two or more members out of $R_{1c}$ to $R_{5c}$, $R_{5c}$ and $R_{6c}$, $R_{6c}$ and $R_{7c}$, $R_{5c}$ and Rx, or Rx and Ry may be bonded to each other to form a ring structure, and this ring structure may contain an oxygen atom, a sulfur atom, a ketone group, an ester bond, or an amide bond, and Zc⁻ represents a non-nucleophilic anion.

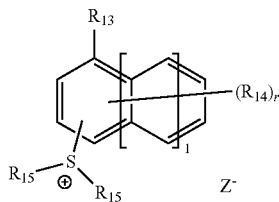

(ZI-4)

In General Formula (ZI-4), $R_{13}$ represents a hydrogen atom, a fluorine atom, a hydroxyl group, an alkyl group, a cycloalkyl group, an alkoxy group, an alkoxycarbonyl group, or a group having a cycloalkyl group.

$R_{14}$'s, in the case where they are present in plural numbers, each independently represent a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group, and these groups may have a substituent, $R_{15}$'s each independently represent an alkyl group, a cycloalkyl group, or a naphthyl group, two $R_{15}$'s may be bonded to each other to form a ring, and the ring structure may contain an oxygen atom, a sulfur atom, a ketone group, an ester bond, or an amide bond, l represents an integer of 0 to 2,
r represents an integer of 0 to 8, and
Z⁻ represents a non-nucleophilic anion First, the compound represented by General Formula (ZI-3) will be described.

The alkyl group as $R_{1c}$ to $R_{7c}$ may be linear or branched, and examples thereof include an alkyl group having 1 to 20 carbon atoms, and preferably an linear or branched alkyl group having 1 to 12 carbon atoms. Examples of the cycloalkyl group include a cycloalkyl group having 3 to 10 carbon atoms.

The aryl group as $R_{1c}$ to $R_{5c}$ is preferably an aryl group having 5 to 15 carbon atoms.

The alkoxy group as $R_{1c}$ to $R_{5c}$ may be linear, branched, or cyclic, and examples thereof include an alkoxy group having 1 to 10 carbon atoms, and preferably a linear or branched alkoxy group having 1 to 5 carbon atoms, and a cyclic alkoxy group having 3 to 10 carbon atoms.

Specific examples of the alkoxy group in the alkoxycarbonyl group as $R_{1c}$ to $R_{5c}$ are the same as the specific examples of the alkoxy group as $R_{1c}$ to $R_{5c}$ above.

Specific examples of the alkyl group in the alkylcarbonyloxy group and the alkylthio group as $R_{1c}$ to $R_{5c}$ are the same as the specific examples of the alkyl group as $R_{1c}$ to $R_{5c}$ above.

Specific examples of the cycloalkyl group in the cycloalkylcarbonyloxy group as $R_{1c}$ to $R_{5c}$ are the same as the specific examples of the cycloalkyl group as $R_{1c}$ to $R_{5c}$ above.

Specific examples of the aryl group in the aryloxy group and the arylthio group as $R_{1c}$ to $R_{5c}$ are the same as the specific examples of the aryl group as $R_{1c}$ to $R_{5c}$ above.

It is preferable that any one of $R_{1c}$ to $R_{5c}$ is a linear or branched alkyl group, a cycloalkyl group, or a linear, branched, or cyclic alkoxy group, and it is more preferable that the sum of number of carbon atoms of $R_{1c}$ to $R_{5c}$ is 2 to 15. With this, the solvent solubility is more enhanced, and generation of particles during storage can be inhibited.

Preferred examples of the ring structure which may be formed by the mutual bonding of any two or more members of $R_{1c}$ to $R_{5c}$ include 5- or 6-membered rings, and particularly preferred examples thereof include 6-membered rings (for example, a phenyl ring).

Examples of the ring structure which may be formed by the mutual bonding of $R_{5c}$ and $R_{6c}$ include a 4-membered or higher-membered ring (particularly preferably a 5- or 6-membered ring) formed together with the carbonyl carbon atom and the carbon atom in General Formula (ZI-3) by the mutual bonding of $R_{5c}$ and $R_{6c}$ to constitute a single bond or an alkylene group (a methylene group, an ethylene group, and the like).

The aryl group as $R_{6c}$ and $R_{7c}$ preferably has 6 to 15 carbon atoms.

In the case where $R_{6c}$ and $R_{7c}$ are bonded to each other to form a ring, the group formed by the mutual bonding of $R_{6c}$ and $R_{7c}$ is preferably an alkylene group having 2 to 10 carbon atoms. Further, the ring formed by the mutual bonding of $R_{6c}$ and $R_{7c}$ may contain a hetero atom such as an oxygen atom in the ring.

Examples of the alkyl group and the cycloalkyl group as Rx and Ry include the same alkyl groups and cycloalkyl groups as for $R_{1c}$ to $R_{7c}$.

Examples of the 2-oxoalkyl group and the 2-oxocycloalkyl group include a group having >C=O at the 2-position of the alkyl group and the cycloalkyl group as $R_{1c}$ to $R_{7c}$.

Examples of the alkoxy group in the alkoxycarbonylalkyl group include the same ones as the alkoxy groups with respect to $R_{1c}$ to $R_{5c}$, and examples of the alkyl group include an alkyl group having 1 to 12 carbon atoms, and preferably a linear alkyl group having 1 to 5 carbon atoms.

The allyl group is not particularly limited, but is preferably an unsubstituted allyl group or an allyl group substituted with a monocyclic or polycyclic cycloalkyl group (preferably a cycloalkyl group having 3 to 10 carbon atoms).

The vinyl group is not particularly limited, but is preferably an unsubstituted vinyl group or a vinyl group substituted with a monocyclic or polycyclic cycloalkyl group (preferably a cycloalkyl group having 3 to 10 carbon atoms).

Examples of the ring structure which may be formed by the mutual bonding of $R_5$ and Rx include a 5 or more-membered ring (particularly preferably a 5-membered ring) formed together with a sulfur atom and a carbonyl carbon atom in General Formula (ZI-3), in which a single bond or an alkylene group (a methylene group, an ethylene group, or the like) is formed by the mutual bonding of $R_{5c}$ and Rx.

Examples of the ring structure which may be formed by the mutual bonding of Rx and Ry include a 5- or 6-membered ring, and particularly preferably a 5-membered ring (that is, a tetrahydrothiophene ring) formed by bivalent Rx and Ry (for example, a methylene group, an ethylene group, and a propylene group) together with a sulfur atom in General Formula (ZI-3).

Rx and Ry are preferably an alkyl group or cycloalkyl group having 4 or more carbon atoms, more preferably an alkyl group or cycloalkyl group having 6 or more carbon atoms, and still more preferably an alkyl group or cycloalkyl group having 8 or more carbon atoms.

$R_{1c}$ to $R_{7c}$, Rx and Ry may further contain a substituent, and examples of the substituent include a halogen atom (for example, a fluorine atom), a hydroxyl group, a carboxyl group, a cyano group, a nitro group, an alkyl group, a cycloalkyl group, an aryl group, an alkoxy group, an aryloxy group, an acyl group, an arylcarbonyl group, an alkoxyalkyl group, an aryloxyalkyl group, an alkoxycarbonyl group, an aryloxycarbonyl group, an alkoxycarbonyloxy group, and an aryloxycarbonyloxy group.

Examples of the alkyl group include an linear or branched alkyl group having 1 to 12 carbon atoms.

Examples of the cycloalkyl group include a cycloalkyl group having 3 to 10 carbon atoms.

Examples of the aryl group include an aryl group having 6 to 15 carbon atoms.

Examples of the alkoxy group include a linear, branched or cyclic alkoxy group having 1 to 20 carbon atom.

Examples of the aryloxy group include an aryloxy group having 6 to 10 carbon atoms.

Examples of the acyl group include a linear or branched acyl group having 2 to 12 carbon atoms.

Examples of the arylcarbonyl group include an aryloxy group having 6 to 10 carbon atoms.

Examples of the alkoxyalkyl group include an linear, branched or cyclic alkoxyalkyl group having 2 to 21 carbon atoms.

Examples of the aryloxyalkyl group include an aryloxy group having 7 to 12 carbon atoms.

Examples of the alkoxycarbonyl group include a linear, branched or cyclic alkoxycarbonyl group having 2 to 21 carbon atoms.

Examples of the aryloxycarbonyl group include an aryloxycarbonyl group 7 to 11 carbon atoms.

Examples of the alkoxycarbonyloxy group include a linear, branched or cyclic alkoxycarbonyloxy group having 2 to 21 carbon atoms.

Examples of the aryloxycarbonyloxy group include an aryloxycarbonyloxy group having 7 to 11 carbon atoms.

In General Formula (ZI-3), $R_{1c}$, $R_{2c}$, $R_{4c}$ and $R_{5c}$ each independently represent a hydrogen atom, and it is more preferable that $R_{3c}$ represents a group other than a hydrogen atom, that is, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

Examples of the cation in the compound represented by General Formula (ZI-3) include the cations described after paragraph <0036> in US2012/0076996A.

Next, the compound represented by General Formula (ZI-4) will be described.

In General Formula (ZI-4), the alkyl group as $R_{13}$, $R_{14}$, and $R_{15}$ is linear or branched, and preferably has 1 to 10 carbon atoms.

Examples of the cycloalkyl group of $R_{13}$, $R_{14}$, and $R_{15}$ include a monocyclic or polycyclic cycloalkyl group (preferably a cycloalkyl group having 3 to 20 carbon atoms).

The alkoxy group of $R_{13}$ and $R_{14}$ is linear or branched, and preferably has 1 to 10 carbon atoms.

The alkoxycarbonyl group of $R_{13}$ and $R_{14}$ is linear or branched, and preferably has 2 to 11 carbon atoms.

Examples of the group having a cycloalkyl group of $R_{13}$ and $R_{14}$ include a monocyclic or polycyclic cycloalkyl group (preferably a cycloalkyl group having 3 to 20 carbon atoms), and examples thereof include a monocyclic or polycyclic cycloalkyloxy group, and an alkoxy group having a monocyclic or polycyclic cycloalkyl group. These groups may further have a substituent.

The monocyclic or polycyclic cycloalkyloxy group of $R_{13}$ and $R_{14}$ preferably has a total number of carbon atoms of 7 or more, and more preferably has a total number of carbon atoms of 7 to 15, and it is preferably a monocyclic cycloalkyl group. The monocyclic cycloalkyloxy group having a total number of carbon atoms of 7 or more refers to a monocyclic cycloalkyloxy group in which a cycloalkyloxy group arbitrarily has a substituent such as an alkyl group, a hydroxyl group, a halogen atom, a nitro group, a cyano group, an amide group, a sulfonylamide group, an alkoxy group, an alkoxycarbonyl group, an acyl group, an acyloxy group, and a carboxyl group, and in which the total number of carbon atoms inclusive of the number of carbon atoms of an arbitrary substituent on the cycloalkyl group is 7 or more.

Furthermore, examples of the polycyclic cycloalkyloxy group having a total number of carbon atoms of 7 or more include a norbornyloxy group, a tricyclodecanyloxy group, a tetracyclodecanyloxy group, and an adamantyloxy group.

The alkoxy group having a monocyclic or polycyclic cycloalkyl group of $R_{13}$ and $R_{14}$ preferably has a total number of carbon atoms of 7 or more, and more preferably has a total number of carbon atoms of 7 to 15, and it is preferably an alkoxy group having a monocyclic cycloalkyl group. The monocyclic alkoxy group having a monocyclic cycloalkyl group, having a total number of carbon atoms of 7 or more, represents to an alkoxy group in which an alkoxy group is substituted with a monocyclic cycloalkyl group which may have the substituent, and the total number of carbon atoms including those of the substituents is 7 or more.

Further, examples of the alkoxy group having a polycyclic cycloalkyl group having a total number of carbon atoms of 7 or more include a norbornylmethoxy group, norbornylethoxy group, a tricyclodecanylmethoxy group, a tricyclodecanylethoxy group, a tetracyclodecanylmethoxy group, a tetracyclodecanylethoxy group, an adamantylmethoxy group, and an adamantylmethoxy group, and preferably a norbornylmethoxy group and a norbornylethoxy group.

Example of the alkyl group of the alkylcarbonyl group of $R_{14}$ include the same specific examples of the alkyl group as $R_{13}$ to $R_{15}$.

The alkylsulfonyl group and the cycloalkylsulfonyl group of $R_{14}$ are linear, branched or cyclic, and preferably have 1 to 10 carbon atoms. Examples thereof include a methanesulfonyl group, an ethanesulfonyl group, a n-propanesulfonyl group, a n-butanesulfonyl group, a tert-butanesulfonyl group, a n-pentanesulfonyl group, neopentanesulfonyl group, a n-hexanesulfonyl group, a n-heptanesulfonyl group, a n-octanesulfonyl group, a 2-ethylhexanesulfonyl group, a n-nonanesulfonyl group, a n-decanesulfonyl group, a cyclopentanesulfonyl group, and a cyclohexanesulfonyl group. Among the alkylsulfonyl group and the cycloalkylsulfonyl group, a methanesulfonyl group, an ethanesulfonyl group, a n-propanesulfonyl group, a n-butanesulfonyl group, a cyclopentanesulfonyl group, a cyclohexanesulfonyl group, and the like are preferable.

The substituent which each group may have is the same as that described as the substituent which $R_{1c}$ to $R_{7c}$, Rx and Ry in General Formula (ZI-3) may further have.

Preferred examples of the ring structure which may be formed by the mutual bonding of two $R_{15}$'s include a 5- or 6-membered ring formed by the mutual bonding of two divalent $R_{15}$'s, together with a sulfur atom in General Formula (ZI-4), and particularly preferably a 5-membered ring (that is, a tetrahydrothiophene ring), in which may be fused with an aryl group or a cycloalkyl group. This divalent $R_{15}$ may have a substituent, and examples of the substituent include a hydroxyl group, a carboxyl group, a cyano group, a nitro group, an alkyl group, an alkoxy group, an alkoxyalkyl group, an alkoxycarbonyl group, and an alkoxycarbonyloxy group. As $R_{15}$ in General Formula (ZI-4), a methyl group, an ethyl group, a naphthyl group, or a divalent group that forms a tetrahydrothiophene ring structure by the mutual bonding of two divalent $R_{15}$'s, together with a sulfur atom is preferable.

As the substituent which may be contained in $R_{13}$ and $R_{14}$, a hydroxyl group, an alkoxy group, an alkoxycarbonyl group, or a halogen atom (particularly a fluorine atom) is preferable.

l is preferably 0 or 1, and more preferably 1.
r is preferably 0 to 2.

Examples of the cation of the compound represented by General Formula (ZI-4) in the present invention include the cations described in paragraphs <0121>, <0123>, and <0124> of JP2010-256842A, paragraphs <0127>, <0129>, and <0130> of JP2011-76056A, and the like.

The non-nucleophilic anion as $Zc^-$ in the compound represented by General Formula (ZI-3) and $Z^-$ in the compound represented by General Formula (ZI-4) refers to an anion having an extremely low ability of causing a nucleophilic reaction, and this anion can suppress the decomposition with aging due to an intramolecular nucleophilic reaction. With this anion, the stability with aging of the composition is improved.

Examples of the non-nucleophilic anion include a sulfonic acid anion, a carboxylic acid anion, a sulfonylimide anion, a bis(alkylsulfonyl)imide anion, and a tris(alkylsulfonyl) methyl anion.

Examples of the sulfonic acid anion include an aliphatic sulfonic acid anion, an aromatic sulfonic acid anion, and a camphorsulfonic acid anion.

Examples of the carboxylic acid anion include an aliphatic carboxylic acid anion, an aromatic carboxylic acid anion, and an aralkylcarboxylic acid anion.

The aliphatic moiety in the aliphatic sulfonic acid anion and the aliphatic carboxylic acid anion may be an alkyl group, or a cycloalkyl group, and preferred examples thereof include an alkyl group having 1 to 30 carbon atoms or a cycloalkyl group having 3 to 30 carbon atoms and preferred examples of the aromatic group in the aromatic sulfonic acid anion and the aromatic carboxylic acid anion include an aryl group having 6 to 14 carbon atoms, for example, a phenyl group, a tolyl group, and a naphthyl group.

The alkyl group, the cycloalkyl group, and the aryl group in the aliphatic sulfonic acid anion and the aromatic sulfonic acid anion may have a substituent.

Examples of other non-nucleophilic anions include fluorinated phosphorus (for example, $PF_6^-$), fluorinated boron (for example, $BF_4^-$), and fluorinated antimony (for example, $SbF_6^-$).

The non-nucleophilic anion is preferably an aliphatic sulfonic acid anion substituted with a fluorine atom at least at the α-position of sulfonic acid, an aromatic sulfonic acid anion substituted with a fluorine atom or a group having a fluorine atom, a bis(alkylsulfonyl)imide anion in which the alkyl group is substituted with a fluorine atom, or a tris (alkylsulfonyl)methide anion in which the alkyl group is substituted with a fluorine atom. The non-nucleophilic anion is more preferably a perfluoroaliphatic sulfonic acid anion having 4 to 8 carbon atoms or a benzenesulfonic acid anion having a fluorine atom, and still more preferably a nonafluorobutanesulfonic acid anion, a perfluorooctanesulfonic acid anion, a pentafluorobenzenesulfonic acid anion, or a 3,5-bis (trifluoromethyl)benzenesulfonic acid anion.

From the viewpoint of the acid strength, the pKa of the generated acid is preferably −1 or less in order to improve the sensitivity.

The compound (B) is preferably a compound capable of generating an acid represented by the following General Formula (II) upon irradiation with actinic ray or radiation. In other words, the non-nucleophilic anions $Z^-$ and $Zc^-$ are preferably a sulfonic acid anion corresponding to a sulfonic acid represented by the following General Formula (II).

Such a compound (B) generates the sulfonic acid represented by General Formula (II) upon irradiation with actinic ray or radiation, and this sulfonic acid has a cyclic organic group as a group A. The cyclic organic group is bulky as compared with a chained group, and thus, the sulfonic acid generated in exposed areas is easily fixed in the exposed areas. As a result, a concern of causing an undesired reaction (a deprotection reaction in non-exposed areas, and the like) due to diffusion of the acid into the non-exposed areas can further be reduced, and particularly, line width roughness (LWR) and the like can be improved.

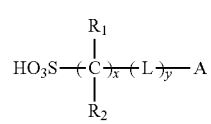

(II)

In General Formula (II), $R_1$ and $R_2$ each independently represent a hydrogen atom, a fluorine atom, or an alkyl group, and $R_1'$ and $R_2'$ in the case where they are present in plural numbers may be the same as or different from each other.

L represents a divalent linking group, and L's in the case where they are present in plural numbers may be the same as or different from each other (here, y represents the repeating number of L's), A represents a cyclic organic group, x represents an integer of 0 to 20, and y represents an integer of 0 to 10.

The alkyl group in $R_1$ or $R_2$ may have a substituent (preferably a fluorine atom), and preferably has 1 to 4 carbon atoms. It is more preferably a perfluoroalkyl group having 1 to 4 carbon atoms. Specific examples of $R_1$ or $R_2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these $CF_3$ is preferable.

$R_1$ or $R_2$ is preferably a fluorine atom or $CF_3$.

L is not particularly limited, and examples thereof include —COO—, —OCO—, —CO—, —O—, —S—, —SO—, —SO$_2$—, an alkylene group, a cycloalkylene group, and an alkenylene group. The number of atoms constituting L is preferably 1 to 20, and more preferably 1 to 3. Among these, —COO—, —OCO—, —CO—, or —O— is preferable, and —COO— or —OCO— is more preferable.

The cyclic organic group of A is not particularly limited, and examples thereof include an alicyclic group, an aryl group, and a heterocyclic group (an aromatic heterocycle and a non-aromatic heterocycle including, for example, a tetrahydropyran ring and a lactone ring structure).

The alicyclic group as A may be monocyclic or polycyclic, and a monocyclic cycloalkyl group such as a cyclopentyl group, a cyclohexyl group, and a cyclooctyl group, and a polycyclic cycloalkyl group such as a norbornyl group, a tricyclodecanyl group, a tetracyclodecanyl group, a tetracyclododecanyl group, and an adamantyl group are preferable. Among these, an alicyclic group having a bulky structure having 7 or more carbon atoms, such as a norbornyl group, a tricyclodecanyl group, a tetracyclodecanyl group, a tetracyclododecanyl group, and an adamantyl group, is preferable from the viewpoint of suppressing diffusion in a film during a Post Exposure Baking (PEB) step, and improving a Mask Error Enhancement Factor (MEEF).

Examples of the aryl group as A include a benzene ring group, a naphthalene ring group, a phenanthrene ring group, and an anthracene ring group. Among these, naphthalene ring group having a low light absorbance is preferable from the viewpoint of the absorbance at 193 nm.

Examples of the heterocyclic group as A include the groups derived from a furan ring, a thiophene ring, a benzofuran ring, a benzothiophene ring, a dibenzofuran ring, a dibenzothiophene ring, a pyridine ring, and a piperidine ring. Among these, the groups derived from a furan ring, a thiophene ring, a pyridine ring, and a piperidine ring are preferable.

Further, examples of the cyclic organic group include a lactone structure, and specific examples thereof include the lactone structures represented by General Formulae (LC1-1) to (LC1-17) which may be contained in the aforementioned resin (A) may have.

The cyclic organic group may have a substituent, and examples of the substituent include a halogen atom, an alkyl group (which may be linear, branched, or cyclic, and preferably has 1 to 12 carbon atoms), a cycloalkyl group (which may be monocyclic, polycyclic, or spiro ring, and preferably has 3 to 20 carbon atoms), an aryl group (preferably having 6 to 14 carbon atoms), a hydroxy group, a cyano group, an alkoxy group, an ester group, an amide group, an urethane group, an ureido group, a thioether group, a sulfonamide group, a sulfonic acid ester group, and a group formed by combination of two or more kinds selected from the atoms and groups. Incidentally, the carbon constituting the cyclic organic group (the carbon contributing to ring formation) may be carbonyl carbon.

x is preferably 1 to 12, more preferably 1 to 4, and particularly preferably 1.

y is preferably 0 to 8, and more preferably 0 to 4.

Specific examples of the compound (B) (the compound represented by General Formula (ZI-3) or (ZI-4)) include the following compounds, but are not limited thereto.

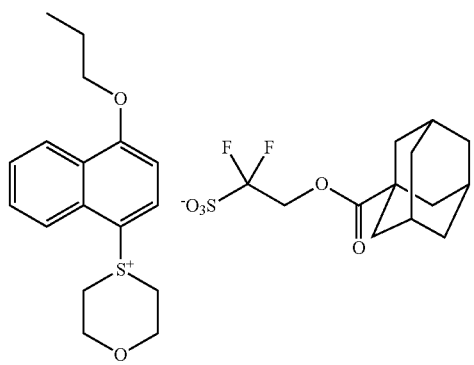

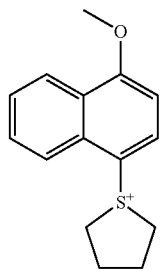

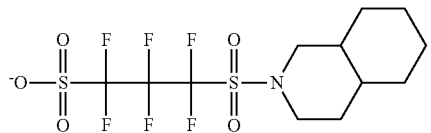

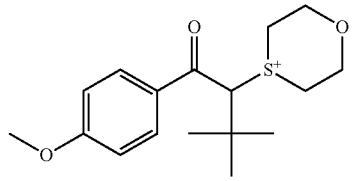

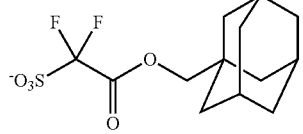

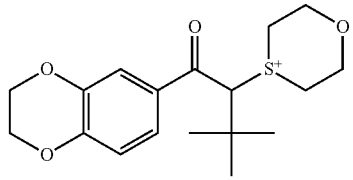

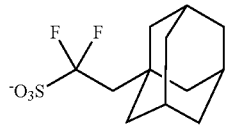

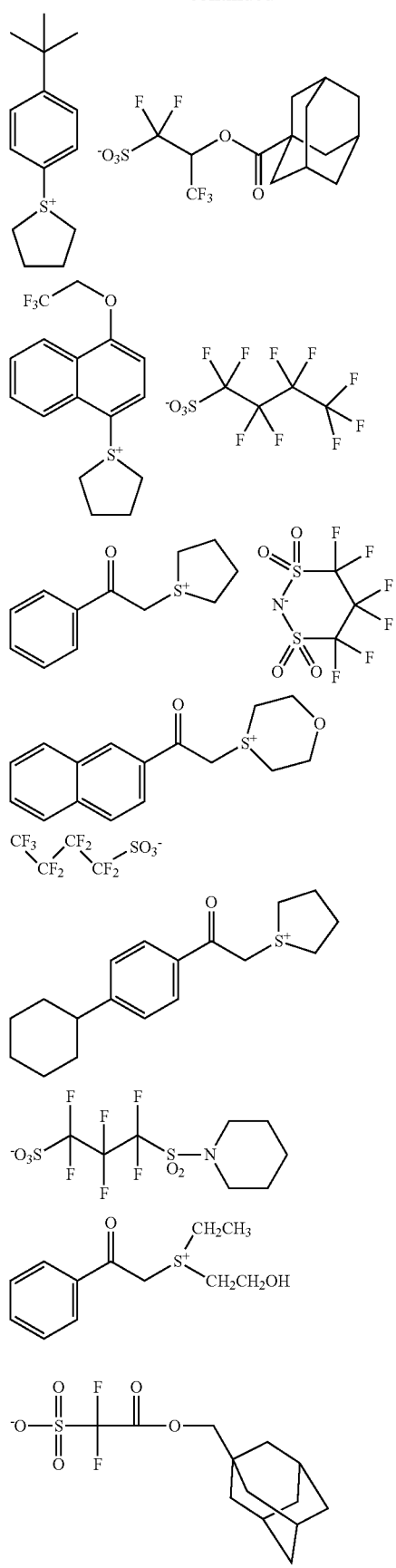
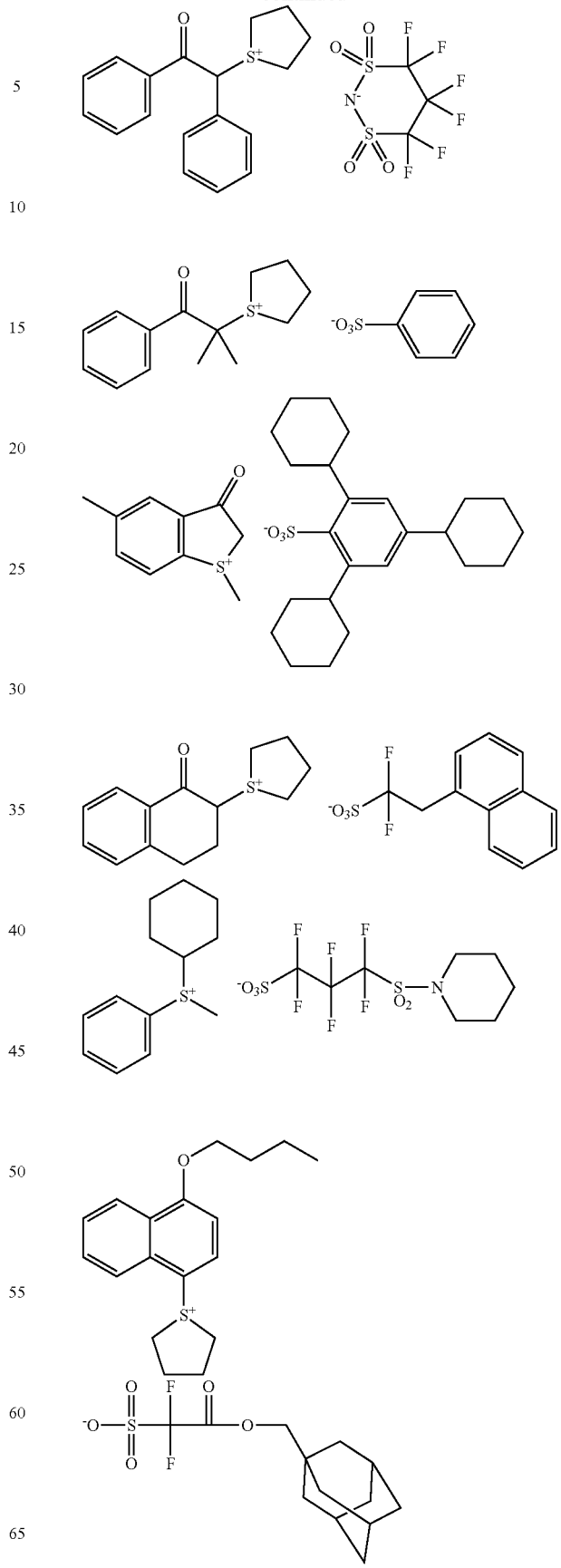

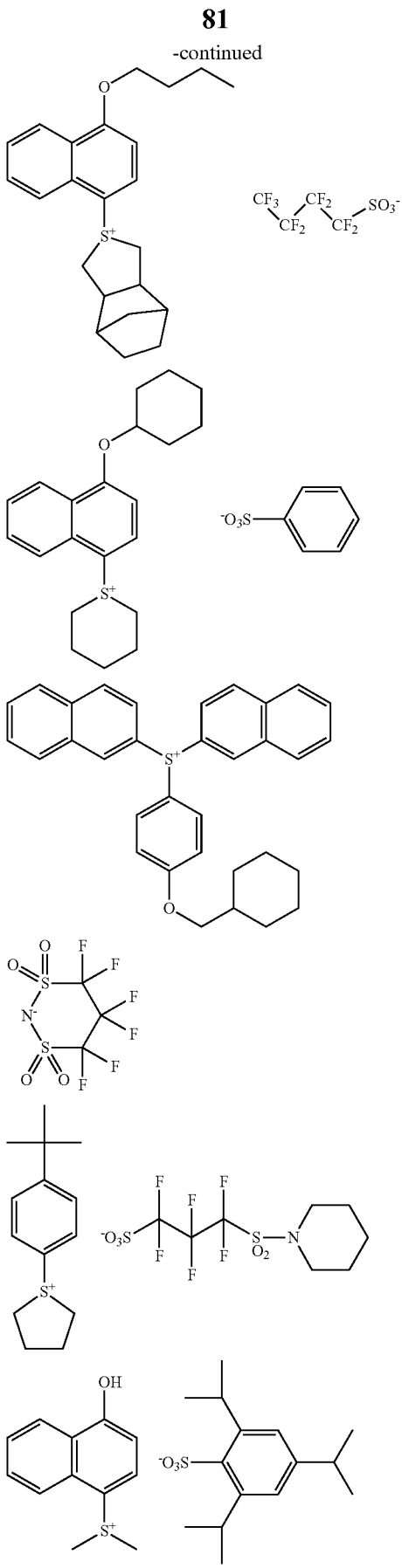

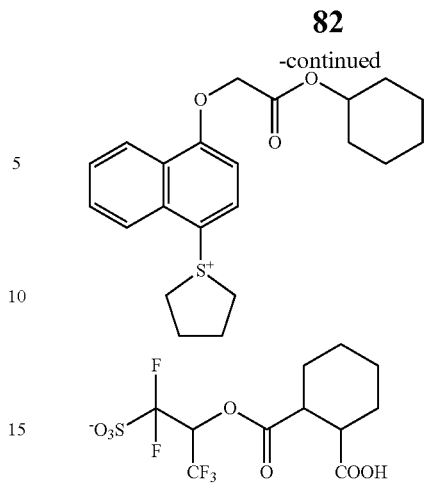

The compound (B) may be synthesized by a known method, and may be synthesized in accordance with the method described in, for example, JP2007-161707A.

The compound (B) may be used alone or in combination of two or more kinds thereof.

The content of the compound (B) is preferably more than 5% by mass, more preferably 8% by mass or more, and still more preferably 10% by mass or more, with respect to the total solid content of the composition. The content of the compound (B) is preferably 50% by mass or less, more preferably 35% by mass or less, and still more preferably 20% by mass or less, with respect to the total solid content of the composition.

The molecular weight of the compound (B) is generally 300 to 1,000, preferably 400 to 800, and still more preferably 500 to 700.

Furthermore, the compound (B) may also be used in combination with other acid generators.

Examples of the other acid generators other than the compound (B), which can be used in combination with the compound (B), include the acid generators described in paragraph <0150> of US2008/0248425A.

Incidentally, the acid generators other than the compound (B), which can be used in combination, may be appropriately selected from a photo-initiator for cationic photopolymerization, a photo-initiator for radical photopolymerization, a photo-decoloring agent for dyes, a photo-discoloring agent, a known compound capable of generating an acid upon irradiation with actinic ray or radiation, which is used for a microresist or the like, and a mixture thereof, and used.

Furthermore, a diazonium salt, a phosphonium salt, a sulfonium salt, an iodonium salt, an imidosulfonate, an oxime sulfonate, a diazodisulfone, a disulfone or an o-nitrobenzyl sulfonate may be used in combination, and a compound where a group or compound capable of generating an acid upon irradiation with actinic ray or radiation is introduced into the main or side chain of the polymer, for example, compounds described in U.S. Pat. No. 3,849,137A, German Patent 3914407, JP1988-26653A (JP-S63-26653A), JP1980-164824A (JP-S55-164824A), JP1987-69263A (JP-S62-69263A), JP1988-146038A (JP-S63-146038A), JP1988-163452A (JP-S63-163452A), JP1987-153853A (JP-S62-153853A), JP1988-146029A (JP-S63-146029A), and the like can be used.

Furthermore, compounds capable of generating an acid by the effect of light described, for example, in U.S. Pat. No. 3,779,778A, EP126712B, and the like can also be used.

The acid generator (B') other than the compound (B), which can be used in combination with the compound (B), may be in the form of a low molecular compound or in the form introduced into a part of a polymer. Further, a combination of the form of a low molecular compound and the form introduced into a part of a polymer may also be used.

In the case where the acid generator (B') is in the form of a low molecular compound, the molecular weight is preferably 3,000 or less, more preferably 2,000 or less, and still more preferably 1,000 or less.

In the case where the acid generator (B') is in the form introduced into a part of a polymer, it may be introduced into a part of the resin (A) or into a resin other than the resin (A).

The acid generator (B') is preferably in the form of a low molecular compound.

Examples of the acid generator (B') include compounds represented by the following General Formulae (ZI'), (ZII'), and (ZIII').

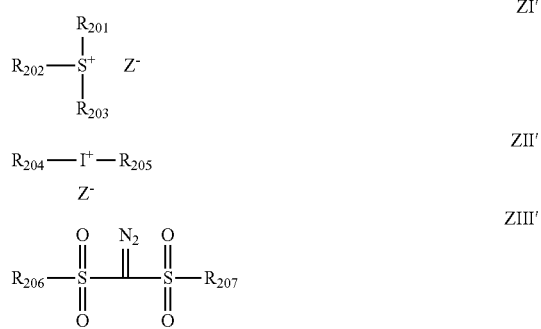

In General Formula (ZI'), $R_{201}$, $R_{202}$, and $R_{203}$ each independently represent an organic group, the number of carbon atoms of the organic group as $R_{201}$, $R_{202}$, and $R_{203}$ is generally 1 to 30, and preferably 1 to 20, two members out of $R_{201}$ to $R_{203}$ may be bonded to each other to form a ring structure, and the ring may include an oxygen atom, a sulfur atom, an ester bond, an amide bond, or a carbonyl group, and examples of the group formed by the mutual bonding of two members out of $R_{201}$ to $R_{203}$ include an alkylene group (for example, a butylene group and a pentylene group), and $Z^-$ represents a non-nucleophilic anion.

Specific examples and preferred examples of the non-nucleophilic anion as $Z^-$ include the non-nucleophilic anions in the compounds represented by General Formulae (ZI-3) and (ZI-4).

Examples of the organic group as $R_{201}$, $R_{202}$, and $R_{203}$ in General Formula (ZI') include the group corresponding to group in the compounds (ZI-1') and (ZI-2') which will be described later.

Further, it may be a compound having a plurality of structures represented by General Formula (ZI'). For example, it may be a compound having a structure in which at least one of $R_{201}$ to $R_{203}$ in the compound represented by General Formula (ZI') is bonded to at least one of $R_{201}$ to $R_{203}$ of one compound represented by General Formula (ZI').

More preferred examples of the component (ZI') include the compounds (ZI-1') to (ZI-2') which will be described below.

The compound (ZI-1') is an arylsulfonium compound, that is, a compound having arylsulfonium as a cation, in which at least one of $R_{201}$ to $R_{203}$ in General Formula (ZI') is an aryl group.

In the arylsulfonium compound, all of $R_{201}$ to $R_{203}$ may be an aryl group, or a part of $R_{201}$ to $R_{203}$ may be an aryl group, with the remainder being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

The aryl group in the arylsulfonium compound is preferably a phenyl group or a naphthyl group, and more preferably a phenyl group. The aryl group may be an aryl group having a heterocyclic structure containing an oxygen atom, a nitrogen atom, a sulfur atom, or the like. Examples of the heterocyclic structure include a pyrrole, a furan, a thiophene, an indole, a benzofuran, and a benzothiophene. In the case where the arylsulfonium compound has two or more aryl groups, these two or more aryl groups may be the same as or different from each other.

The alkyl group or the cycloalkyl group which may be contained, if desired, in the arylsulfonium compound, is preferably a linear or branched alkyl group having 1 to 15 carbon atoms or a cycloalkyl group having 3 to 15 carbon atoms, for example, a methyl group, an ethyl group, a propyl group, a n-butyl group, a sec-butyl group, a t-butyl group, a cyclopropyl group, a cyclobutyl group, and a cyclohexyl group.

The aryl group, the alkyl group, and the cycloalkyl group of $R_{201}$ to $R_{203}$ may have, as the substituent, an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a halogen atom, a hydroxyl group, or a phenylthio group. Preferred substituents are a linear or branched alkyl group having 1 to 12 carbon atoms, a cycloalkyl group having 3 to 12 carbon atoms, or a linear, branched, or cyclic alkoxy group having 1 to 12 carbon atoms, and more preferably an alkyl group having 1 to 4 carbon atoms, or an alkoxy group having 1 to 4 carbon atoms. The substituent may be substituted with any one or all of three $R_{201}$ to $R_{203}$. Incidentally, in the case where $R_{201}$ to $R_{203}$ are each an aryl group, the substituent is preferably substituted at the p-position of the aryl group.

Next, the compound (ZI'-2) will be described.

The compound (ZI'-2) is a compound in which $R_{201}$ to $R_{203}$ in Formula (ZI') each independently represent an organic group not having an aromatic ring. Here, the aromatic ring encompasses an aromatic ring containing a hetero atom.

The organic group not containing an aromatic ring as $R_{201}$ to $R_{203}$ has generally 1 to 30 carbon atoms, and preferably 1 to 20 carbon atoms.

$R_{201}$ to $R_{203}$ are each independently preferably an alkyl group, a cycloalkyl group, an allyl group, or a vinyl group, more preferably a linear or branched 2-oxoalkyl group, a 2-oxocycloalkyl group, or an alkoxycarbonylmethyl group, and particularly preferably a linear or branched 2-oxoalkyl group.

Preferred examples of the alkyl group and the cycloalkyl group of $R_{201}$ to $R_{203}$ include a linear or branched alkyl group having 1 to 10 carbon atoms, and a cycloalkyl group having 3 to 10 carbon atoms. More preferred examples of the alkyl group include a 2-oxoalkyl group and an alkoxycarbonylmethyl group, and still more preferred examples of the cycloalkyl group include a 2-oxocycloalkyl group.

The 2-oxoalkyl group may be linear or branched, and preferred examples thereof include a group having >C=O at the 2-position of the alkyl group.

Preferred examples of the 2-oxocycloalkyl group include a group having >C=O at the 2-position of the cycloalkyl group.

Preferred examples of the alkoxy group in the alkoxycarbonylmethyl group include an alkoxy group having 1 to 5 carbon atoms.

$R_{201}$ to $R_{203}$ may further be substituted with a halogen atom, an alkoxy group (for example, having 1 to 5 carbon atoms), a hydroxyl group, a cyano group, or a nitro group.

In General Formulae (ZII') and (ZIII').

$R_{204}$ to $R_{207}$ each independently represent an aryl group, an alkyl group, or a cycloalkyl group.

The aryl group of $R_{204}$ to $R_{207}$ is preferably a phenyl group or a naphthyl group, and more preferably a phenyl group. The aryl group of $R_{204}$ to $R_{207}$ may be an aryl group having a heterocyclic structure containing an oxygen atom, a nitrogen atom, a sulfur atom, or the like. Examples of the aryl group having a heterocyclic structure include a pyrrole residue (a group formed by removing one hydrogen atom from pyrrole), a furan residue (a group formed by removing one hydrogen atom from furan), a thiophene residue (a group formed by removing one hydrogen atom from thiophene), an indole residue (a group formed by removing one hydrogen atom from indole), a benzofuran residue (a group formed by removing one hydrogen atom from benzofuran), and a benzothiophene residue (a group formed by removing one hydrogen atom from benzothiophene).

Preferred examples of the alkyl group and the cycloalkyl group in $R_{204}$ to $R_{207}$ include a linear or branched alkyl group having 1 to 10 carbon atoms (for example, a methyl group, an ethyl group, a propyl group, a butyl group, and a pentyl group), and a cycloalkyl group having 3 to 10 carbon atoms (a cyclopentyl group, a cyclohexyl group, and a norbornyl group).

The aryl group, the alkyl group, or the cycloalkyl group of $R_{204}$ to $R_{207}$ may have a substituent. Examples of the substituent which the aryl group, the alkyl group, or the cycloalkyl group of $R_{204}$ to $R_{207}$ may have include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

$Z^-$ represents a non-nucleophilic anion, and examples thereof include the same ones as the non-nucleophilic anion of $Z^-$ in General Formula (ZI').

Furthermore, examples of the acid generator (B') include compounds represented by the following General Formulae (ZIV'), (ZV'), and (ZVI').

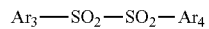

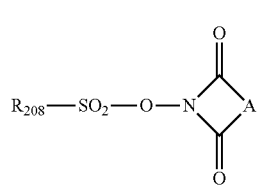

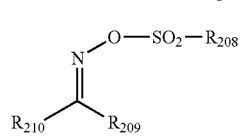

In General Formulae (ZIV') to (ZVI'), $Ar_3$ and $Ar_4$ each independently represent an aryl group, $R_{208}$, $R_{209}$ and $R_{210}$ each independently represent an alkyl group, a cycloalkyl group, or an aryl group, and A represents an alkylene group, an alkenylene group, or an arylene group.

Among the acid generators (B'), the compounds represented by General Formulae (ZI') to (ZIII') are more preferable.

Moreover, the acid generators (B') is preferably a compound capable of generating an acid having one sulfonic acid group or imide group, more preferably a compound capable of generating a monovalent perfluoroalkanesulfonic acid, a compound capable of generating an aromatic sulfonic acid substituted with a monovalent fluorine atom or a fluorine atom-containing group, or a compound capable of generating an imide acid substituted with a monovalent fluorine atom or a fluorine atom-containing group, and still more preferably a sulfonium salt of fluoro-substituted alkanesulfonic acid, fluorine-substituted benzenesulfonic acid, fluorine-substituted imide acid or fluorine-substituted methide acid. The acid generator which can be used is particularly preferably a compound capable of generating a fluoro-substituted alkanesulfonic acid, a fluoro-substituted benzenesulfonic acid or a fluoro-substituted imide acid, where pKa of the acid generated is −1 or less, with the sensitivity being improved.

Among the acid generators (B'), particularly preferred examples are shown below.

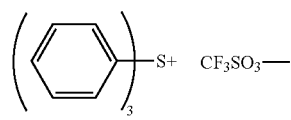

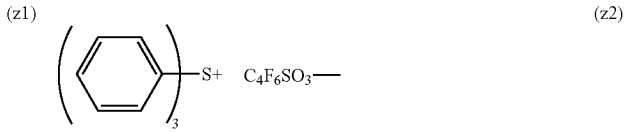

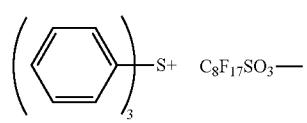

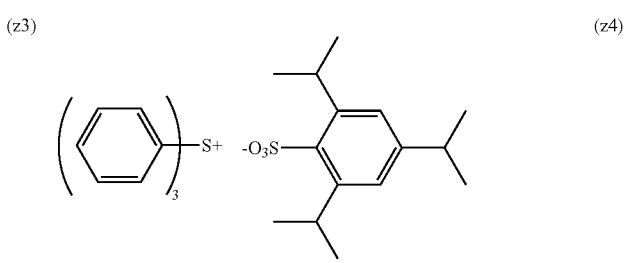

-continued
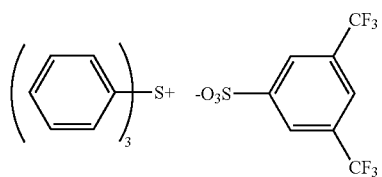 (z5)
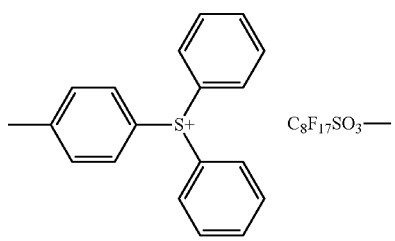 (z6)
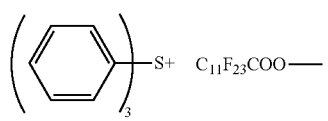 (z7)
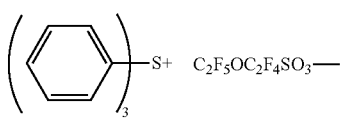 (z8)
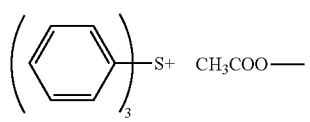 (z9)
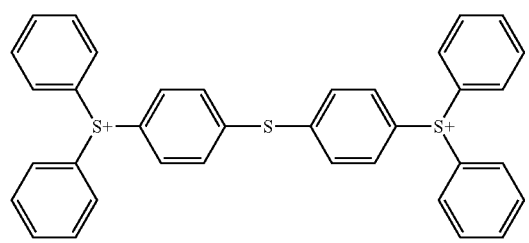 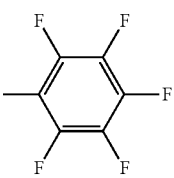 (z10)
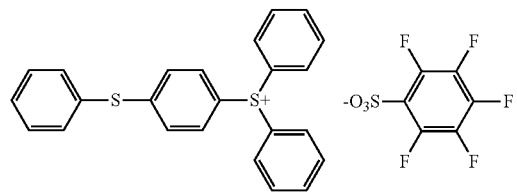 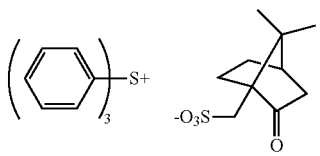 (z11)
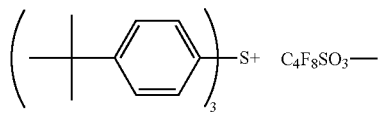 (z12)
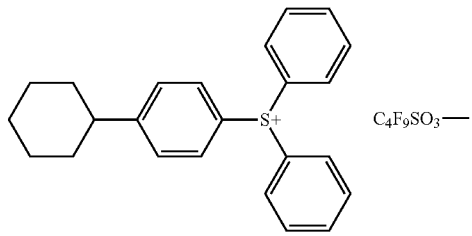 (z13)
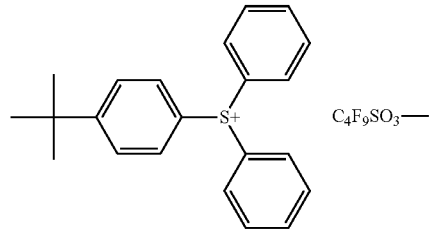 (z14)
(z15)
(z16)
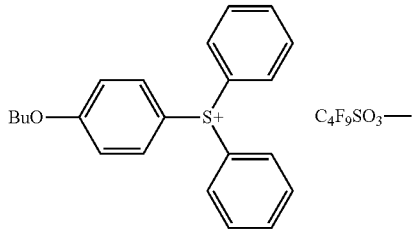 (z17)
(z18)

-continued
(z19) 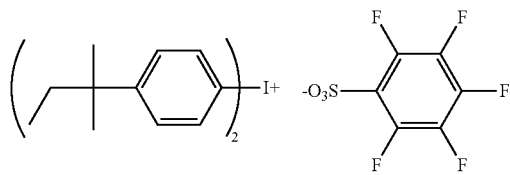
(z20) 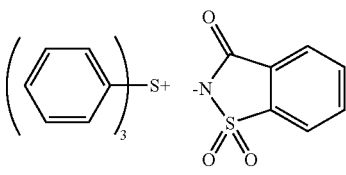
(z21) 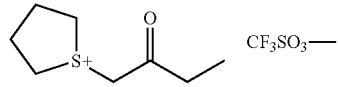
(z22) 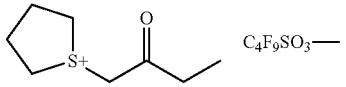
(z23) 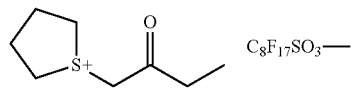
(z24) 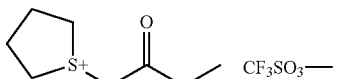
(z25) 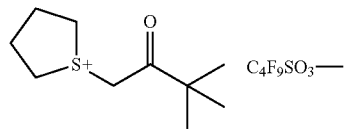
(z26) 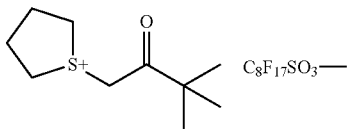
(z27) 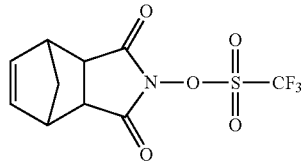
(z28) 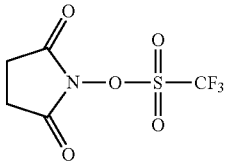
(z29) 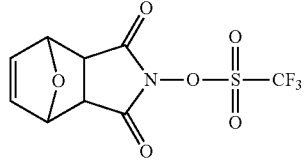
(z30) 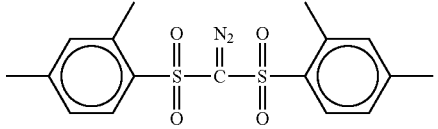
(z31) 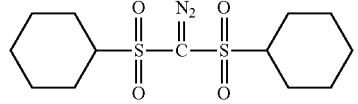
(z32) 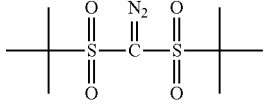
(z33) 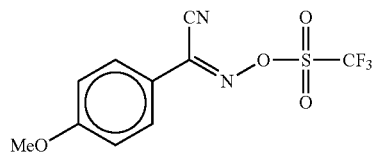
(z34) 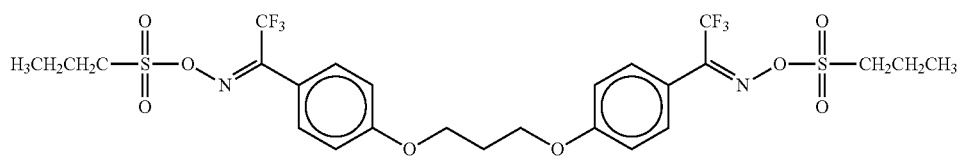
(z38) 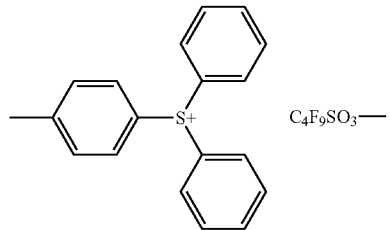
(z39) 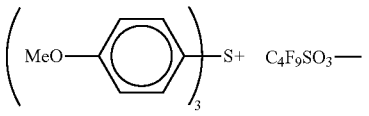

-continued

-continued
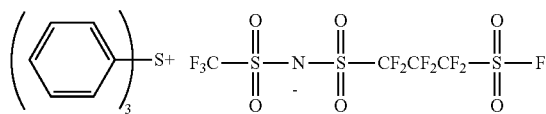
(z69)
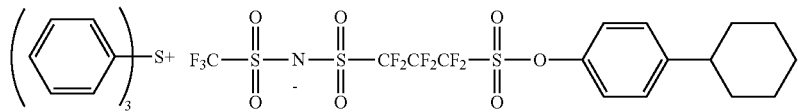
(z70)
(z71)
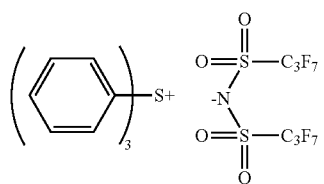
(z72)
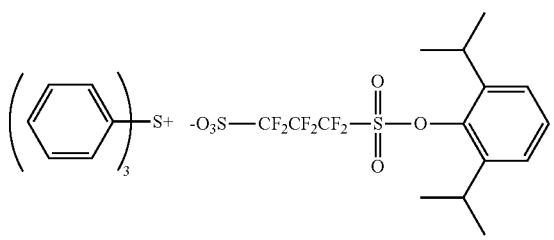
(z73)
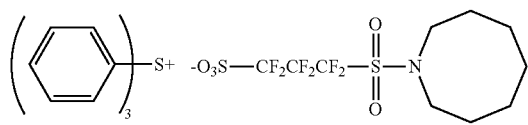
(z74)
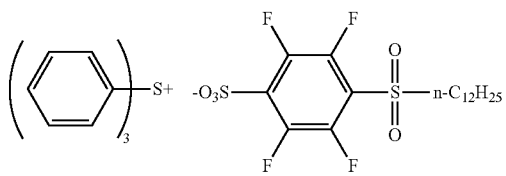
(z75)
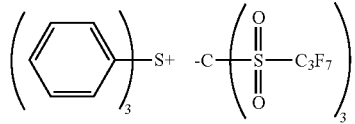
(z76)
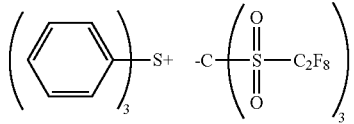
(z77)
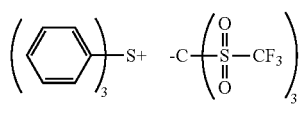
(z78)
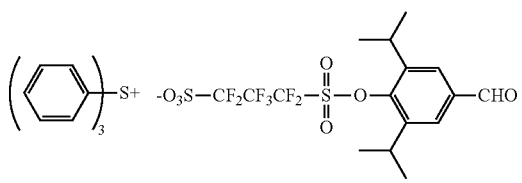
(z79)
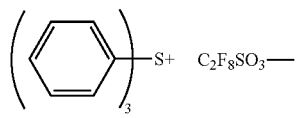
(z80)
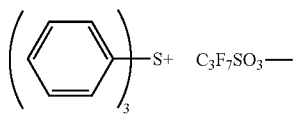
(z81)
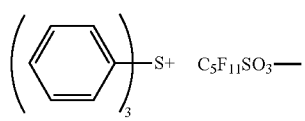
(z82)
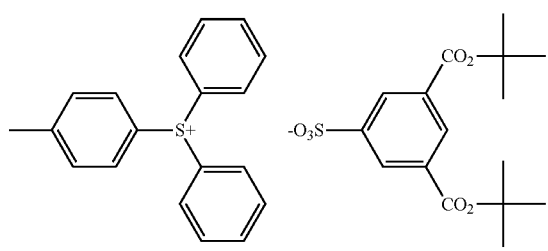

-continued

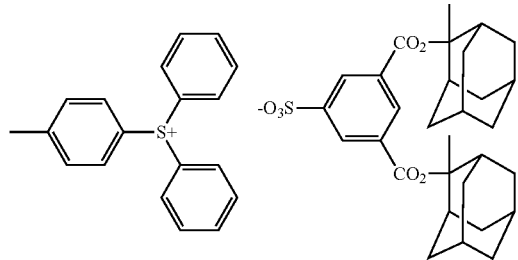
(z83)

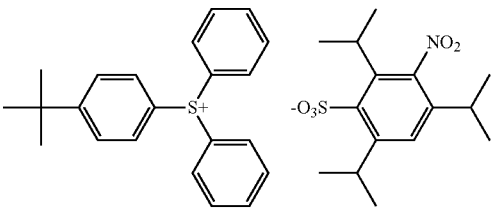
(z84)

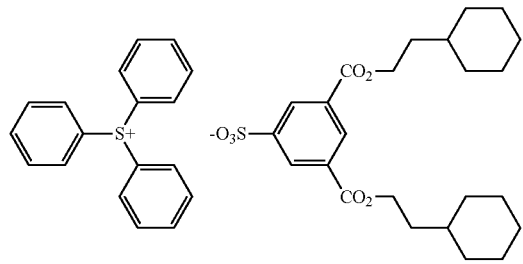
(z85)

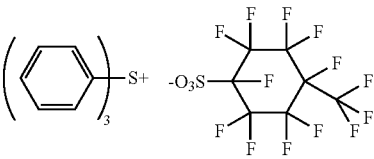
(z86)

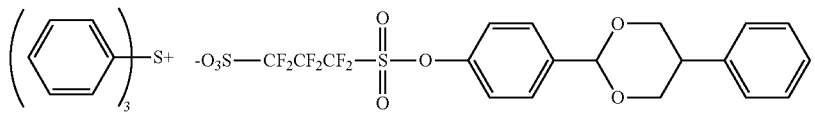
(z87)

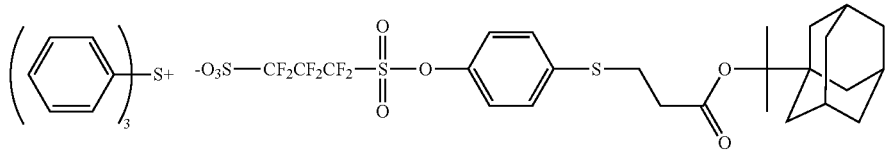
(z88)

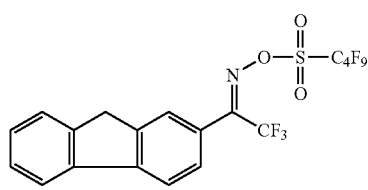
(z89)

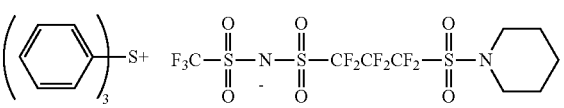
(z90)

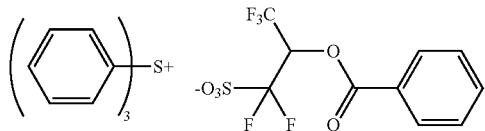
(z91)

The total amount of the acid generator (in the case of using an acid generator other than the compound (B) in combination, including the amount of this acid generator) is preferably 5% by mass to 60% by mass, more preferably 5% by mass to 50% by mass, and still more preferably 5% by mass to 30% by mass, with respect to the total solid content of the resist composition.

In the case of using the compound (B) and the acid generator other than the compound (B) in combination, the amount of acid generators used is, in terms of the molar ratio (compound (B)/the other acid generator), usually 99/1 to 20/80, preferably 99/1 to 40/60, and more preferably 99/1 to 50/50.

[3] Hydrophobic Resin (D)

The composition of the present invention may contain a hydrophobic resin (hereinafter also referred to as a "hydrophobic resin (D)" or simply a "resin (D)"). Further, the hydrophobic resin (D) is preferably different from the resin (A).

Although the hydrophobic resin (D) is preferably designed to be unevenly localized on an interface as described above, it does not necessarily have to have a hydrophilic group in its molecule as different from the surfactant, and does not need to contribute to uniform mixing of polar/nonpolar materials.

Examples of the effect of addition of the hydrophobic resin include control of the static/dynamic contact angle of the resist film surface with respect to water, improvement of the immersion liquid tracking properties, and inhibition of out gas.

The hydrophobic resin (D) preferably has at least one of a "fluorine atom", a "silicon atom", or a "$CH_3$ partial structure which is contained in a side chain portion of a resin" from the point of view of uneven distribution on the film surface layer, and more preferably has two or more types.

In the case where hydrophobic resin (D) contains a fluorine atom and/or a silicon atom, the fluorine atom and/or the silicon atom in the hydrophobic resin (D) may be contained in the main chain or the side chain of the resin.

In the case where the hydrophobic resin (D) contains a fluorine atom, the resin is preferably a resin which contains an alkyl group having a fluorine atom, a cycloalkyl group having a fluorine atom, or an aryl group having a fluorine atom, as a partial structure having a fluorine atom.

The alkyl group having a fluorine atom (preferably having 1 to 10 carbon atoms, and more preferably having 1 to 4 carbon atoms) is a linear or branched alkyl group in which at least one hydrogen atom is substituted with a fluorine atom, and may further have a substituent other than a fluorine atom.

The cycloalkyl group having a fluorine atom is a monocyclic or polycyclic cycloalkyl group in which at least one hydrogen atom is substituted with a fluorine atom, and may further have a substituent other than a fluorine atom.

The aryl group having a fluorine atom is an aryl group such as a phenyl group and a naphthyl group, in which at least one hydrogen atom is substituted with a fluorine atom, and may further have a substituent other than a fluorine atom.

Preferred examples of the alkyl group having a fluorine atom the cycloalkyl group having a fluorine atom, and the aryl group having a fluorine atom include groups represented by the following General Formulae (F2) to (F4), but the present invention is not limited thereto.

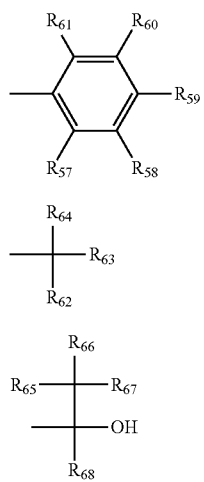

at least one hydrogen atom is substituted with a fluorine atom, and more preferably a perfluoroalkyl group having 1 to 4 carbon atoms. $R_{62}$ and $R_{63}$ may be linked to each other to form a ring.

Specific examples of the group represented by General Formula (F2) include a p-fluorophenyl group, a pentafluorophenyl group, and a 3,5-di(trifluoromethyl)phenyl group.

Specific examples of the group represented by General Formula (F3) include those exemplified in <0500> of US2012/0251948A1.

Specific examples of the group represented by General Formula (F4) include —C(CF$_3$)$_2$OH, —C(C$_2$F$_5$)$_2$OH, —C(CF$_3$)(CH$_3$)OH, and —CH(CF$_3$)OH, with —C(CF$_3$)$_2$OH being preferable.

The partial structure having a fluorine atom may be bonded directly to the main chain or may be bonded to the main chain through a group selected from the group consisting of an alkylene group, a phenylene group, an ether bond, a thioether bond, a carbonyl group, an ester bond an amide bond, an urethane bond, and an ureylene bond, or a group formed by combination of two or more thereof.

The hydrophobic resin (D) may contain a silicon atom. The resin preferably has, as the partial structure having a silicon atom, an alkylsilyl structure (preferably a trialkylsilyl group) or a cyclic siloxane structure.

Specific examples of the alkylsilyl structure and the cyclic siloxane structure include the groups represented by the following General Formulae (CS-1) to (CS-3).

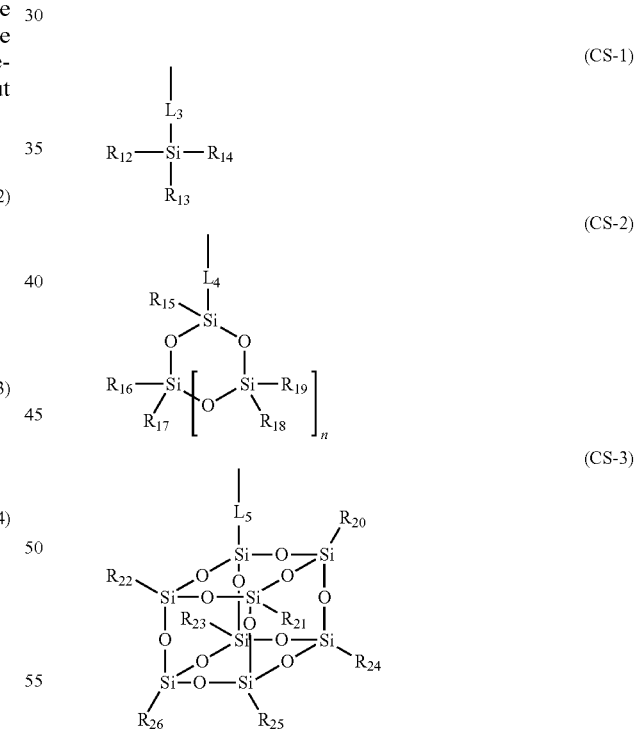

In General Formulae (F2) to (F4), $R_{57}$ to $R_{68}$ each independently represent a hydrogen atom, a fluorine atom, or an (linear or branched) alkyl group, provided that at least one of $R_{57}$, . . . , or $R_{61}$, at least one of $R_{62}$, . . . , or $R_{64}$, and at least one of $R_{65}$, . . . , or $R_{68}$ each independently represent a fluorine atom or an alkyl group (preferably having 1 to 4 carbon atoms) in which at least one hydrogen atom is substituted with a fluorine atom.

It is preferable that $R_{57}$ to $R_{61}$, and $R_{65}$ to $R_{67}$ are all fluorine atoms. $R_{62}$, $R_{63}$, and $R_{68}$ are each preferably an alkyl group (preferably having 1 to 4 carbon atoms) in which In General Formulae (CS-1) to (CS-3), $R_{12}$ to $R_{26}$ each independently represent linear or branched alkyl group (preferably having 1 to 20 carbon atoms) or a cycloalkyl group (preferably having 3 to 20 carbon atoms), $L_3$ to $L_5$ represents a single bond or a divalent linking group, and examples of the divalent linking group include a sole group or a combination of two or more groups selected from the group consisting of an alkylene group, a phenylene group, an ether bond, a thioether bond, a carbonyl group, an ester bond, an amide bond, an urethane bond, and an urea bond (preferably having a total number of carbon atoms of 12 or less), and n represents an integer of 1 to 5, and preferably an integer of 2 to 4.

Examples of the repeating unit having a fluorine atom or a silicon atom include those exemplified in <0519> of US2012/0251948A1.

Furthermore, it is also preferable that the hydrophobic resin (D) contains a $CH_3$ partial structure in the side chain portion as described above.

Here, the $CH_3$ partial structure (hereinafter also simply referred to as a "side chain $CH_3$ partial structure") contained in the side chain portion in the hydrophobic resin (D) includes a $CH_3$ partial structure contained in an ethyl group, a propyl group, and the like.

On the other hand, a methyl group bonded directly to the main chain of the hydrophobic resin (D) (for example, an α-methyl group in the repeating unit having a methacrylic acid structure) makes only a small contribution of uneven distribution to the surface of the hydrophobic resin (D) due to the effect of the main chain, and it is therefore not included in the $CH_3$ partial structure in the present invention.

More specifically in the case where the hydrophobic resin (D) contains a repeating unit derived from a monomer having a polymerizable moiety with a carbon-carbon double bond, such as a repeating unit represented by the following General Formula (M), and in addition, $R_{11}$ to $R_{14}$ are $CH_3$ "themselves", such $CH_3$ is not included in the $CH_3$ partial structure contained in the side chain portion in the present invention.

On the other hand, a $CH_3$ partial structure which is present via a certain atom from a C—C main chain corresponds to the $CH_3$ partial structure in the present invention. For example, in the case where $R_{11}$ is an ethyl group ($CH_2CH_3$), the hydrophobic resin (D) has "one" $CH_3$ partial structure in the present invention.

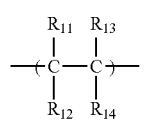

(M)

In General Formula (M), $R_{11}$ to $R_{14}$ each independently represent a side chain portion.

Examples of $R_{11}$ to $R_{14}$ at the side chain portion include a hydrogen atom and a monovalent organic group.

Examples of the monovalent organic group for $R_{11}$ to $R_{14}$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, each of which may further have a substituent.

The hydrophobic resin (D) is preferably a resin including a repeating unit having the $CH_3$ partial structure in the side chain portion thereof. Further, the hydrophobic resin preferably has, as such a repeating unit, at least one repeating unit (x) selected from a repeating unit represented by the following General Formula (II) and a repeating unit represented by the following General Formula (III).

Hereinafter, the repeating unit represented by General Formula (II) will be described in detail.

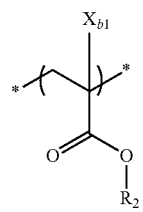

(II)

In General Formula (II), $X_{b1}$ represents a hydrogen atom, an alkyl group, a cyano group, or a halogen atom, and $R_2$ represents an organic group which has one or more $CH_3$ partial structures and is stable against an acid. Here, more specifically, the organic group which is stable against an acid is preferably an organic group which does not have an "acid-decomposable group" described with respect to the resin (A).

The alkyl group of $X_{b1}$ is preferably an alkyl group having 1 to 4 carbon atoms, and examples thereof include a methyl group, an ethyl group, a propyl group, a hydroxymethyl group, and a trifluoromethyl group, with the methyl group being preferable.

$X_{b1}$ is preferably a hydrogen atom or a methyl group.

Examples of $R_2$ include an alkyl group, a cycloalkyl group, an alkenyl group, a cycloalkenyl group, an aryl group, and an aralkyl group, each of which has one or more $CH_3$ partial structures. Each of the cycloalkyl group, the alkenyl group, the cycloalkenyl group, the aryl group and the aralkyl group may further have an alkyl group as a substituent.

$R_2$ is preferably an alkyl group or an alkyl-substituted cycloalkyl group, each of which has one or more $CH_3$ partial structures.

The number of the $CH_3$ partial structures contained in the organic group which has one or more $CH_3$ partial structures and is stable against an acid as $R_2$ is preferably 2 to 10, and more preferably 2 to 8.

Specific preferred examples of the repeating unit represented by General Formula (II) are set forth below, but the present invention is not limited thereto.

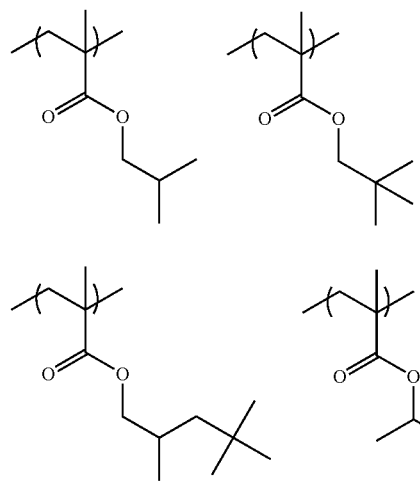

101
-continued
102
-continued
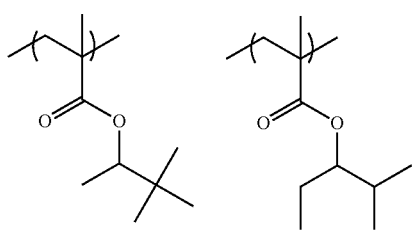
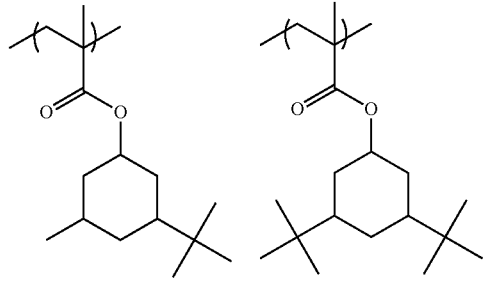
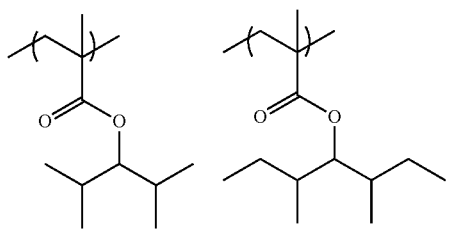
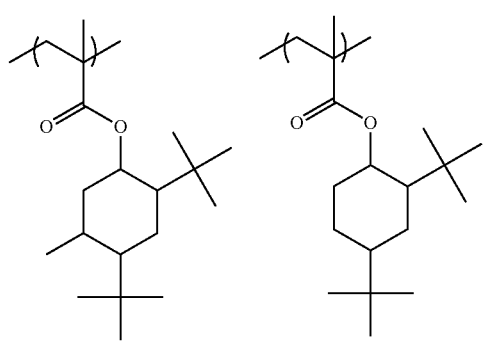
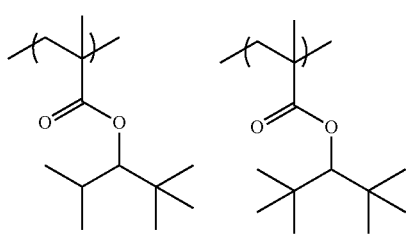
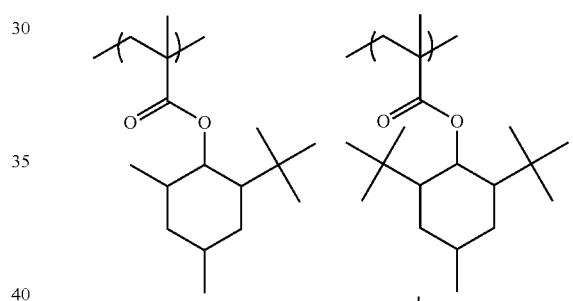
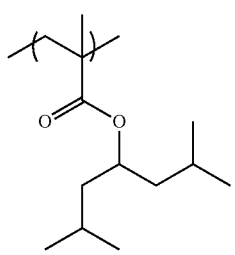
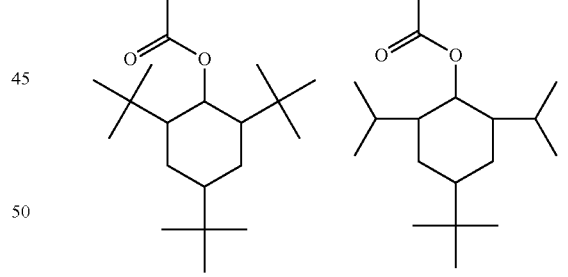
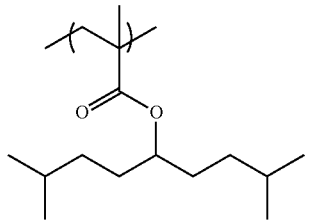
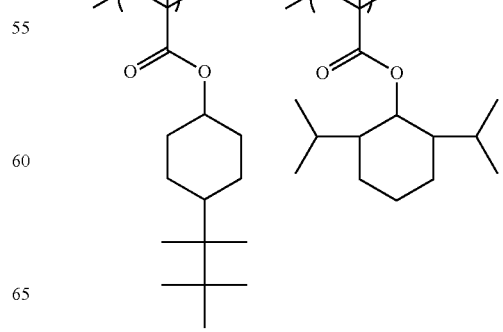
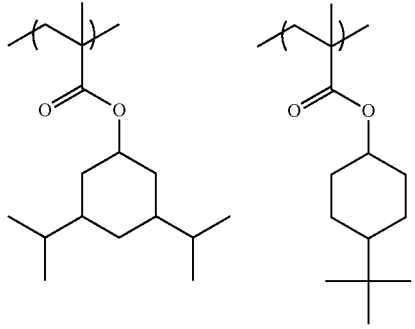

-continued

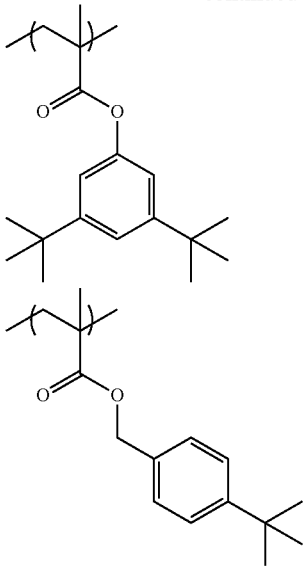

The repeating unit represented by General Formula (II) is preferably a repeating unit which is stable against an acid (acid-indecomposable), and specifically, it is preferably a repeating unit not having a group capable of decomposing by the action of an acid to generate a polar group.

Hereinafter, the repeating unit represented by General Formula (III) will be described in detail.

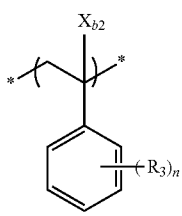
(III)

In General Formula (III), $X_{b2}$ represents a hydrogen atom, an alkyl group, a cyano group, or a halogen atom, $R_3$ represents an organic group which has one or more $CH_3$ partial structures and is stable against an acid, and n represents an integer of 1 to 5.

The alkyl group of $X_{b2}$ is preferably an alkyl group having 1 to 4 carbon atoms, and examples thereof include a methyl group, an ethyl group, a propyl group, a hydroxymethyl group, and a trifluoromethyl group, and a hydrogen atom is preferable.

$X_{b2}$ is preferably a hydrogen atom.

Since $R_3$ is an organic group stable against an acid, more specifically, $R_3$ is preferably an organic group which does not have the "acid-decomposable group" described with respect to the resin (A).

Examples of $R_3$ include an alkyl group having one or more $CH_3$ partial structures.

The number of the $CH_3$ partial structures contained in the organic group which has one or more $CH_3$ partial structures and is stable against an acid as $R_3$ is preferably 1 to 10, more preferably 1 to 8, and still more preferably 1 to 4.

n represents an integer of 1 to 5, preferably 1 to 3, and more preferably 1 or 2.

Specific preferred examples of the repeating unit represented by General Formula (III) are set forth below, but the present invention is not limited thereto.

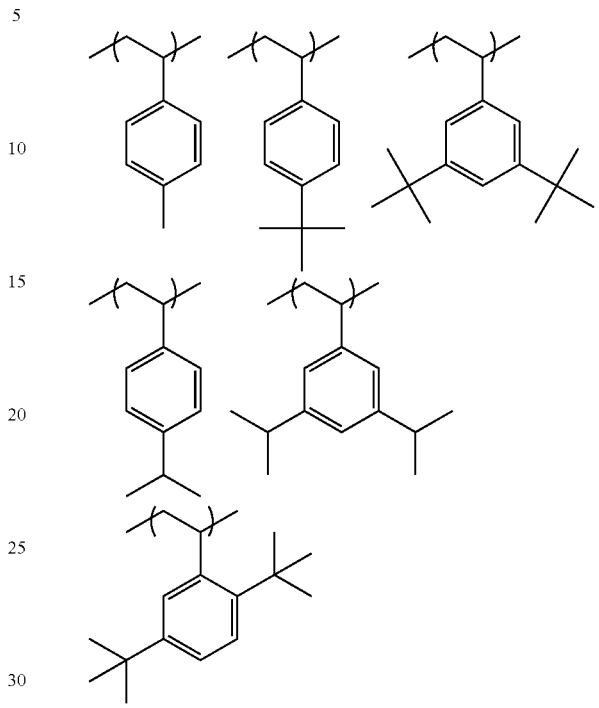

The repeating unit represented by General Formula (III) is preferably a repeating unit which is stable against an acid (acid-indecomposable), and specifically, it is a repeating unit which does not has a group capable of decomposing by the action of an acid to generate a polar group.

In the case where the hydrophobic resin (D) contains a $CH_3$ partial structure in the side chain portion thereof, and in particular, it has neither a fluorine atom nor a silicon atom, the content of at least one repeating unit (x) of the repeating unit represented by General Formula (II) and the repeating unit represented by General Formula (III) is preferably 90% by mole or more, and more preferably 95% by mole or more, with respect to all the repeating units of the hydrophobic resin (D). Further, the content is usually 100% by mole or less with respect to all the repeating units of the hydrophobic resin (D).

By incorporating at least one repeating unit (x) of the repeating unit represented by General Formula (II) and the repeating unit represented by General Formula (III) in a proportion of 90% by mole or more with respect to all the repeating units of the hydrophobic resin (D) into the hydrophobic resin (D), the surface free energy of the hydrophobic resin (D) is increased. As a result, it is difficult for the hydrophobic resin (D) to be unevenly distributed on the surface of the resist film and the static/dynamic contact angle of the resist film with respect to water can be securely increased, thereby enhancing the immersion liquid tracking properties.

In addition, in the case where the hydrophobic resin (D) contains (i) a fluorine atom and/or a silicon atom or (ii) a $CH_3$ partial structure in the side chain moiety, the hydrophobic resin may have at least one group selected from the following groups (x) to (z):

(x) an acid group,
(y) a group having a lactone structure, an acid anhydride group, or an acid imido group, and
(z) a group capable of decomposing by the action of an acid.

Examples of the acid group (x) include a phenolic hydroxyl group, a carboxylic acid group, a fluorinated alcohol group, a sulfonic acid group, a sulfonamido group, a sulfonylimido group, an (alkylsulfonyl)alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group.

Preferred examples of the acid group include a fluorinated alcohol group (preferably a hexafluoroisopropanol group), a sulfonimido group, and a bis(alkylcarbonyl)methylene group.

Examples of the repeating unit containing an acid group (x) include a repeating unit in which the acid group is directly bonded to the main chain of the resin, such as a repeating unit by an acrylic acid or a methacrylic acid, and a repeating unit in which the acid group is bonded to the main chain of the resin through a linking group, and the acid group may also be introduced into the polymer chain terminal by using a polymerization initiator or chain transfer agent containing an acid group during the polymerization. All of these cases are preferable. The repeating unit having an acid group (x) may have at least one of a fluorine atom and a silicon atom.

The content of the repeating units containing an acid group (x) is preferably 1% by mole to 50% by mole, more preferably 3% by mole to 35% by mole, and still more preferably 5% by mole to 20% by mole, with respect to all the repeating units in the hydrophobic resin (D).

Specific preferred examples of the repeating unit containing an acid group (x) are set forth below, but the present invention is not limited thereto. In the formulae, Rx represents a hydrogen atom. $CH_3$, $CF_3$, or, $CH_2OH$.

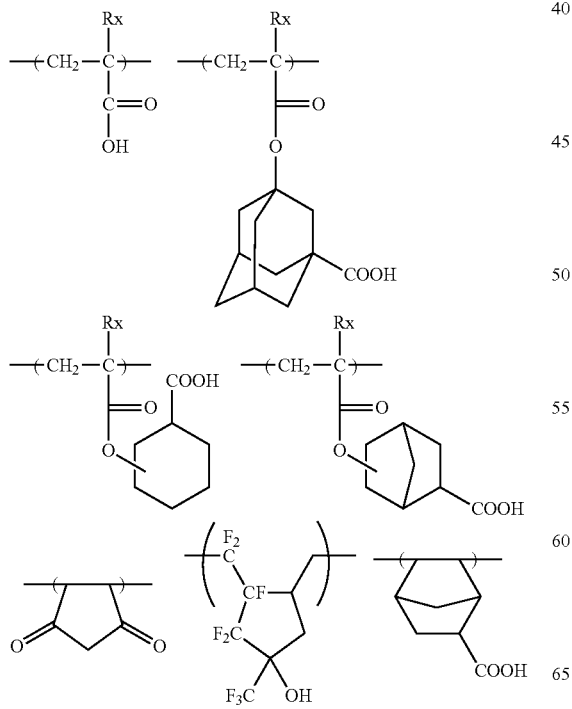
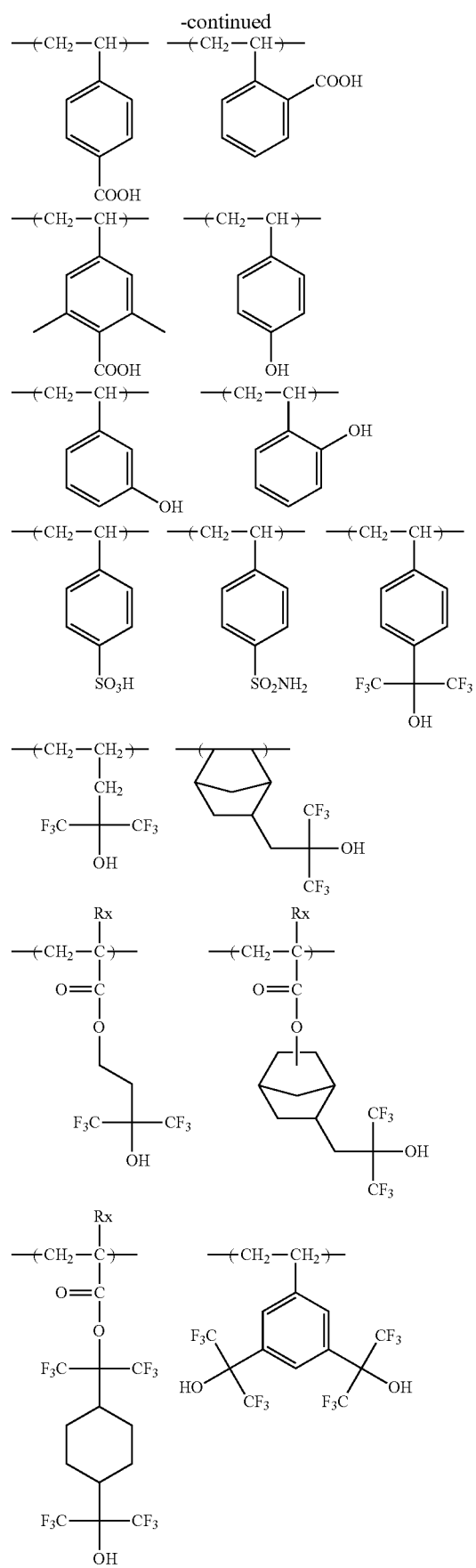

-continued

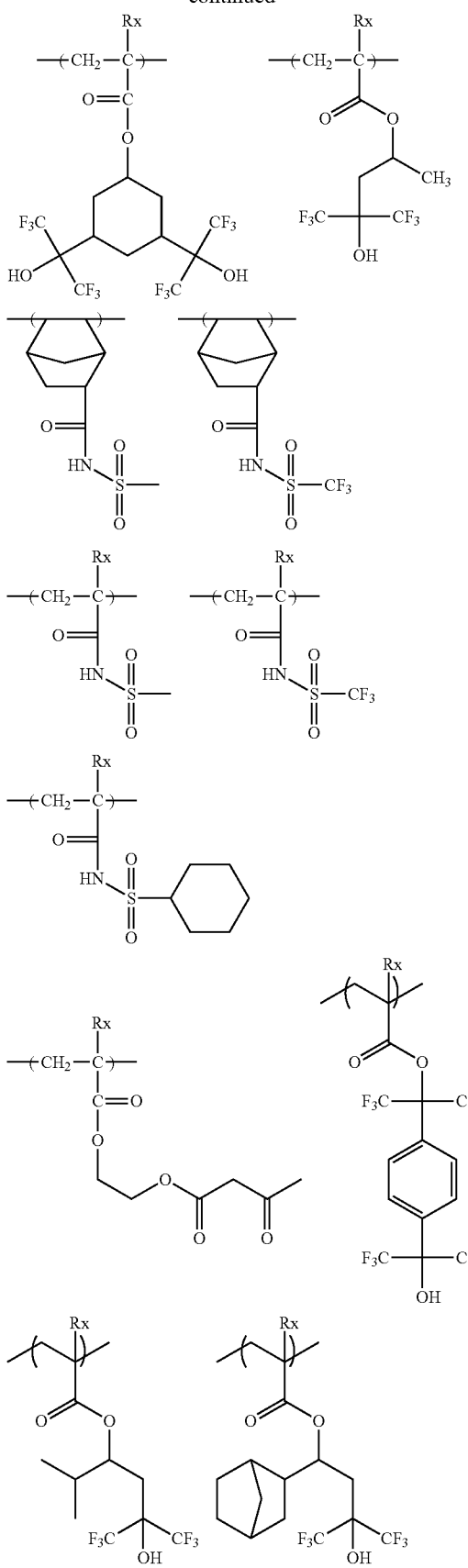

As the group having a lactone structure, the acid anhydride group, or the acid imido group (y), the group having a lactone structure is particularly preferable.

The repeating unit containing such a group is, for example, a repeating unit in which the group is directly bonded to the main chain of the resin, such as a repeating unit by an acrylic ester or a methacrylic ester. This repeating unit may be a repeating unit in which the group is bonded to the main chain of the resin through a linking group. Alternatively this repeating unit may be introduced into the terminal of the resin by using a polymerization initiator or chain transfer agent containing the group during the polymerization.

Examples of the repeating unit containing a group having a lactone structure include the same ones as the repeating unit having a lactone structure as described earlier in the section of the resin (A).

The content of the repeating units having a group having a lactone structure, an acid anhydride group, or an acid imido group is preferably 1% by mole to 100% by mole, more preferably 3% by mole to 98% by mole, and still more preferably 5% by mole to 95% by mole, with respect to all the repeating units in the hydrophobic resin (D).

With respect to the hydrophobic resin (D), examples of the repeating unit having a group (z) capable of decomposing by the action of an acid include the same ones as the repeating units having an acid-decomposable group, as mentioned with respect to the resin (A). The repeating unit having a group (z) capable of decomposing by the action of an acid may have at least one of a fluorine atom and a silicon atom. With respect to the hydrophobic resin (D), the content of the repeating units having a group (z) capable of decomposing by the action of an acid is preferably 1% by mole to 80% by mole, more preferably 10% by mole to 80/o by mole, and still more preferably 20% by mole to 60% by mole, with respect to all the repeating units in the hydrophobic resin (D).

The hydrophobic resin (D) may further have a repeating unit represented by the following General Formula (III).

(III)

In General Formula (III), $R_{c31}$ represents a hydrogen atom, an alkyl group (which may be substituted with a fluorine atom or the like), a cyano group, or a —$CH_2$—O—$R_{ac2}$ group, in which $Rac_2$ represents a hydrogen atom, an alkyl group, or an acyl group, and $R_{c31}$ is preferably a hydrogen atom, a methyl group, a hydroxymethyl group, or a trifluoromethyl group, and particularly preferably a hydrogen atom or a methyl group, $R_{c32}$ represents a group having an alkyl group, a cycloalkyl group, an alkenyl group, a cycloalkenyl group, or an aryl group, each of which may be substituted with a group containing a fluorine atom or a silicon atom, and $L_{c3}$ represents a single bond or a divalent linking group.

In General Formula (III), the alkyl group of $R_{c32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The aryl group is preferably an aryl group having 6 to 20 carbon atoms, and more preferably a phenyl group or a naphthyl group, and these groups may have a substituent.

$R_{c32}$ is preferably an unsubstituted alkyl group or an alkyl group substituted with a fluorine atom.

The divalent linking group of $L_{c3}$ is preferably an alkylene group (preferably having 1 to 5 carbon atoms), an ether bond, a phenylene group, or an ester bond (a group represented by —COO—).

The content of the repeating units represented by formula (III) is preferably 1% by mole to 100% by mole, more preferably 10% by mole to 90% by mole, and still more preferably 30% by mole to 70% by mole, with respect to all the repeating units in the hydrophobic resin (D).

It is also preferable that the hydrophobic resin (D) further has a repeating unit represented by the following General Formula (CII-AB).

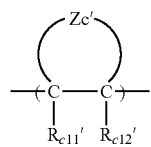

(CII-AB)

In Formula (CII-AB), $R_{c11}'$ and $R_{c12}'$ each independently represent a hydrogen atom, a cyano group, a halogen atom, or an alkyl group, and $Z_c'$ represents an atomic group for forming an alicyclic structure containing two carbon atoms (C—C) to which $Z_c'$ is bonded.

The content of the repeating units represented by General Formula (CII-AB) is preferably 1% by mole to 100% by mole, more preferably 10% by mole to 90% by mole, and still more preferably 30% by mole to 70% by mole, with respect to all the repeating units in the hydrophobic resin (D).

Specific examples of the repeating units represented by General Formulae (III) and (CII-AB) are set forth below, but the present invention is not limited thereto. In the formulae, Ra represents H, $CH_3$, $CH_2OH$, $CF_3$, or CN.

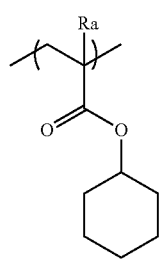
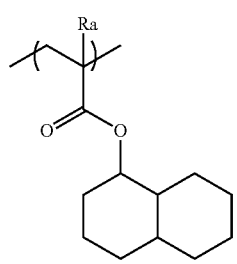

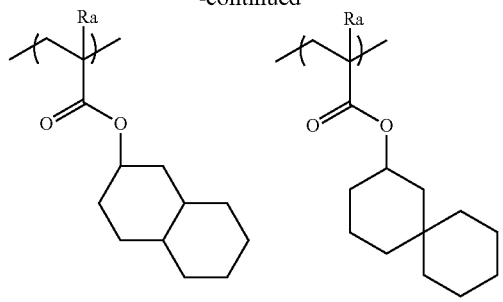

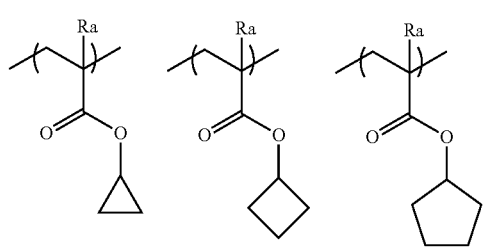

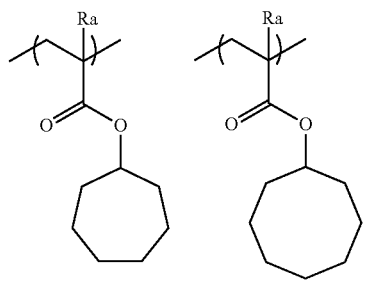

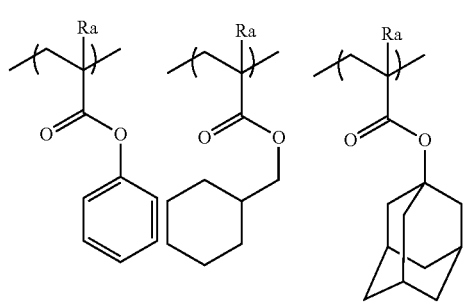

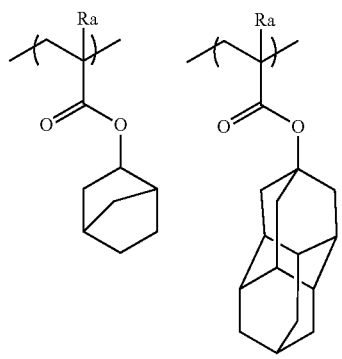

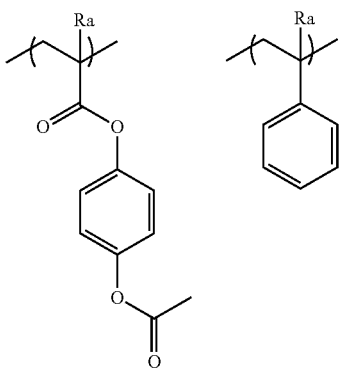

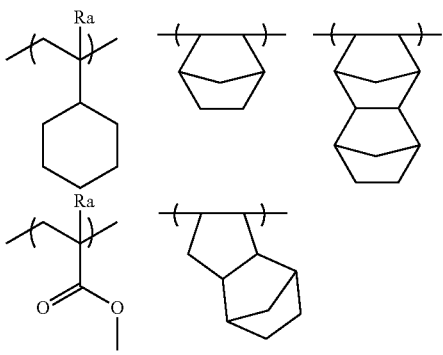

In the case where the hydrophobic resin (D) has a fluorine atom, the content of the fluorine atom is preferably 5% by mass to 80% by mass, and more preferably 10% by mass to 80% by mass, with respect to the weight-average molecular weight of the hydrophobic resin (D). Further, the proportion of the repeating units containing a fluorine atom is preferably 10% by mole to 100% by mole, and more preferably 30% by mole to 100% by mole, with respect to all the repeating units included in the hydrophobic resin (D).

In the case where the hydrophobic resin (D) has a silicon atom, the content of the silicon atom is preferably 2% by mass to 50% by mass, and more preferably 2% by mass to 30% by mass, with respect to the weight-average molecular weight of the hydrophobic resin (D). Further, the proportion of the repeating unit containing a silicon atom is preferably 10% by mole to 100% by mole, and more preferably 20% by mole to 100% by mole, with respect to all the repeating units included in the hydrophobic resin (D).

On the other hand, in particular, in the case where the hydrophobic resin (D) contains a $CH_3$ partial structure in the side chain portion thereof, it is also preferable that the hydrophobic resin (D) has a form having substantially neither a fluorine atom nor a silicon atom. In this case, specifically the content of the repeating units containing a fluorine atom or a silicon atom is preferably 5% by mole or less, more preferably 3% by mole or less, still more preferably 1% by mole or less, and ideally 0% by mole, that is, containing neither a fluorine atom nor a silicon atom, with respect to all the repeating units in the hydrophobic resin (D). In addition, it is preferable that the hydrophobic resin (D) is composed substantially of a repeating unit constituted with only an atom selected from the group consisting of a carbon atom, an oxygen atom a hydrogen atom, a nitrogen atom, and a sulfur atom. More specifically the proportion of the repeating unit constituted with only an atom selected from the group consisting of a carbon atom, an oxygen atom, a hydrogen atom, a nitrogen atom, and a sulfur atom is preferably 95% by mole or more, more preferably 97% by mole or more, still more preferably 99% by mole or more, and ideally 100% by mole, of all the repeating units in the hydrophobic resin (D).

The weight-average molecular weight of the hydrophobic resin (D) in terms of standard polystyrene is preferably 1,000 to 100,000, more preferably 1,000 to 50,000, and still more preferably 2,000 to 15,000.

Furthermore, the hydrophobic resins (D) may be used alone or in combination of plural (two or more) kinds thereof.

The content of the hydrophobic resins (D) in the composition is preferably 0.01% by mass to 10% by mass, more preferably 0.05% by mass to 8% by mass, and still more preferably 0.1% by mass to 7% by mass, with respect to the total solid content of the composition of the present invention.

In the hydrophobic resin (D), it is certain that the content of impurities such as metal is small, but the content of residual monomers or oligomer components is also preferably 0.01% by mass to 5% by mass, more preferably 0.01% by mass to 3% by mass, and still more preferably 0.05% by mass to 1% by mass. Within these ranges, a composition free from in-liquid extraneous materials and a change in sensitivity or the like with aging can be obtained. Further, from the viewpoints of a resolution, a resist profile, the side wall of a resist pattern, a roughness, and the like, the molecular weight distribution (Mw/Mn, also referred to as a dispersity) is preferably in the range of 1 to 5, more preferably in the range of 1 to 3, and still more preferably in the range of 1 to 2.

As the hydrophobic resin (D), various commercial products may be used, or the resin may be synthesized by an ordinary method (for example, radical polymerization). Examples of the general synthesis method include a batch polymerization method of dissolving monomer species and an initiator in a solvent and heating the solution, thereby carrying out the polymerization, and a dropping polymerization method of adding dropwise a solution containing monomer species and an initiator to a heated solvent for 1 hour to 10 hours, with the dropping polymerization method being preferable.

The reaction solvent, the polymerization initiator, the reaction conditions (a temperature, a concentration, and the like) and the method for purification after reaction are the same as ones described for the resin (A), and in the synthesis of the hydrophobic resin (D), the concentration of the reactant is preferably 30% by mass to 50% by mass.

Specific examples of the hydrophobic resin (D) are set forth below. Further, the molar ratio of the repeating units (corresponding to the respective repeating units in order from the left side), the weight-average molecular weight, and the dispersity with respect to the respective resins are shown in Tables below.

(B-1)
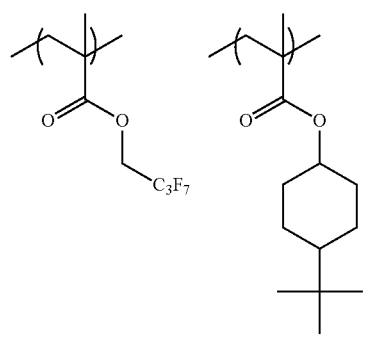
(B-2)
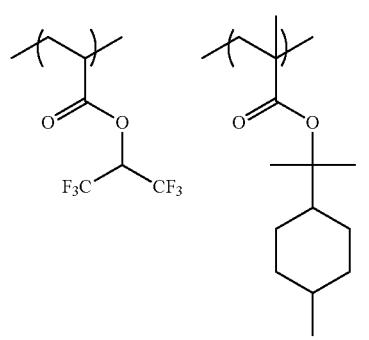
(B-3)
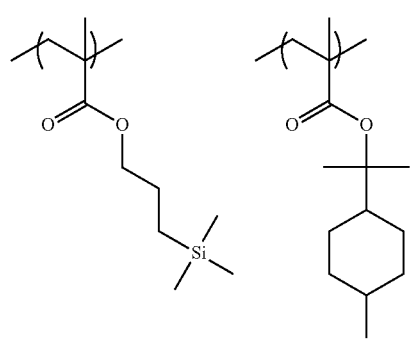
(B-4)
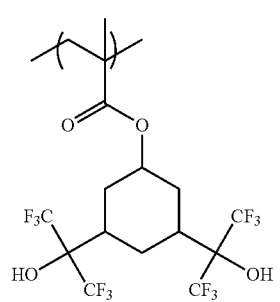
(B-5)
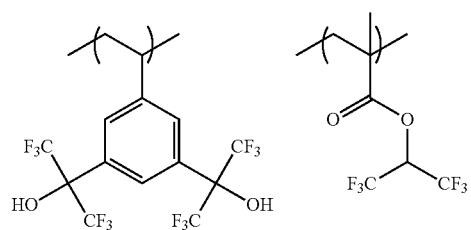
-continued
(B-6)
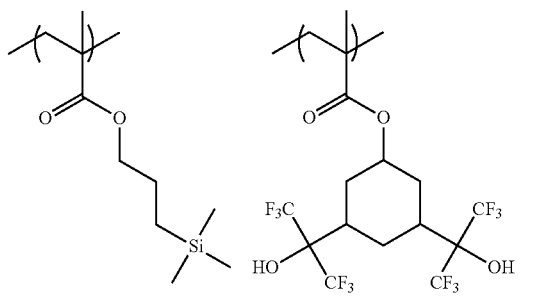
(B-7)
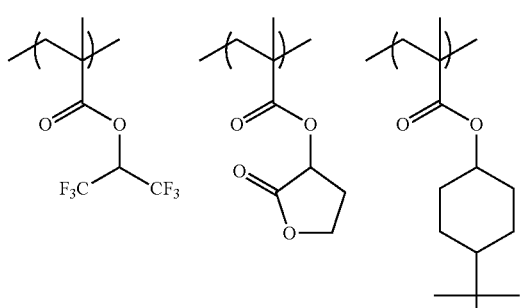
(B-8)
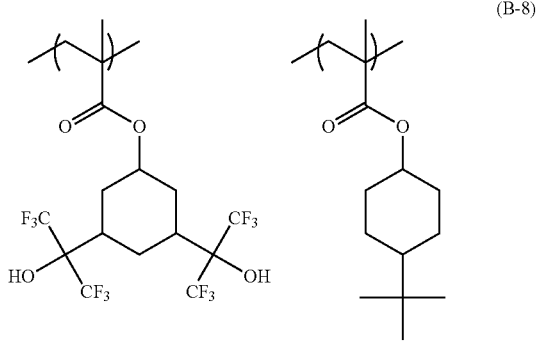
(B-9)
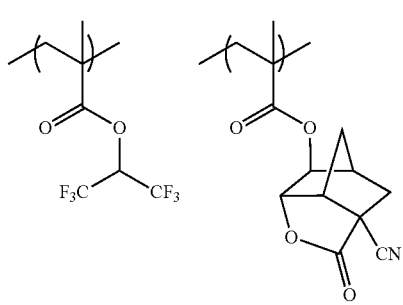
(B-10)
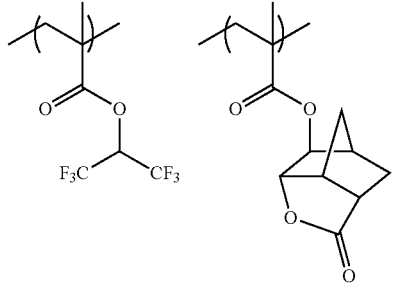

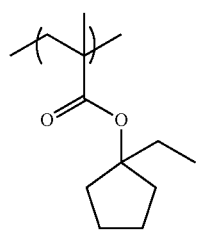
(B-11)
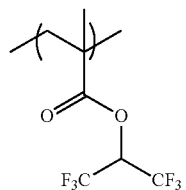 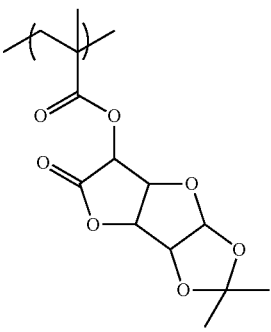
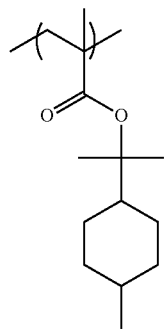
(B-12)
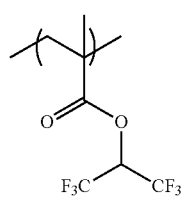 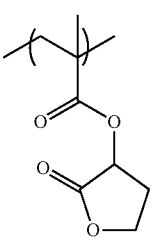
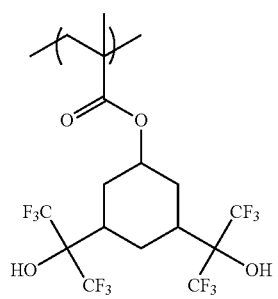
(B-13)
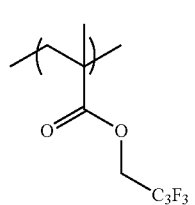
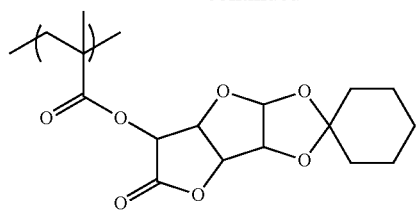
(B-14)
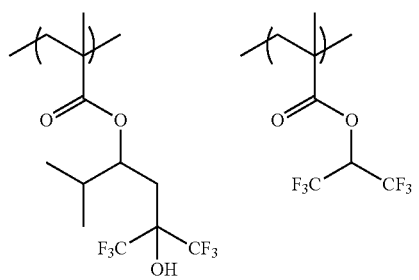
(B-15)
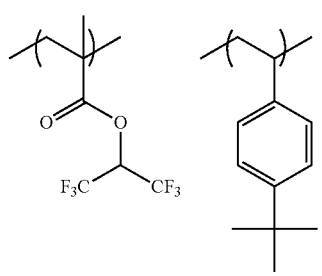
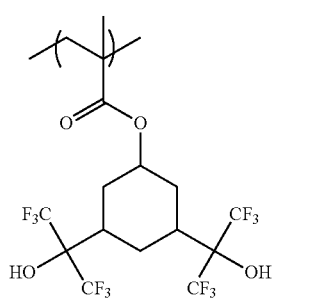
(B-16)
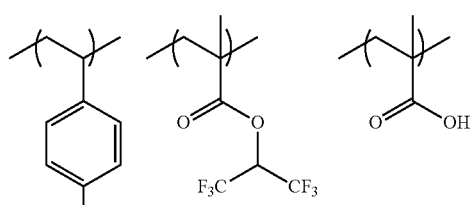
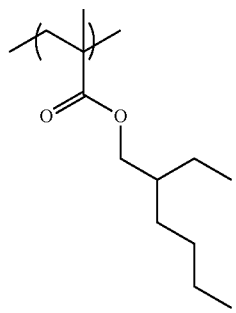

(B-17)
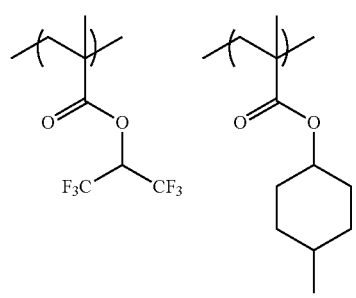
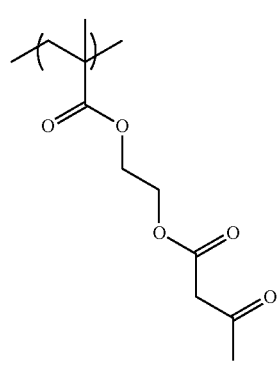
(B-18)
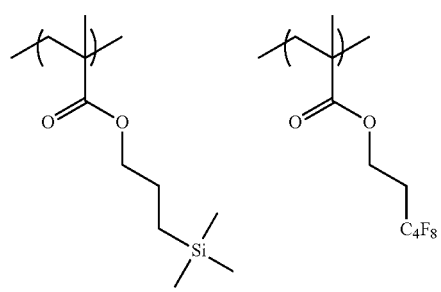
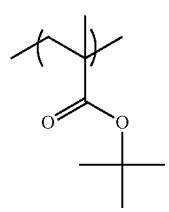
(B-19)
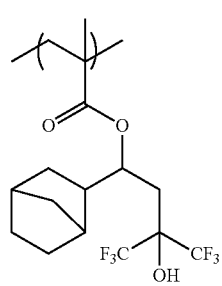
(B-20)
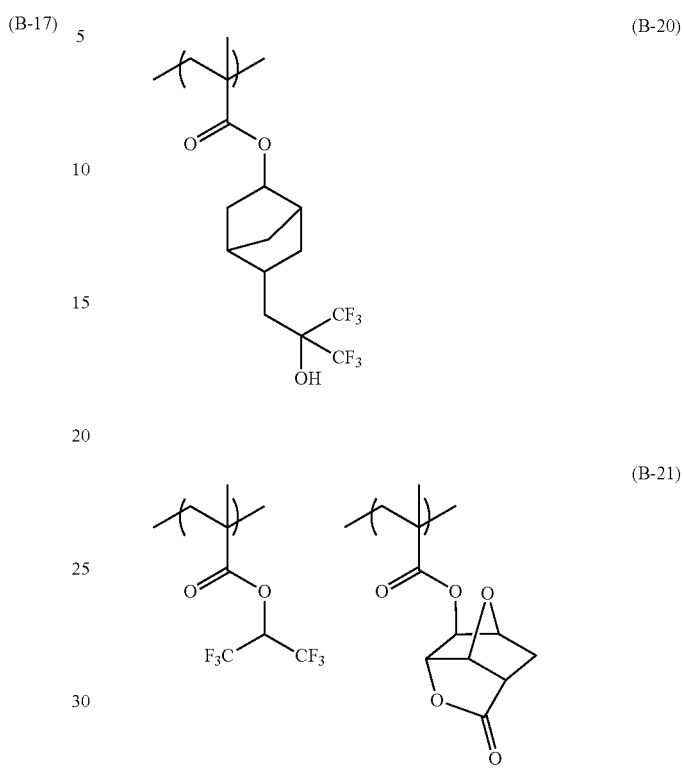
(B-21)
(B-22)
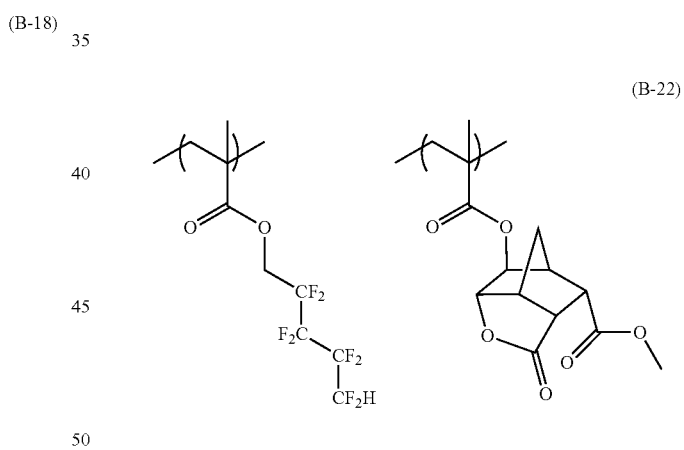
(B-23)
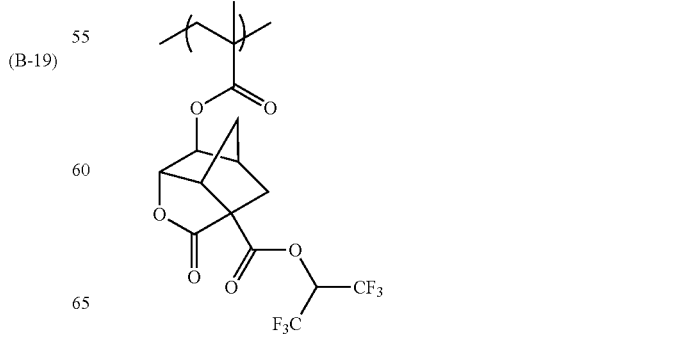

(B-24) 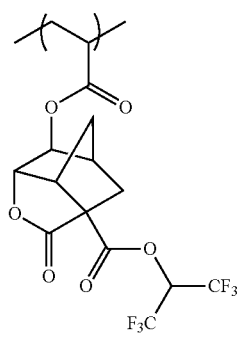
(B-25) 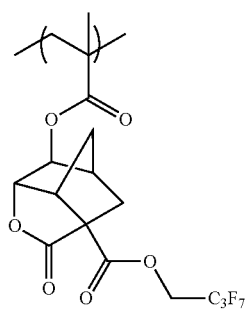
(B-26) 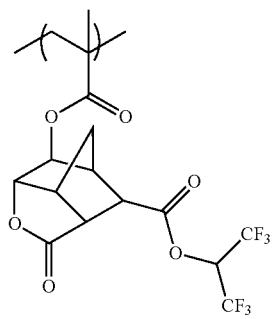
(B-27) 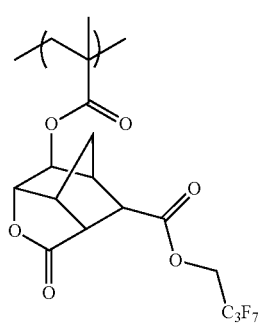
(B-28) 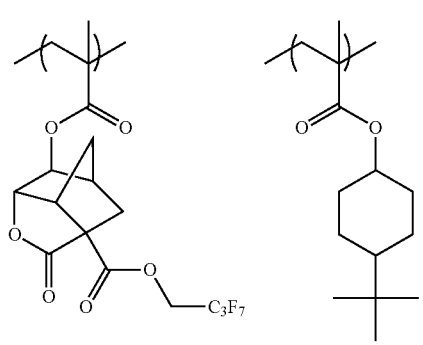
(B-29) 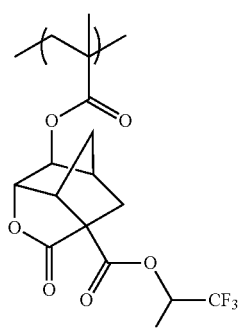 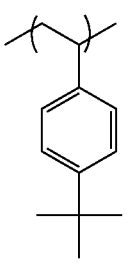
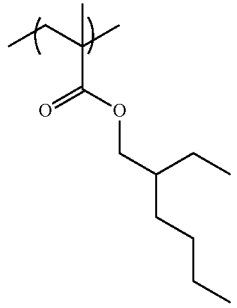
(B-30) 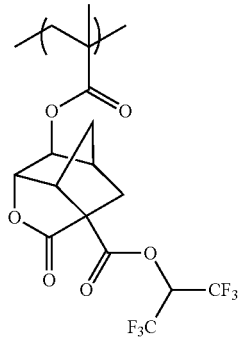 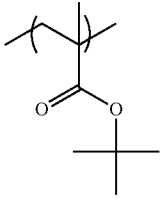
(B-31) 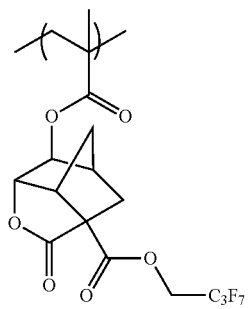 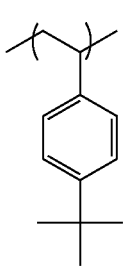
(B-32) 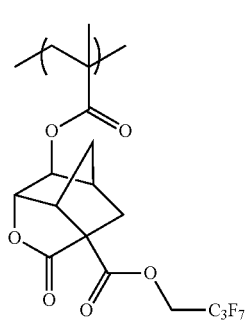 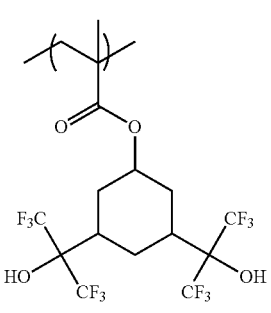

(B-33)
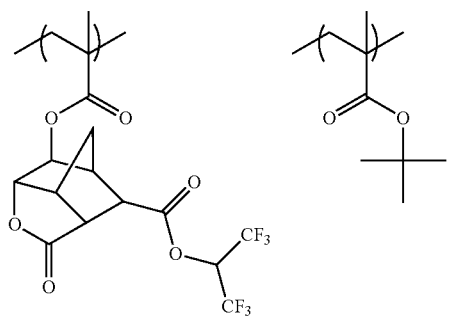
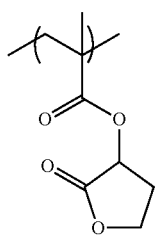
(B-34)
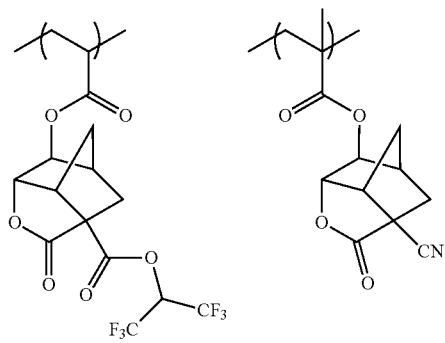
(B-35)
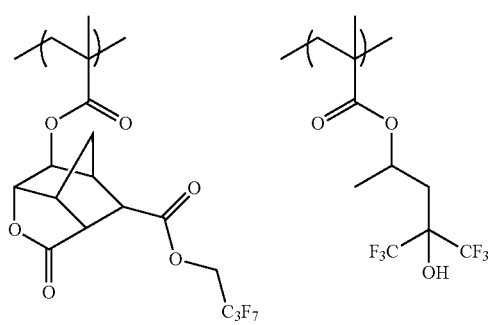
(B-36)
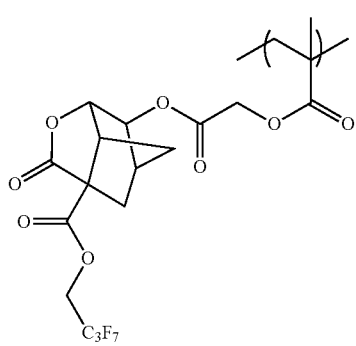
(B-37)
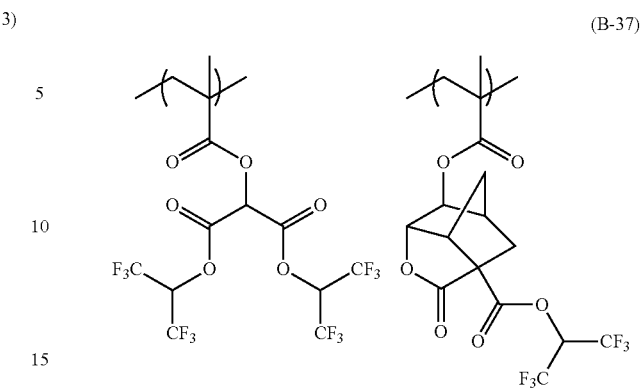
(B-38)
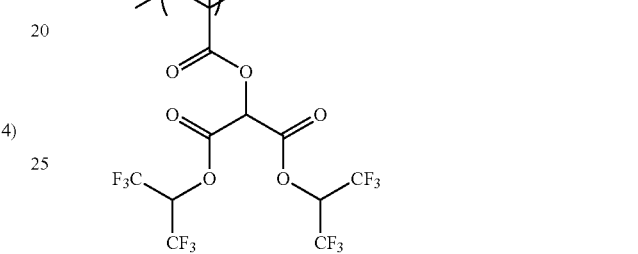
(B-39)
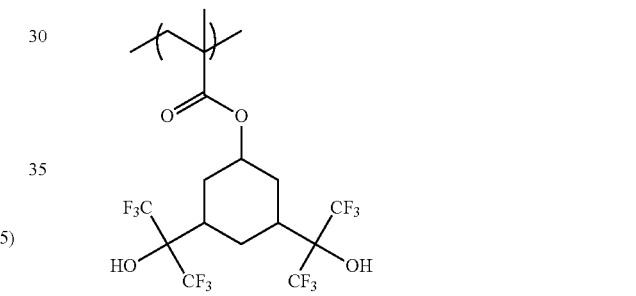
(B-40)
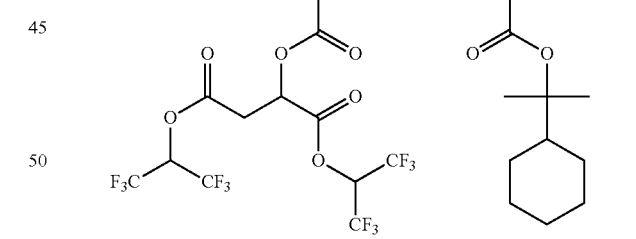

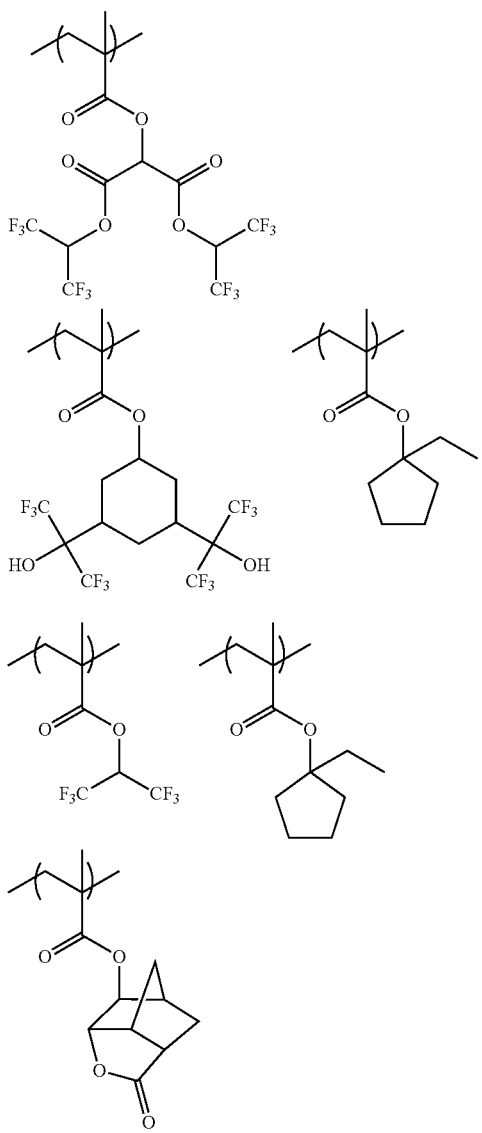
TABLE 1
| Resin | Compositional ratio | Molecular weight | Dispersity |
|---|---|---|---|
| B-1 | 50/50 | 4800 | 1.4 |
| B-2 | 50/50 | 5100 | 2.1 |
| B-3 | 40/60 | 6600 | 1.8 |
| B-4 | 100 | 5500 | 1.7 |
| B-5 | 45/55 | 4400 | 1.6 |
| B-6 | 50/50 | 6000 | 1.5 |
| B-7 | 40/10/50 | 6200 | 1.6 |
| B-8 | 50/50 | 5800 | 1.5 |
| B-9 | 80/20 | 4800 | 1.8 |
| B-10 | 50/20/30 | 4900 | 1.9 |
| B-11 | 50/10/40 | 5300 | 2.0 |
| B-12 | 40/20/40 | 5500 | 1.4 |
| B-13 | 60/40 | 5900 | 1.3 |
| B-14 | 50/50 | 6200 | 1.5 |
| B-15 | 40/15/45 | 6100 | 1.8 |
| B-16 | 57/39/2/2 | 6000 | 1.6 |
| B-17 | 45/20/35 | 6600 | 1.6 |
| B-18 | 40/30/30 | 5500 | 1.7 |
| B-19 | 100 | 4900 | 1.6 |
| B-20 | 100 | 4400 | 1.8 |
| B-21 | 60/40 | 4500 | 1.9 |
| B-22 | 55/45 | 6200 | 1.3 |
| B-23 | 100 | 5700 | 1.5 |
| B-24 | 100 | 5800 | 2.0 |
| B-25 | 100 | 6000 | 1.5 |
| B-26 | 100 | 6000 | 1.6 |
| B-27 | 100 | 6200 | 1.8 |
| B-28 | 50/50 | 6500 | 1.7 |
| B-29 | 90/8/2 | 6500 | 1.5 |
| B-30 | 90/10 | 6900 | 1.7 |
| B-31 | 95/5 | 4900 | 1.8 |
| B-32 | 80/20 | 5200 | 1.9 |
| B-33 | 75/15/10 | 5900 | 1.6 |
| B-34 | 75/25 | 6000 | 1.5 |
| B-35 | 80/20 | 5700 | 1.4 |
| B-36 | 100 | 5300 | 1.7 |
| B-37 | 20/80 | 5400 | 1.6 |
| B-38 | 50/50 | 4800 | 1.6 |
| B-39 | 70/30 | 4500 | 1.6 |
| B-40 | 100 | 5500 | 1.5 |
| B-41 | 40/40/20 | 5800 | 1.5 |
| B-42 | 35/35/30 | 6200 | 1.4 |
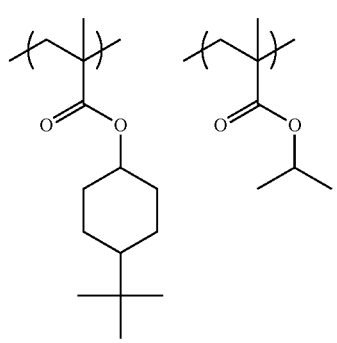
(C-1)
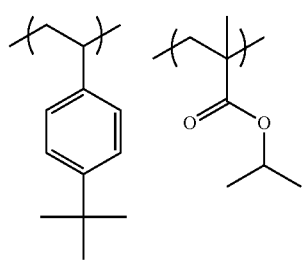
(C-2)
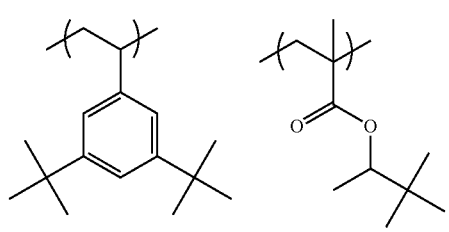
(C-3)

(C-4) 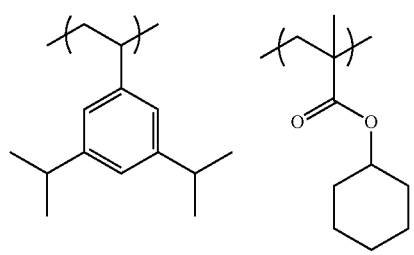
(C-5) 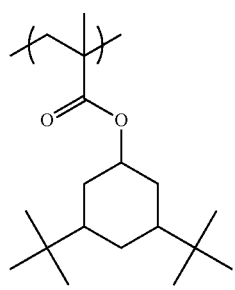
(C-6) 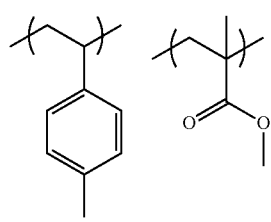
(C-7) 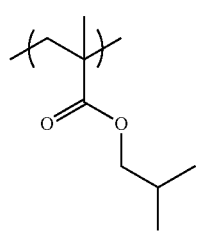
(C-8) 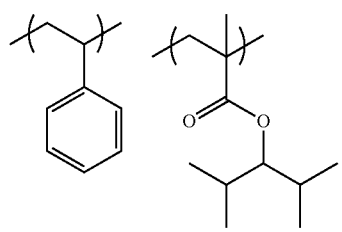
(C-9) 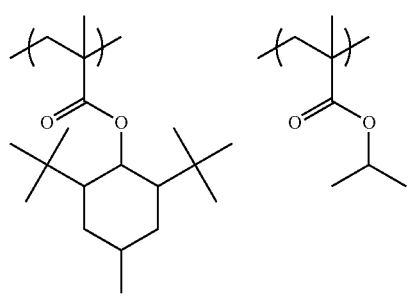
(C-10) 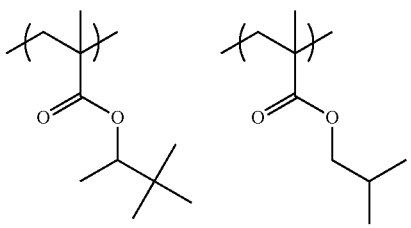
(C-11) 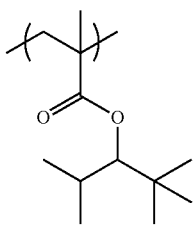
(C-12) 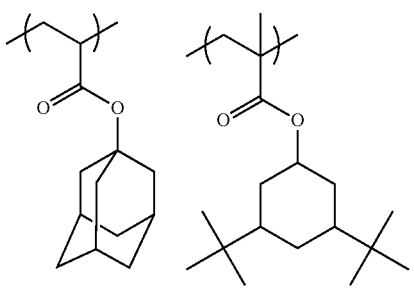
(C-13) 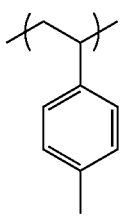
(C-14) 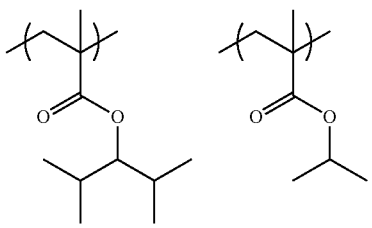
(C-15) 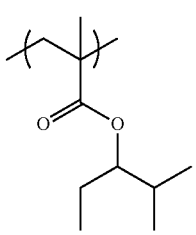

(C-16)
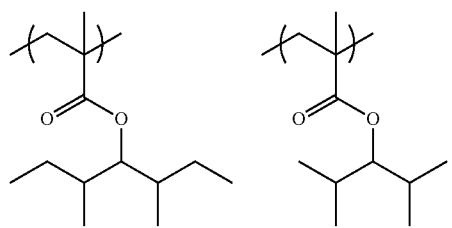
(C-17)
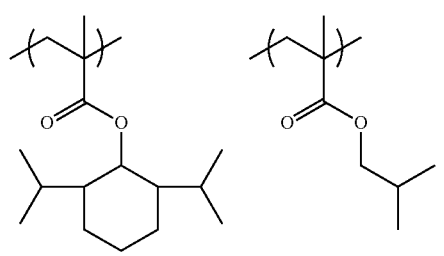
(C-18)
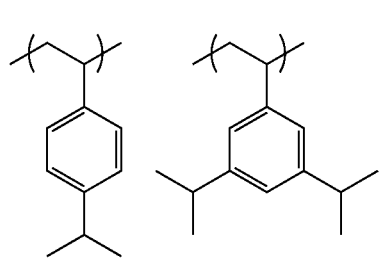
(C-19)
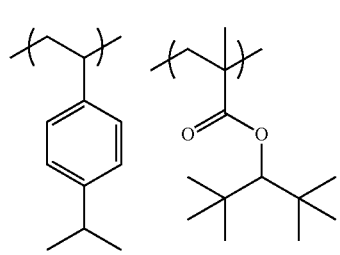
(C-20)
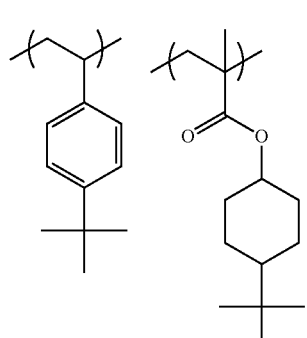
(C-21)
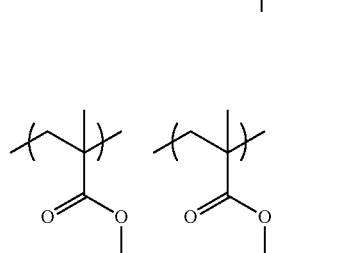
(C-22)
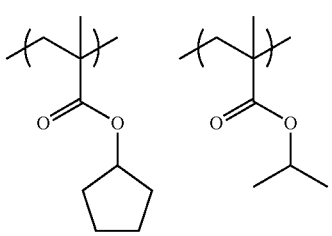
(C-23)
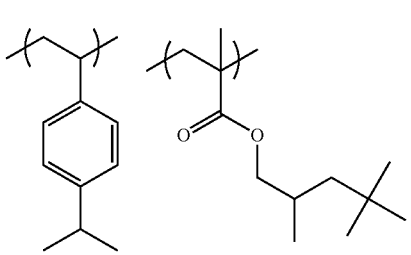
(C-24)
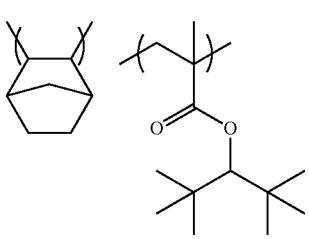
(C-25)
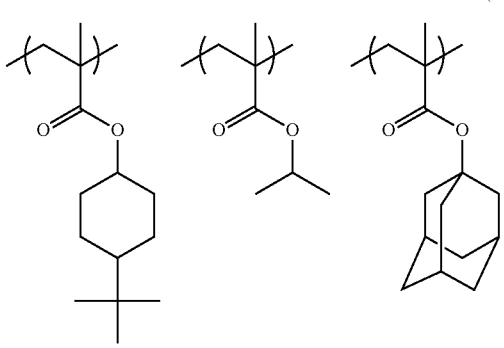
(C-26)
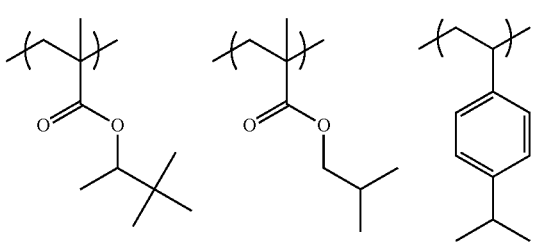

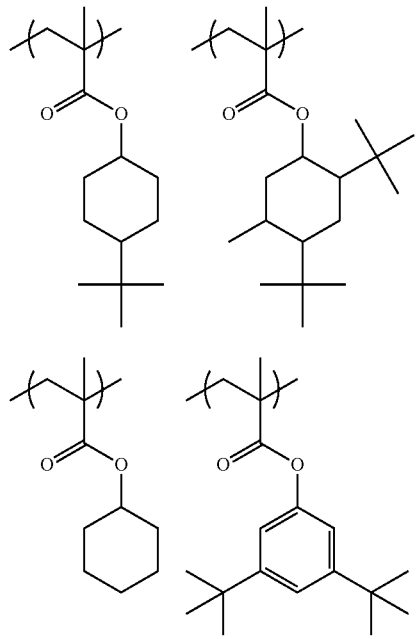

(C-27)

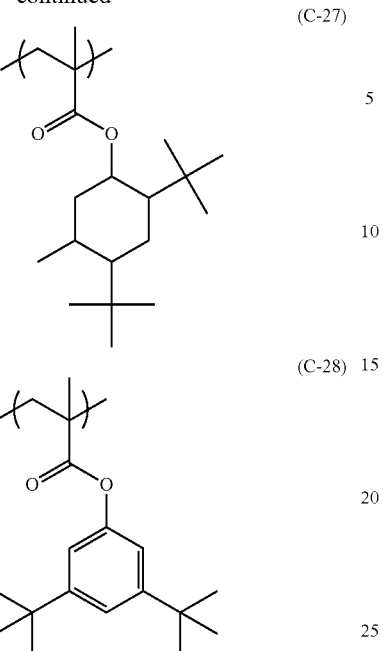

(C-28)

TABLE 2

| Resin | Composition | Mw | Mw/Mn |
|---|---|---|---|
| C-1 | 50/50 | 9600 | 1.74 |
| C-2 | 60/40 | 34500 | 1.43 |
| C-3 | 30/70 | 19300 | 1.69 |
| C-4 | 90/10 | 26400 | 1.41 |
| C-5 | 100 | 27600 | 1.87 |
| C-6 | 80/20 | 4400 | 1.96 |
| C-7 | 100 | 16300 | 1.83 |
| C-8 | 5/95 | 24500 | 1.79 |
| C-9 | 20/80 | 15400 | 1.68 |
| C-10 | 50/50 | 23800 | 1.46 |
| C-11 | 100 | 22400 | 1.57 |
| C-12 | 10/90 | 21600 | 1.52 |
| C-13 | 100 | 28400 | 1.58 |
| C-14 | 50/50 | 16700 | 1.82 |
| C-15 | 100 | 23400 | 1.73 |
| C-16 | 60/40 | 18600 | 1.44 |
| C-17 | 80/20 | 12300 | 1.78 |
| C-18 | 40/60 | 18400 | 1.58 |
| C-19 | 70/30 | 12400 | 1.49 |
| C-20 | 50/50 | 23500 | 1.94 |
| C-21 | 10/90 | 7600 | 1.75 |
| C-22 | 5/95 | 14100 | 1.39 |
| C-23 | 50/50 | 17900 | 1.61 |
| C-24 | 10/90 | 24600 | 1.72 |
| C-25 | 50/40/10 | 23500 | 1.65 |
| C-26 | 60/30/10 | 13100 | 1.51 |
| C-27 | 50/50 | 21200 | 1.84 |
| C-28 | 10/90 | 19500 | 1.66 |

[4] Acid Diffusion Control Agent

The composition of the present invention preferably contains an acid diffusion control agent. The acid diffusion control agent acts as a quencher that inhibits a reaction of the acid-decomposable resin in the unexposed area by excessive generated acids by trapping the acids generated from an acid generator or the like upon exposure. As the acid diffusion control agent, a basic compound, a low-molecular compound which has a nitrogen atom and a group capable of leaving by the action of an acid, a basic compound whose basicity is reduced or lost upon irradiation with actinic ray or radiation, or an onium salt which becomes a relatively weak acid with respect to the acid generated from the compound (B) upon irradiation with actinic ray or radiation can be used.

Preferred examples of the basic compound include compounds having structures represented by the following Formulae (A) to (E).

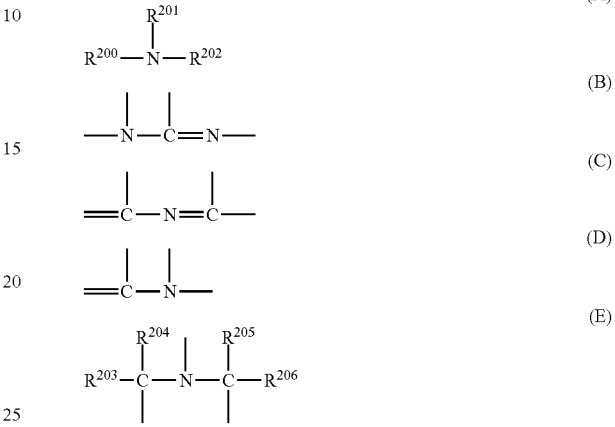

In General Formulae (A) and (E), $R^{200}$, $R^{201}$, and $R^{202}$, which may be the same as or different from each other, represent a hydrogen atom, an alkyl group (preferably having 1 to 20 carbon atoms), a cycloalkyl group (preferably having 3 to 20 carbon atoms), or an aryl group (having 6 to 20 carbon atoms), and $R^{201}$ and $R^{202}$ may be bonded to each other to form a ring.

$R^{203}$, $R^{204}$, $R^{205}$, and $R^{206}$ which may be the same as or different from each other, each represent an alkyl group having 1 to 20 carbon atoms.

With regard to the alkyl group, the alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

It is more preferable that the alkyl groups in General Formulae (A) and (E) are unsubstituted.

Preferred examples of the compound include guanidine, aminopyrrolidine, pyrazole, pyrazoline, piperazine, aminomorpholine, aminoalkylmorpholine, and piperidine. More preferred examples of the compound include a compound having an imidazole structure, a diazabicyclo structure, an onium hydroxide structure, an onium carboxylate structure, a trialkylamine structure, an aniline structure, or a pyridine structure; an alkylamine derivative having a hydroxyl group and/or an ether bond; and an aniline derivative having a hydroxyl group and/or an ether bond.

Specific preferred examples of the compound include the compounds exemplified in <0379> of US2012/0219913A1.

Preferred examples of the basic compound include an amine compound having a phenoxy group, an ammonium salt compound having a phenoxy group, an amine compound containing a sulfonic ester group, and an ammonium salt compound having a sulfonic ester group.

As the amine compound, a primary, secondary, or tertiary amine compound can be used, and an amine compound in which at least one alkyl group is bonded to a nitrogen atom is preferable. The amine compound is more preferably a tertiary amine compound. Any amine compound is available as long as at least one alkyl group (preferably having 1 to 20 carbon atoms) is bonded to a nitrogen atom, and a cycloalkyl group (preferably having 3 to 20 carbon atoms) or an aryl group (preferably having 6 to 12 carbon atoms) may be bonded to the nitrogen atom, in addition to the alkyl group. The amine compound preferably has an oxygen atom in the alkyl chain to form an oxyalkylene group. The number of the oxyalkylene groups within the molecule is 1 or more, preferably 3 to 9, and more preferably 4 to 6. Among the oxyalkylene groups, an oxyethylene group (—CH$_2$CH$_2$O—) or an oxypropylene group (—CH(CH$_3$)CH$_2$O— or —CH$_2$CH$_2$CH$_2$O—) is preferable, and an oxyethylene group is more preferable.

As the ammonium salt compound, a primary, secondary, tertiary, or quaternary ammonium salt compound can be used, and an ammonium salt compound in which at least one alkyl group is bonded to a nitrogen atom is preferable. Any ammonium salt compound is available as long as at least one alkyl group (preferably having 1 to 20 carbon atoms) is bonded to a nitrogen atom, and a cycloalkyl group (preferably having 3 to 20 carbon atoms) or an aryl group (preferably having 6 to 12 carbon atoms) may be bonded to the nitrogen atom, in addition to the alkyl group. The ammonium salt compound preferably has an oxygen atom in the alkyl chain to form an oxyalkylene group. The number of the oxyalkylene groups within the molecule is 1 or more, preferably 3 to 9, and more preferably 4 to 6. Among the oxyalkylene groups, an oxyethylene group (—CH$_2$CH$_2$O—) or an oxypropylene group (—CH(CH$_3$)CH$_2$O— or —CH$_2$CH$_2$CH$_2$O—) is preferable, and an oxyethylene group is more preferable.

Examples of the anion of the ammonium salt compound include a halogen atom, sulfonate, borate, and phosphate, and among these, the halogen atom and sulfonate are preferable.

Incidentally, the following compounds are also preferable as the basic compound.

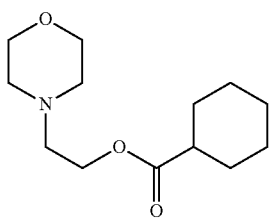
(MO-1)

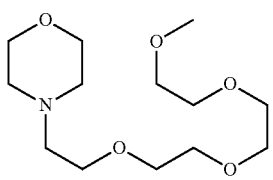
(MO-2)

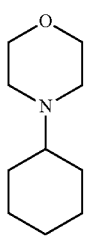
(MO-3)

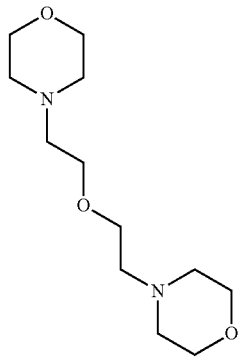
(MO-4)

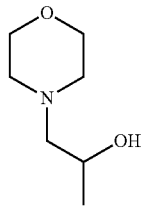
(MO-5)

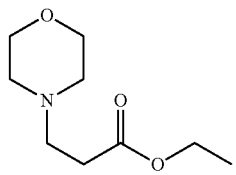
(MO-6)

In addition to the compounds as described above, as the basic compound, the compounds described in <0180> to <0225> of JP2011-22560A, <0218> and <0219> of JP2012-137735A, and <0416> to <0438> of WO2011/158687A1, and the like can also be used.

These basic compounds may be used alone or in combination of two or more kinds thereof.

The composition of the present invention may or may not contain the basic compound, and in the case where it contains the basic compound, the content of the basic compound is usually 0.001% by mass to 10% by mass, and preferably 0.01% by mass to 5% by mass, with respect to the solid content of the composition.

The ratio between the acid generator (including the acid generator (A')) and the basic compound used in the composition is preferably acid generator/basic compound (molar ratio)=2.5 to 300. That is, the molar ratio is preferably 2.5 or more in view of sensitivity and resolving power, and is preferably 300 or less in view of suppressing the reduction in resolving power due to thickening of the resist pattern with aging after exposure until the heat treatment. The acid generator/basic compound (molar ratio) is more preferably 5.0 to 200, and still more preferably 7.0 to 150.

The low-molecular compound (hereinafter referred to as a "compound (C)") which has a nitrogen atom and a group capable of leaving by the action of an acid is preferably an amine derivative having a group capable of leaving by the action of an acid on a nitrogen atom.

As the group capable of leaving by the action of an acid, an acetal group, a carbonate group, a carbamate group, a tertiary ester group, a tertiary hydroxyl group, or a hemiaminal ether group are preferable, and a carbamate group or a hemiaminal ether group is particularly preferable.

The molecular weight of the compound (C) is preferably 100 to 1,000, more preferably 100 to 700, and particularly preferably 100 to 500.

The compound (C) may contain a carbamate group having a protecting group on a nitrogen atom. The protecting group constituting the carbamate group can be represented by the following General Formula (d-1).

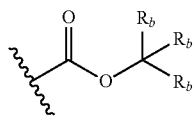

(d-1)

In General Formula (d-1), $R_b$'s each independently represent a hydrogen atom, an alkyl group (preferably having 1 to 10 carbon atoms), a cycloalkyl group (preferably having 3 to 30 carbon atoms), an aryl group (preferably having 3 to 30 carbon atoms), an aralkyl group (preferably having 1 to 10 carbon atoms), or an alkoxyalkyl group (preferably having 1 to 10 carbon atoms). $R_b$'s may be bonded to each other to form a ring.

The alkyl group, the cycloalkyl group, the aryl group, or the aralkyl group represented by $R_b$ may be substituted with a functional group such as a hydroxyl group, a cyano group, an amino group, a pyrrolidino group, a piperidino group, a morpholino group, and an oxo group, an alkoxy group, or a halogen atom. This shall apply to the alkoxyalkyl group represented by $R_b$.

$R_b$ is preferably a linear or branched alkyl group, a cycloalkyl group, or an aryl group, and more preferably a linear or branched alkyl group, or a cycloalkyl group.

Examples of the ring formed by the mutual linking of two $R_b$'s include an alicyclic hydrocarbon group, an aromatic hydrocarbon group, a heterocyclic hydrocarbon group, and derivatives thereof.

Examples of the specific structure of the group represented by General Formula (d-1) include, but are not limited to, structures disclosed in paragraph <0466> of US2012/0135348A1.

It is particularly preferable that the compound (C) has a structure of the following General Formula (6).

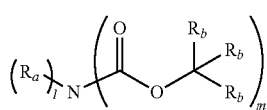

(6)

In General Formula (6), Ra represents a hydrogen atom, an alkyl group, a cycloalkyl group, an aryl group, or an aralkyl group. When l is 2, two $R_a$'s may be the same as or different from each other. Two $R_a$'s may be linked to each other to form a heterocycle together with the nitrogen atom in the formula. The heterocycle may contain a hetero atom other than the nitrogen atom in the formula.

$R_b$ has the same meaning as $R_b$ in General Formula (d-1), and preferred examples are also the same.

l represents an integer of 0 to 2, and m represents an integer of 1 to 3, satisfying l+m=3.

In General Formula (6), the alkyl group, the cycloalkyl group, the aryl group, and the aralkyl group as $R_a$ may be substituted with the same groups as the group mentioned above as a group which may be substituted in the alkyl group, the cycloalkyl group, the aryl group, and the aralkyl group as $R_b$.

Specific examples of the alkyl group, the cycloalkyl group, the aryl group, and the aralkyl group (such the alkyl group, cycloalkyl group, aryl group, and aralkyl group may be substituted with the groups as described above) of $R_a$ include the same groups as the specific of examples as described above with respect to $R_b$.

Specific examples of the particularly preferred compound (C) in the present invention include, but are not limited to, the compounds disclosed in paragraph <0475> of US2012/0135348A1.

The compounds represented by General Formula (6) can be synthesized in accordance with JP2007-298569A, JP2009-199021 A, and the like.

In the present invention, the low-molecular compound (C) having a group capable of leaving by the action of an acid on a nitrogen atom may be used alone or in combination of two or more kinds thereof.

The content of the compound (C) in the composition of the present invention is preferably 0.001% by mass to 20% by mass, more preferably 0.001% by mass to 10% by mass, and still more preferably 0.01% by mass to 5% by mass, with respect to the total solid content of the composition.

The basic compound whose basicity is reduced or lost upon irradiation with actinic ray or radiation (hereinafter also referred to as a "compound (PA)") is a compound which has a functional group with proton acceptor properties, and decomposes under irradiation with actinic ray or radiation to exhibit deterioration in proton acceptor properties, no proton acceptor properties, or a change from the proton acceptor properties to acid properties.

The functional group with proton acceptor properties refers to a functional group having a group or an electron which is capable of electrostatically interacting with a proton, and for example, means a functional group with a macrocyclic structure, such as a cyclopolyether, or a functional group containing a nitrogen atom having an unshared electron pair not contributing to π-conjugation. The nitrogen atom having an unshared electron pair not contributing to π-conjugation is, for example, a nitrogen atom having a partial structure represented by the following formula.

Preferred examples of the partial structure of the functional group with proton acceptor properties include crown ether, azacrown ether, primary to tertiary amine, pyridine, imidazole, and pyrazine structures.

The compound (PA) decomposes upon irradiation with actinic ray or radiation to generate a compound exhibiting deterioration in proton acceptor properties, no proton acceptor properties, or a change from the proton acceptor properties to acid properties. Here, exhibiting deterioration in proton acceptor properties, no proton acceptor properties, or a change from the proton acceptor properties to acid properties means a change of proton acceptor properties due to the proton being added to the functional group with proton acceptor properties, and specifically a decrease in the equilibrium constant at chemical equilibrium when a proton adduct is generated from the compound (PA) having the functional group with proton acceptor properties and the proton.

The proton acceptor properties can be confirmed by carrying out pH measurement.

In the present invention, the acid dissociation constant pKa of the compound generated by the decomposition of the compound (PA) upon irradiation with actinic ray or radiation preferably satisfies pKa <−1, more preferably −13<pKa <−1, and still more preferably −13<pKa <−3.

In the present invention, the acid dissociation constant pKa indicates an acid dissociation constant pKa in an aqueous solution, and is described, for example, in Chemical Handbook (II) (Revised 4$^{th}$ Edition, 1993, compiled by the Chemical Society of Japan, Maruzen Company. Ltd.), and a lower value thereof indicates higher acid strength. Specifically, the pKa in an aqueous solution may be measured by using an infinite-dilution aqueous solution and measuring the acid dissociation constant at 25° C., or a value based on the Hammett substituent constants and the database of publicly known literature data can also be obtained by computation using the following software package 1. All the values of pKa described in the present specification indicate values determined by computation using this software package.

Software package 1: Advanced Chemistry Development (ACDLabs) Software V 8.14 for Solaris (1994-2007 ACD/Labs).

The compound (PA) generates a compound represented by the following General Formula (PA-1), for example, as the proton adduct generated by decomposition upon irradiation with actinic ray or radiation. The compound represented by General Formula (PA-1) is a compound exhibiting deterioration in proton acceptor properties, no proton acceptor properties, or a change from the proton acceptor properties to acid properties since the compound has a functional group with proton acceptor properties as well as an acidic group, as compared with the compound (PA).

(PA-1)

In General Formula (PA-1),

Q represents —SO$_3$H, —CO$_2$H, or —W$_1$NHW$_2$R$_f$, in which R$_f$ represents an alkyl group (preferably having 1 to 20 carbon atoms), a cycloalkyl group (preferably having 3 to 20 carbon atoms), or an aryl group (preferably having 6 to 30 carbon atoms), and W$_1$ and W$_2$ each independently represent —SO$_2$— or —CO—, A represents a single bond or a bivalent connecting group.

X represents —SO$_2$— or —CO—, n is 0 or 1,

B represents a single bond, an oxygen atom, or —N(R$_x$)R$_y$—, in which R$_x$ represents a hydrogen atom or a monovalent organic group, and R$_y$ represents a single bond or a bivalent organic group, provided that R$_x$ may be bonded to R$_y$ to form a ring or may be bonded to R to form a ring, and R represents a monovalent organic group having a functional group with proton acceptor properties.

General Formula (PA-1) will be described in more detail.

The divalent linking group in A is preferably a divalent linking group having 2 to 12 carbon atoms, such as and examples thereof include an alkylene group and a phenylene group. The divalent linking group is more preferably an alkylene group having at least one fluorine atom, preferably having 2 to 6 carbon atoms, and more preferably having 2 to 4 carbon atoms. The alkylene chain may contain a linking group such as an oxygen atom and a sulfur atom. In particular, the alkylene group is preferably an alkylene group in which 30% to 100% by number of the hydrogen atoms are substituted with fluorine atoms, and more preferably, the carbon atom bonded to the Q site has a fluorine atom. The alkylene group is still more preferably a perfluoroalkylene group, and even still more preferably a perfluoroethylene group, a perfluoropropylene group, or a perfluorobutylene group.

The monovalent organic group in R$_x$ is preferably an organic group having 1 to 30 carbon atoms, and examples thereof include an alkyl group, a cycloalkyl group, an aryl group, an aralkyl group, and an alkenyl group. These groups may further have a substituent.

The alkyl group in R$_x$ may have a substituent, is preferably a linear and branched alkyl group having 1 to 20 carbon atoms, and may have an oxygen atom, a sulfur atom, or a nitrogen atom in the alkyl.

The cycloalkyl group in R$_x$ may have a substituent, is preferably a monocyclic cycloalkyl or polycyclic cycloalkyl group having 3 to 20 carbon atoms, and may have an oxygen atom, a sulfur atom, or a nitrogen atom in the ring.

The aryl group in Rx may have a substituent, is preferably an aryl group having 6 to 14 carbon atoms, and examples thereof include a phenyl group and a naphthyl group.

The aralkyl group in R$_x$ may have a substituent, is preferably an aralkyl group having 7 to 20 carbon atoms, and examples thereof include a benzyl group and a phenethyl group.

The alkenyl group in R$_x$ may have a substituent and may be linear, branched, or chained. The alkenyl group is preferably an alkenyl group having 3 to 20 carbon atoms. Examples of the alkenyl group include a vinyl group, an allyl group, and a styryl group.

Examples of a substituent in the case where Rx further has a substituent include a halogen atom, a linear, branched, or cyclic alkyl group, an alkenyl group, an alkynyl group, an aryl group, an acyl group, an alkoxycarbonyl group, an aryloxycarbonyl group, a carbamoyl group, a cyano group, a carboxyl group, a hydroxyl group, an alkoxy group, an aryloxy group, an alkylthio group, an arylthio group, a heterocyclic oxy group, an acyloxy group, an amino group, a nitro group, a hydrazino group, and a heterocyclic group.

Preferred examples of the divalent organic group in R$_y$ include an alkylene group.

Examples of the ring structure which may be formed by the mutual bonding of R$_x$ and R$_y$ include a 5- to 10-membered ring, and particularly preferably a 6-membered ring, each containing a nitrogen atom.

The functional group with proton acceptor properties in R is the same as above, and examples thereof include groups having a heterocyclic aromatic structure including nitrogen, such as azacrown ether, primary to tertiary amine, pyridine, and imidazole.

The organic group having such a structure is preferably an organic group having 4 to 30 carbon atoms, and examples thereof include an alkyl group, a cycloalkyl group, an aryl group, an aralkyl group, and an alkenyl group.

In the alkyl group, the cycloalkyl group, the aryl group, the aralkyl group, or the alkenyl group containing a functional group with proton acceptor properties or an ammonium group in R, the alkyl group, the cycloalkyl group, the aryl group, the aralkyl group, or the alkenyl group is the same as the alkyl group, the cycloalkyl group, the aryl group, the aralkyl group, or the alkenyl group as mentioned as R$_x$, respectively.

When B is —N(R$_x$)R$_y$—, it is preferable that R and R$_x$ are bonded to each other to form a ring. The formation of a ring structure improves the stability and enhances the storage stability of a composition using the same. The number of carbon atoms which form a ring is preferably 4 to 20, the ring may be monocyclic or polycyclic, and an oxygen atom, and a sulfur atom, or a nitrogen atom may be contained in the ring.

Examples of the monocyclic structure include a 4-membered ring, a 5-membered ring, a 6-membered ring, a 7-membered ring, and a 8-membered ring, each containing a nitrogen atom or the like. Examples of the polycyclic structure include structures formed by a combination of two, or three or more monocyclic structures.

$R_f$ of $-W_1NHW_2R_f$ represented by Q is preferably an alkyl group having 1 to 6 carbon atoms, which may have a fluorine atom, and more preferably a perfluoroalkyl group having 1 to 6 carbon atoms. Further, it is preferable that at least one of $W_1$ and $W_2$ is $-SO_2-$, with a case where both $W_1$ and $W_2$ are $-SO_2-$ being more preferable.

Q is particularly preferably $-SO_3H$ or $-CO_2H$ from the viewpoint of the hydrophilicity of an acid group.

The compound represented by General Formula (PA-1) in which Q site is sulfonic acid can be synthesized by a common sulfonamidation reaction. For example, the compound can be synthesized by a method in which one sulfonyl halide moiety of a bissulfonyl halide compound is selectively reacted with an amine compound to form a sulfonamide bond, and then the another sulfonyl halide moiety thereof is hydrolyzed, or a method in which a cyclic sulfonic acid anhydride is reacted with an amine compound to cause ring opening.

The compound (PA) is preferably an ionic compound. The functional group with proton acceptor properties may be contained in an anion moiety or a cation moiety, and it is preferable that the functional group is contained in an anion moiety.

Preferred examples of the compound (PA) include compounds represented by the following General Formulae (4) to (6).

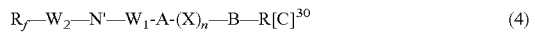  (4)

  (5)

  (6)

In General Formulae (4) to (6), A, X, n, B, R, $R_f$, $W_1$, and $W_2$ each have the same definitions as in General Formula (PA-1).

$C^+$ represents a counter cation.

The counter cation is preferably an onium cation. More specifically, more preferred examples thereof include a sulfonium cation described as $S^+(R_{201})(R_{202})(R_{203})$ in General Formula (ZI') and an iodonium cation described as $I^+(R_{204})(R_{205})$ in General Formula (ZII') with regard to an acid generator (B').

Specific examples of the compound (PA) include the compounds exemplified in <0280> of US2011/0269072A1.

Furthermore, in the present invention, compounds (PA) other than a compound which generates the compound represented by General Formula (PA-1) can also be appropriately selected. For example, a compound containing a proton acceptor moiety at its cation moiety may be used as an ionic compound. More specific examples thereof include a compound represented by the following General Formula (7).

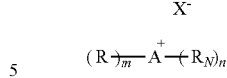  (7)

In the formula, A represents a sulfur atom or an iodine atom, m represents 1 or 2 and n represents 1 or 2, provided that m+n=3 when A is a sulfur atom and that m+n=2 when A is an iodine atom, R represents an aryl group, $R_N$ represents an aryl group substituted with the functional group with proton acceptor properties, and $X^-$ represents a counter anion.

Specific examples of $X^-$ include the same anions as those of the non-nucleophilic anion of the compound (B) as described above.

Specific preferred examples of the aryl group of R and $R_N$ include a phenyl group.

Specific examples of the functional group with proton acceptor properties contained in $R_N$ are the same as those of the functional group with proton acceptor properties as described above in Formula (PA-1).

Specific examples of the ionic compounds having a proton acceptor site at a cationic moiety include the compounds exemplified in <0291> of US2011/0269072A1.

Furthermore, such compounds can be synthesized, for example, with reference to the methods described in JP2007-230913A, JP2009-122623A, and the like.

The compound (PA) may be used alone or in combination of two or more kinds thereof.

The content of the compound (PA) is preferably 0.1% by mass to 10% by mass, and more preferably 1% by mass to 8% by mass, with respect to the total solid content of the composition.

The composition of the present invention can further contain an onium salt composed of a relatively weak acid with respect to the "acid generated from the compound (B) upon irradiation with actinic ray or radiation" as an acid diffusion control agent.

In the case of mixing the compound (B) with the onium salt, and using the mixture, when the acid generated from the compound (B) upon irradiation with actinic ray or radiation collides with an onium salt having an unreacted weak acid anion, a weak acid is discharged by salt exchange to generate an onium salt having a strong acid anion. In this process, the strong acid is exchanged with a weak acid having a lower catalytic ability, and therefore, the acid is deactivated in appearance, and thus, it is possible to carry out the control of acid diffusion.

As the onium salt, compounds represented by the following General Formulae (d1-1) to (d1-3) are preferable.

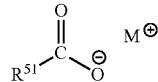  (d1-1)

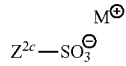  (d1-2)

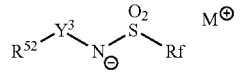  (d1-3)

In the formulae, $R^{51}$ is a hydrocarbon group which may have a substituent, $Z^{2c}$ is a hydrocarbon group (provided that carbon adjacent to S is not substituted with a fluorine atom) having 1 to 30 carbon atoms, which may have a substituent, $R^{52}$ is an organic group, $Y^3$ is a linear, branched, or cyclic alkylene group or arylene group, Rf is a hydrocarbon group containing a fluorine atom, and $M^+$'s are each independently a sulfonium or iodonium cation.

Preferred examples of the sulfonium cation or the iodonium cation represented by $M^+$ include the specific examples mentioned for the cation in the compound (B), the sulfonium cation in the compound represented by General Formula (ZI') and the iodonium cation in the compound represented by General Formula (ZII').

Preferred examples of the anionic moiety of the compound represented by General Formula (d1-1) include the structures exemplified in paragraph <0198> of JP2012-242799A.

Preferred examples of the anionic moiety of the compound represented by General Formula (d1-2) include the structures exemplified in paragraph <0201> of JP2012-242799A.

Preferred examples of the anionic moiety of the compound represented by General Formula (d1-3) include the structures exemplified in paragraphs <0209> and <0210> of JP2012-242799A.

The onium salt may be a compound (hereinafter also referred to as a "compound (CA)") which has (C) a cationic moiety and an anionic moiety in the same molecule, and further, the cationic moiety and the anionic moiety are linked to each other via a covalent bond.

As the compound (CA), a compound represented by any one of the following General Formulae (C-1) to (C-3) is preferable.

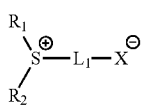

(C-1)

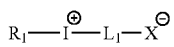

(C-2)

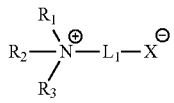

(C-3)

In General Formulae (C-1) to (C-3), $R_1$, $R_2$, and $R_3$ represent a substituent having 1 or more carbon atoms, $L_1$ represents a divalent linking group that links a cationic moiety with an anionic moiety, or a single bond, —$X^-$ represents an anionic moiety selected from —COO$^-$, —SO$_3^-$, —SO$_2^-$, and —N$^-$—R$_4$. $R_4$ represents a monovalent substituent having a carbonyl group: —C(=O)—, a sulfonyl group: —S(=O)$_2$—, or a sulfinyl group: —S(=O)— at a site for linking to an adjacent N atom, $R_1$, $R_2$, $R_3$, $R_4$, and $L_1$ may be bonded to one another to form a ring structure. Further, in (C-3), two members out of $R_1$ to $R_3$ may be combined to form a double bond with an N atom.

Examples of the substituent having 1 or more carbon atoms in $R_1$ to $R_3$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, and preferably an alkyl group, a cycloalkyl group, and an aryl group.

Examples of $L_1$ as a divalent linking group include a linear or branched alkylene group, a cycloalkylene group, an arylene group, a carbonyl group, an ether bond, an ester bond, an amide bond, an urethane bond, an urea bond, and a group formed by a combination of two or more kinds of these groups. $L_1$ is more preferably alkylene group, an arylene group, an ether bond, an ester bond, and a group formed by a combination of two or more kinds of these groups.

Preferred examples of the compound represented by General Formula (C-1) include the compounds exemplified in paragraphs <0037> to <0039> of JP2013-6827A and paragraphs <0027> to <0029> of JP2013-8020A.

Preferred examples of the compound represented by General Formula (C-2) include the compounds exemplified in paragraphs <0012> to <0013> of JP2012-189977A.

Preferred examples of the compound represented by General Formula (C-3) include the compounds exemplified in paragraphs <0029> to <0031> of JP2012-252124A.

The content of the onium salt composed of a relatively weak acid with respect to the acid generated from the compound (B) upon irradiation with actinic ray or radiation is preferably 0.5% by mass to 10.0% by mass, more preferably 0.5% by mass to 8.0%, by mass, and still more preferably 1.0% by mass to 8.0% by mass, with respect to the solid content of the composition.

[5] Solvent

The composition usually contains a solvent.

Examples of the solvent which can be used in the preparation of the composition include organic solvents such as alkylene glycol monoalkyl ether carboxylate, alkylene glycol monoalkyl ether, alkyl lactate ester, alkyl alkoxypropionate, a cyclic lactone (preferably having 4 to 10 carbon atoms), a monoketone compound (preferably having 4 to 10 carbon atoms) which may have a ring, alkylene carbonate, alkyl alkoxyacetate, and alkyl pyruvate. Specific examples of these solvents include ones described in, for example, <0441> to <0455> of US2008/0187860A.

In the present invention, a mixed solvent obtained by mixing a solvent containing a hydroxyl group and a solvent containing no hydroxyl group in the structure may be used as the organic solvent.

As the solvent containing a hydroxyl group and the solvent containing no hydroxyl group, the aforementioned exemplary compounds can be appropriately selected and used, and as the solvent containing a hydroxyl group, alkylene glycol monoalkyl ether, alkyl lactate, and the like are preferable, and propylene glycol monomethyl ether (PGME, alternative name: 1-methoxy-2-propanol) and ethyl lactate are more preferable. Further, as the solvent containing no hydroxyl group, alkylene glycol monoalkyl ether acetate, alkyl alkoxy propionate, a monoketone compound which may contain a ring, cyclic lactone, alkyl acetate, and the like are preferable. Among these, propylene glycol monomethyl ether acetate (PGMEA, alternative name: 1-methoxy-2-acetoxypropane), ethyl ethoxypropionate, 2-heptanone, γ-butyrolactone, cyclohexanone, and butyl acetate are particularly preferable, and propylene glycol monomethyl ether acetate, ethyl ethoxypropionate, and 2-heptanone are most preferable.

The mixing ratio (based on mass) of the solvent containing a hydroxyl group and the solvent containing no hydroxyl group is 1/99 to 99/1, preferably 10/90 to 90/10, and more preferably 20/80 to 60/40. A mixed solvent whose proportion of the solvent containing no hydroxyl group is 50% by mass or more is particularly preferable from the viewpoint of coating evenness.

The solvent preferably contains propylene glycol monomethyl ether acetate, and is preferably a solvent composed of propylene glycol monomethyl ether acetate alone or a mixed solvent of two or more kinds of solvents including propylene glycol monomethyl ether acetate.

[6] Surfactant

The composition may or may not further contain a surfactant, and in the case where the composition contains a surfactant, it is more preferable to contain any one of fluorine- and/or silicon-based surfactants (a fluorine-based surfactant, a silicon-based surfactant, and a surfactant having both a fluorine atom and a silicon atom), or two or more kinds thereof.

By incorporating the surfactant into the composition, it becomes possible to provide a resist pattern which is improved in adhesion and decreased in development defects with good sensitivity and resolution when an exposure light source of 250 nm or less, and particularly 220 nm or less, is used.

Examples of the fluorine- and/or silicon-based surfactants include the surfactants described in a paragraph <0276> of US2008/0248425A.

In addition, in the present invention, a surfactant other than the fluorine- and/or silicon-based surfactants described in a paragraph <0280> of US2008/0248425A can also be used.

These surfactants may be used alone or in combination of some kinds thereof.

In the case where the composition contains the surfactant, the amount of the surfactant used is preferably 0.0001% by mass to 2% by mass, and more preferably 0.0005% by mass to 1% by mass, with respect to the total solid content (excluding the solvent) of the composition.

On the other hand, by setting the amount of the surfactant added to 10 ppm or less with respect to the total amount (excluding the solvent) of the composition, the hydrophobic resin is more unevenly distributed to the surface, so that the resist film surface can be made more hydrophobic, which can enhance the water tracking properties during the liquid immersion exposure.

[7] Other Additives

The composition of the present invention may or may not contain an onium carboxylate salt. Examples of such an onium carboxylate salt include those described in <0605> to <0606> of US2008/0187860A.

The onium carboxylate salt can be synthesized by reacting sulfonium hydroxide, iodonium hydroxide, ammonium hydroxide and carboxylic acid with silver oxide in a suitable solvent.

In the case where the composition of the present invention contains the onium carboxylate salt, the content of the salt is generally 0.1% by mass to 20% by mass, preferably 0.5% by mass to 10% by mass, and more preferably 1% by mass to 7% by mass, with respect to the total solid content of the composition.

The composition of the present invention may further contain an acid proliferation agent, a dye, a plasticizer, a light sensitizer, a light absorbent, an alkali-soluble resin, a dissolution inhibitor, a compound promoting solubility in a developer (for example, a phenol compound with a molecular weight of 1,000 or less, an alicyclic or aliphatic compound having a carboxyl group), and the like, if desired.

Such a phenol compound having a molecular weight of 1,000 or less may be easily synthesized by those skilled in the art with reference to the method disclosed in, for example, JP1992-122938A (JP-H04-122938A), JP1990-28531A (JP-H02-28531A), U.S. Pat. No. 4,916,210A, EP219294B, and the like.

Specific examples of the alicyclic compound or aliphatic compound having a carboxyl group include, but not limited to, a carboxylic acid derivative having a steroid structure such as a cholic acid, deoxycholic acid or lithocholic acid, an adamantane carboxylic acid derivative, adamantane dicarboxylic acid, cyclohexane carboxylic acid, and cyclohexane dicarboxylic acid.

The composition of the present invention is preferably a resist film having a film thickness of 80 nm or less from the viewpoint of improving the resolving power. It is possible to set the film thickness by setting the solid content concentration in the composition to an appropriate range to have a suitable viscosity and improving a coating property and a film forming property.

The solid content concentration of the composition of the present invention is usually 1.0% by mass to 10% by mass, preferably 2.0% by mass to 5.7% by mass, and more preferably 2.0% by mass to 5.3% by mass. By setting the solid content concentration to these ranges, it is possible to uniformly coat the resist solution on a substrate and additionally, it is possible to form a resist pattern having excellent line width roughness. The reason is not clear; however, it is considered that, by setting the solid content concentration to 10% by mass or less and preferably 5.7% by mass or less, the aggregation of materials, particularly the photoacid generator, in the resist solution is suppressed and, as the result, it is possible to form a uniform resist film.

The solid content concentration is the weight percentage of the weight of other the resist components excluding the solvent with respect to the total weight of the composition.

The composition of the present invention is used by dissolving the components in a predetermined organic solvent, and preferably in the mixed solvent, filtering the solution through a filter, and then applying the filtered solution on a predetermined support (substrate). The filter used for filtration is preferably a polytetrafluoroethylene-, polyethylene- or nylon-made filter having a pore size of 0.1 µm or less, more preferably 0.05 µm or less, and still more preferably 0.03 µm or less. In the filtration through a filter, as described in, for example, JP2002-62667A, circulating filtration may be carried out, or the filtration may be carried out by connecting two or more kinds of filters in series or in parallel. In addition, the composition may be filtered a plurality of times. Furthermore, the composition may be subjected to a deaeration treatment or the like before or after filtration through a filter.

The composition of the present invention is related to an actinic ray-sensitive or radiation sensitive-resin composition whose properties change by a reaction upon irradiation with actinic ray or radiation. More specifically, the present invention relates to an actinic ray-sensitive or radiation sensitive-resin composition which can be used in for a step of manufacturing a semiconductor such as an IC, for manufacture of liquid crystals and a circuit board for a thermal head or the like, the manufacture of a mold structure for imprinting, or a other photofabrication processes, or used in a lithographic printing plate or an acid-curable composition.

[8] Pattern Forming Method

Next, the pattern forming method according to the present invention will be described.

The pattern forming method of the present invention includes at least the following steps:

(i) a step of forming a film (an actinic ray-sensitive or radiation sensitive-resin composition film, a composition film, or a resist film), using the composition of the present invention, (ii) a step of irradiating (exposing) the film with actinic ray or radiation (exposing step), and (iii) a step of developing the film (exposed film) irradiated with actinic ray or radiation using a developer including an organic solvent (developing step).

The pattern forming method of the present invention is typically a negative type pattern forming method for forming a negative type pattern.

The exposure in the step (ii) may be a liquid immersion exposure.

The pattern forming method of the present invention preferably includes a (iv) heating step after the (ii) exposing step.

The pattern forming method of the present invention may further include a (v) step of performing development using an alkali developer. By including the step, it is possible to obtain an optical image ½ pattern of a mask, as described in FIGS. 1 to 11 of U.S. Pat. No. 8,227,183B2, and the like. Further, the order of the step (iii) and the step (v) is not particularly limited.

The pattern forming method of the present invention may further include the (ii) exposing step in plural times.

The pattern forming method of the present invention may include the (iv) heating step in plural times.

The resist film of the present invention is formed from the actinic ray-sensitive or radiation-sensitive resin composition of the present invention, and more specifically, it is preferably a film formed by coating the actinic ray-sensitive or radiation-sensitive resin composition on a substrate. In the pattern forming method of the present invention, a step of forming a film from the actinic ray-sensitive or radiation-sensitive resin composition on a substrate, a step of exposing the film, and a developing step can be carried out by a generally known method.

It is also preferable that the method includes a pre-heating step (PB; Prebake) after forming a film and before the exposing step.

In addition, it is also preferable that the method includes a step of heating after exposure (PEB: Post Exposure Bake), after the exposing step and before the development step.

For both PB and PEB, the heating is preferably carried out at a heating temperature of 70° C. to 130° C., and more preferably 80° C. to 120° C.

The heating time is preferably 30 seconds to 300 seconds, more preferably 30 seconds to 180 seconds, and still more preferably 30 seconds to 90 seconds.

The heating may be carried out using a means installed in an ordinary exposure-and-development machine, or may also be carried out using a hot plate or the like.

The baking accelerates the reaction in the exposed areas, and thus, the sensitivity and the pattern profile are enhanced.

The light source wavelength used in the exposure device in the present invention is not particularly limited, and examples thereof include infrared rays, visible light, ultraviolet rays, far ultraviolet rays, extreme ultraviolet rays, X-rays, and electron beams, for example, far ultraviolet rays at a wavelength of preferably 250 nm or less, more preferably 220 nm or less, and particularly preferably 1 nm to 200 nm, specifically a KrF excimer laser (248 nm), an ArF excimer laser (193 nm), an $F_2$ excimer laser (157 nm), X-rays, EUV (13 nm), electron beams, and the like, with the KrF excimer laser, the ArF excimer laser, EUV, or the electron beams being preferable, and the ArF excimer laser being more preferable.

Furthermore, a liquid immersion exposure method can be applied to the step of carrying out exposure of the present invention. It is possible to combine the liquid immersion exposure method with super-resolution technology such as a phase shift method and a modified illumination method.

In the case of carrying out the liquid immersion exposure, a step of cleaning the surface of a film with an aqueous chemical liquid may be carried out (1) after forming a film on a substrate and before an exposing step, and/or (2) after a step of subjecting the film to exposure through an immersion liquid and before heating the film.

The immersion liquid is preferably a liquid which is transparent to exposure wavelength and has a minimum temperature coefficient of refractive index so as to minimize the distortion of an optical image projected on the resist film. In particular, in the case where the exposure light source is an ArF excimer laser (wavelength: 193 nm), water is preferably used in terms of easy availability and easy handling, in addition to the above-described viewpoints.

In the case of using water, an additive (liquid) that decreases the surface tension of water while increasing the interfacial activity may be added at a slight proportion. It is preferable that this additive does not dissolve the resist film, and gives a negligible effect on the optical coat at the undersurface of a lens element.

Such an additive is preferably for example, an aliphatic alcohol having a refractive index substantially equal to that of water, and specific examples thereof include methyl alcohol, ethyl alcohol, and isopropyl alcohol. By adding an alcohol having a refractive index substantially equal to that of water, even when the alcohol component in water is evaporated and its content concentration is changed, an advantage in that the change in the refractive index of the liquid as a whole can be advantageously made very small is obtained.

On the other hand, in the case where materials opaque to light at 193 nm or impurities having a great difference in the refractive index from water are incorporated, the distortion of an optical image projected on a resist is caused. Therefore, the water to be used is preferably distilled water. Further, pure water after filtration through an ion exchange filter or the like may also be used.

The electrical resistance of water used as the immersion liquid is preferably 18.3 MΩcm or more, and Total Organic Concentration (TOC) is preferably 20 ppb or less. The water is preferably one which has been subjected to a deaeration treatment.

In addition, the lithography performance can be enhanced by increasing the refractive index of the immersion liquid. From such a viewpoint, an additive for increasing the refractive index, for example, may be added to water, or heavy water ($D_2O$) may be used in place of water.

The receding contact angle of the resist film formed using the actinic ray-sensitive or radiation-sensitive resin composition in the present invention is preferably 70° or more at 23±3° C. at a humidity of 45±5%, which is appropriate in the case of the exposure through a liquid immersion medium. The receding contact angle is more preferably 75° or more, and still more preferably 75° to 85°.

If the receding contact angle is extremely small, the resist film cannot be appropriately used in the case of the exposure through a liquid immersion medium. Further, it is not possible to sufficiently exhibit the effect of reducing defects due to remaining water (water marks). In order to realize a favorable receding contact angle, it is preferable to incorporate the hydrophobic resin (D) into the actinic ray-sensitive or radiation-sensitive resin composition. Alternatively, a coating layer (hereinafter also referred to as a "top coat") formed of the hydrophobic resin composition may be formed on the resist film to improve the receding contact angle.

In the liquid immersion exposing step, the immersion liquid needs to move on a wafer following the movement of an exposure head that scans on the wafer at a high speed and forms an exposure pattern, and thus the contact angle of the immersion liquid for the resist film in a dynamic state is important, and the resist requires a performance of following the high-speed scanning of the exposure head, while a liquid droplet no longer remains.

The substrate on which the resist film is formed in the present invention is not particularly limited, and it is possible to use an inorganic substrate such as silicon, SiN, and $SiO_2$, a coating type inorganic substrate such as SOG, or a substrate generally used in a process for manufacturing a semiconductor such as an IC, in a process for manufacture of liquid crystals and a circuit board for a thermal head or the like, and used in other lithographic processes of photofabrication. Further, if desired, an antireflection film may be formed between the resist film and the substrate. As the antireflection film, a known organic or inorganic antireflection film can be appropriately used.

In the case where the pattern forming method of the present invention further has a step of performing development using an alkali developer, examples of the alkali developer include an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, tetraalkylammonium hydroxides such as tetramethylammonium hydroxide, tetraethylammonium hydroxide, tetrapropylammonium hydroxide, tetrabutylammonium hydroxide, tetrapentylammonium hydroxide, tetrahexylammonium hydroxide, tetraoctylammonium hydroxide, ethyltrimethylammonium hydroxide, butyltrimethylammonium hydroxide, methyltriamylammonium hydroxide, and dibutyldipentylammonium hydroxide, quaternary ammonium salts such as trimethylphenylammonium hydroxide, trimethylbenzylammonium hydroxide, and triethylbenzylammonium hydroxide, and cyclic amines such as pyrrole and piperidine, can be used.

Furthermore, the alkaline aqueous solution may also be used after adding thereto alcohols and a surfactant each in an appropriate amount.

The alkali concentration of the alkali developer is usually 0.1% by mass to 20% by mass.

The pH of the alkali developer is usually 10.0 to 15.0.

In particular, a 2.38%-by-mass aqueous tetramethylammonium hydroxide solution is desirable.

In the rinse treatment which is carried out after the alkali development, pure water is used as the rinsing liquid, and an appropriate amount of a surfactant may be added thereto before the use.

In addition, a step of removing the developer or the rinsing liquid adhering onto the pattern can be carried out by a supercritical fluid after the development treatment or the rinse treatment.

As the developer in the step of performing development using a developer including an organic solvent (hereinafter also referred to as an "organic developer"), a polar solvent such as a ketone-based solvent, an ester-based solvent, an alcohol-based solvent, an amide-based solvent, and an ether-based solvent, or a hydrocarbon-based solvent can be used.

Examples of the ketone-based solvent include 1-octanone, 2-octanone, 1-nonanone, 2-nonanone, acetone, 2-heptanone (methylamylketone), 4-heptanone, 1-hexanone, 2-hexanone, diisobutyl ketone, cyclohexanone, methylcyclohexanone, phenylacetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, and propyl lactate.

Examples of the alcohol-based solvent include an alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, and n-decanol; a glycol-based solvent such as ethylene glycol, diethylene glycol, and triethylene glycol; and a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethyl butanol.

Examples of the ether-based solvent include, in addition to the glycol ether-based solvents above, dioxane, and tetrahydrofuran.

Examples of the amide-based solvent which can be used include N-methyl-2-pyrrolidone, N,N-dimethylacetamide, N,N-dimethylformamide, hexamethylphosphoric triamide, and 1,3-dimethyl-2-imidazolidinone.

Examples of the hydrocarbon-based solvent include an aromatic hydrocarbon-based solvent such as toluene and xylene, and an aliphatic hydrocarbon-based solvent such as pentane, hexane, octane, and decane.

A plurality of these solvents may be mixed, or the solvent may be used by mixing it with a solvent other than those described above or with water. However, in order to sufficiently bring out the effects of the present invention, the water content ratio in the entire developer is preferably less than 10% by mass, and it is more preferable that the developer contains substantially no water.

That is, the amount of the organic solvent used in the organic developer is preferably 90% by mass to 100% by mass, and more preferably 95% by mass to 100% by mass, with respect to the entire amount of the developer.

Particularly, the organic developer is preferably a developer containing at least one kind of organic solvent selected from the group consisting of a ketone-based solvent, an ester-based solvent, an alcohol-based solvent, an amide-based solvent, and an ether-based solvent.

The vapor pressure of the organic developer is preferably 5 kPa or less, more preferably 3 kPa or less, and particularly preferably 2 kPa or less, at 20° C. By setting the vapor pressure of the organic developer to 5 kPa or less, the evaporation of the developer on a substrate or in a development cup is inhibited, and the temperature uniformity within a wafer plane is improved, whereby the dimensional uniformity within a wafer plane is enhanced.

An appropriate amount of a surfactant may be added to the organic developer, if desired.

The surfactant is not particularly limited, and for example, an ionic or nonionic, fluorine- and/or silicon-based surfactant can be used. Examples of such a fluorine- and/or silicon-based surfactant include surfactants described in JP1987-36663A (JP-S62-36663A), JP1986-226746A (JP-S61-226746A), JP1986-226745A (JP-S61-226745A), JP1987-170950A (JP-S62-170950A). JP1988-34540A (JP-S63-34540), JP1995-230165A (JP-H07-230165A), JP1996-62834A (JP-H08-62834A), JP1997-54432A (JP-H09-54432A), JP1997-5988A (JP-H09-5988A), U.S. Pat. Nos. 5,405,720, 5,360,692, 5,529,881, 5,296,330, 5,436,098, 5,576,143, 5,294,511, and 5,824,451, with the nonionic surfactant being preferable. The nonionic surfactant is not particularly limited, and the fluorine-based surfactant or the silicon-based surfactant is more preferably used.

The amount of the surfactant used is usually 0.001% by mass to 5% by mass, preferably 0.005% by mass to 2% by mass, and more preferably 0.01% by mass to 0.5% by mass, with respect to the total amount of the developer.

In addition, the organic developer may also include a nitrogen-containing compound, particularly as described in paragraphs <0032> to <0063> of JP2013-11833A. Further, examples of the nitrogen-containing compound include the basic compound as described above which may be contained in the actinic ray-sensitive or radiation-sensitive resin composition.

As the developing method, for example, a method in which a substrate is immersed in a tank filled with a developer for a certain period of time (a dip method), a method in which a developer is heaped up to the surface of a substrate by surface tension and developed by stopping for a certain period of time (a paddle method), a method in which a developer is sprayed on the surface of a substrate (a spray method), a method in which a developer is continuously discharged on a substrate spun at a constant rate while scanning a developer discharging nozzle at a constant rate (a dynamic dispense method), or the like, can be applied.

In the case where the various developing methods include a step of discharging a developer toward a resist film from a development nozzle of a developing device, the discharge pressure of the developer discharged (the flow velocity per unit area of the developer discharged) is preferably 2 mL/sec/mm$^2$ or less, more preferably 1.5 mL/sec/mm$^2$ or less, and still more preferably 1 mL/sec/mm$^2$ or less. The flow velocity has no particular lower limit, and is preferably 0.2 mL/sec/mm$^2$ or more in consideration of throughput.

By setting the discharge pressure of the discharged developer to the aforementioned range, pattern defects resulting from the resist scum after development may be significantly reduced.

Although details on the mechanism are not clear, it is thought to be due to a fact that the pressure imposed on the resist film by the developer is decreased by setting the discharge pressure to the above range so that the resist film and the resist pattern are inhibited from being inadvertently cut or collapsing.

Furthermore, the discharge pressure (mL/sec/mm$^2$) of the developer is the value at the outlet of the development nozzle in the developing device.

Examples of the method for adjusting the discharge pressure of the developer include a method of adjusting the discharge pressure by a pump or the like, and a method of supplying a developer from a pressurized tank and adjusting the pressure to change the discharge pressure.

In addition, after the step of carrying out development using a developer including an organic solvent, a step of stopping the development while replacing the solvent with another solvent may also be carried out.

It is preferable that a rising step using a rinsing liquid is included after the step of carrying out development using a developer including an organic solvent.

The rinsing liquid used in the rinsing step after the step of carrying out development using a developer including an organic solvent is not particularly limited as long as the rinsing liquid does not dissolve the resist pattern, and a solution including a general organic solvent can be used. As the rinsing liquid, a rinsing liquid containing at least one organic solvent selected from the group consisting of a hydrocarbon-based solvent, a ketone-based solvent, an ester-based solvent, an alcohol-based solvent, an amide-based solvent, and an ether-based solvent is preferably used.

Specific examples of the hydrocarbon-based solvent, the ketone-based solvent, the ester-based solvent, the alcohol-based solvent, the amide-based solvent, and the ether-based solvent are the same as those described for the developer containing an organic solvent.

After the developing step using a developer including an organic solvent, it is more preferable to carry out a step of cleaning using a rinsing liquid containing at least one organic solvent selected from the group consisting of a ketone-based solvent, an ester-based solvent, an alcohol-based solvent, and an amide-based solvent, it is still more preferable to carry out a step of cleaning using a rinsing liquid containing an alcohol-based solvent or an ester-based solvent, it is particularly preferable to carry out a step of cleaning using a rinsing liquid containing a monohydric alcohol, and it is most preferable to carry out a step of cleaning using a rinsing liquid containing a monohydric alcohol having 5 or more carbon atoms.

Here, examples of the monohydric alcohol used in the rinsing step include a linear, branched, or cyclic monohydric alcohol, and specifically, 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, or the like can be used. Further, 1-hexanol, 2-hexanol, 4-methyl-2-pentanol, 1-pentanol, 3-methyl-1-butanol, or the like can be used as a particularly preferred monohydric alcohol having 5 or more carbon atoms.

The respective components in plural numbers may be mixed, or the components may mixed with an organic solvents other than the above solvents, and used.

The water content of the rinsing liquid is preferably 10% by mass or less, more preferably 5% by mass or less, and particularly preferably 3% by mass or less. By setting the water content to 10% by mass or less, good development characteristics can be obtained.

The vapor pressure of the rinsing liquid which is used after the step of carrying out development using a developer including an organic solvent is preferably from 0.05 kPa to 5 kPa, more preferably from 0.1 kPa to 5 kPa, and most preferably from 0.12 kPa to 3 kPa, at 20° C. By setting the vapor pressure of the rinsing liquid to a range from 0.05 kPa to 5 kPa, the temperature uniformity within a wafer plane is improved, and further, the dimensional uniformity within a wafer plane is enhanced by inhibition of swelling due to the penetration of the rinsing liquid.

The rinsing liquid can also be used after adding an appropriate amount of a surfactant thereto.

In the rinsing step, the wafer which has been subjected to development using a developer including an organic solvent is subjected to a cleaning treatment using the rinsing liquid including an organic solvent. A method for the cleaning treatment is not particularly limited, and for example, a method in which a rinsing liquid is continuously discharged on a substrate rotated at a constant rate (a rotation application method), a method in which a substrate is immersed in a bath filled with a rinsing liquid for a certain period of time (a dip method), a method in which a rinsing liquid is sprayed on a substrate surface (a spray method), or the like, can be applied. Among these, a method in which a cleaning treatment is carried out using the rotation application method, and a substrate is rotated at a rotational speed of 2,000 rpm to 4,000 rpm after cleaning, thereby removing the rinsing liquid from the substrate, is preferable. Further, it is preferable that a heating step (Post Bake) is included after the rinsing step. The residual developer and the rinsing liquid between and inside the patterns are removed by the baking. The heating step after the rinsing step is carried out at typically 40° C. to 160° C., and preferably at 70° C. to 95° C., and typically for 10 seconds to 3 minutes, and preferably for 30 seconds to 90 seconds.

The pattern forming method of the present invention can be used in formation of a guide pattern (see, for example, ACS Nano Vol. 4 No. 8 Page 4815-4823) in Directed Self-Assembly (DSA).

Furthermore, the resist pattern formed according to the above-described method can be used as a core material (core) in the spacer process disclosed in, for example, JP1991-270227A (JP-H03-270227A) and JP2013-164509A.

The present invention further relates to a method for manufacturing an electronic device, including the pattern formation method of the present invention as described above, and an electronic device manufactured by the manufacturing method.

The electronic device of the present invention is suitably mounted on electric or electronic equipment (home electronics, OA/media-related equipment, optical equipment, telecommunication equipment, and the like).

EXAMPLES

Hereinafter, the present invention will be described with reference to Examples, but the present invention is not limited thereto.

Various components used in the following Table 1 are summarized below:
(Synthesis Examples)
[Synthesis of Monomer M-2]

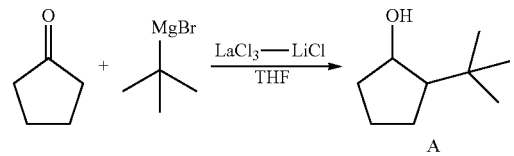

Cyclopentanone (8.4 g) and tetrahydrofuran (200 mL) were put into a three-neck flask, and cooled to 0° C. Then, 166 mL of a lanthanum trichloride/bislithium chloride complex (0.6 mol/L tetrahydrofuran solution) was added dropwise thereto while keeping the temperature, and the mixture was stirred for 30 minutes. Further, 100 mL of t-butylmagnesium bromide (1.0 mol/L tetrahydrofuran solution) was added dropwise thereto at 0° C., and the mixture was stirred for 2 hours. Then, 100 mL of a saturated aqueous ammonium chloride solution was added thereto and a product was extracted twice from the aqueous phase with 200 mL of ethyl acetate. The obtained organic phase was washed with saturated sodium bicarbonate and saturated brine, and then the solvent was evaporated. The obtained crude product was purified by silica gel chromatography to obtain 12.6 g of a compound A (yield of 88%).

The compound A (12.6 g) was added to 200 mL of tetrahydrofuran, and the mixture was cooled to −40° C. While keeping the temperature, 55 mL of normal butyllithium (1.6 mol/L hexane solution) was added dropwise thereto, and the mixture was stirred at 0° C. for 1 hour. The reaction liquid was cooled to −40° C. again, 8.4 g of methacryloyl chloride was then added dropwise thereto, and the mixture was warmed to room temperature. The mixture was stirred for 1 hour and then cooled to 0° C., and 100 mL of water was added thereto. A product was extracted twice from the aqueous phase with 200 mL of ethyl acetate. The obtained organic phase was washed with water and saturated brine, and then the solvent was evaporated. The obtained crude product was purified by silica gel chromatography to obtain a monomer M-2 (13.2 g) (yield of 86%).

Synthesis of Resin (Pol-1))

28.96 parts by mass of cyclohexanone was heated at 85° C. under a nitrogen gas flow. While stirring this liquid, a mixed solution of 22.2 parts by mass of a monomer represented by the following Structural Formula M-1, 21.03 parts by mass of a monomer M-2, 115.9 parts by mass of cyclohexanone, and 1.65 parts by mass of dimethyl 2,2'-azobisisobutyrate [V-601, manufactured by Wako Pure Chemical Industries, Ltd.] was added dropwise thereto for 6 hours. After completion of the dropwise addition, the solution was further stirred at 85° C. for 2 hours. After leaving the reaction liquid to cool, the mixture was reprecipitated with a large amount of methanol/water (mass ratio of 7:1) and filtered, and the obtained solid was air-dried to obtain 39.3 parts by mass of a resin (Pol-1) of the present invention.

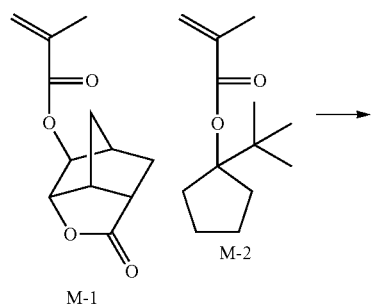

-continued

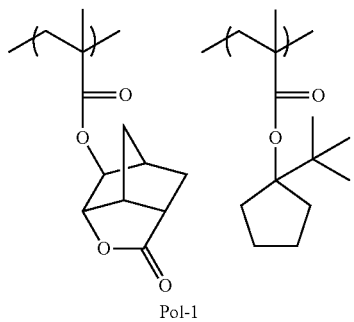

In the same manner as in Synthesis Examples except that the monomers corresponding to the respective repeating units were used to have desired compositional ratios (molar ratios), resins (Pol-2) to (Pol-11) were synthesized.

Furthermore, the numeral values described on the right-handed side of the respective repeating units in the resins (Pol-1) to (Pol-11) below represent % by mole of the respective repeating units.

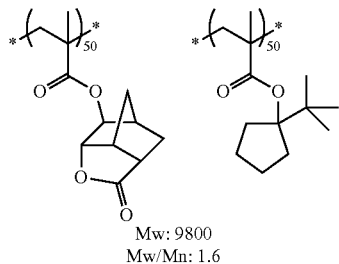

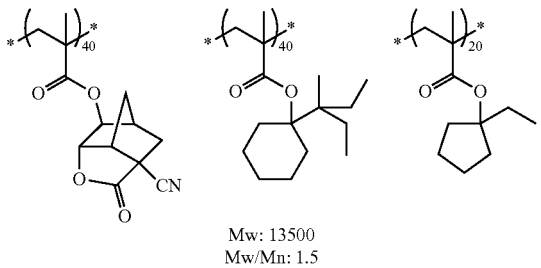

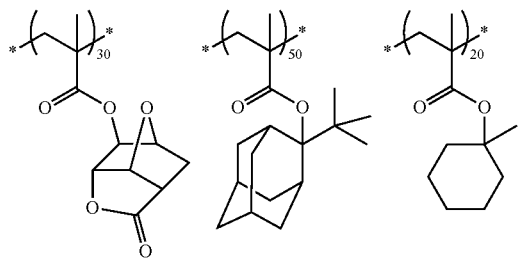

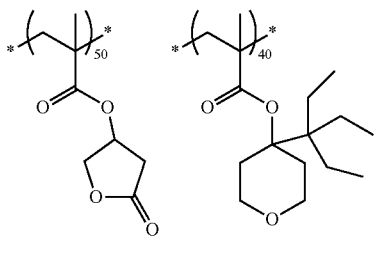

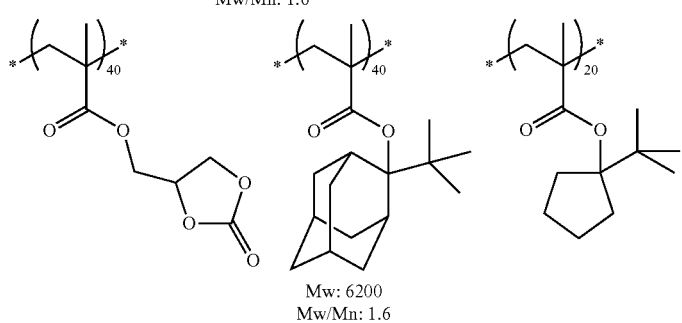

-continued
Pol-6
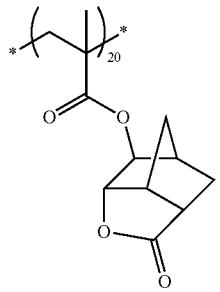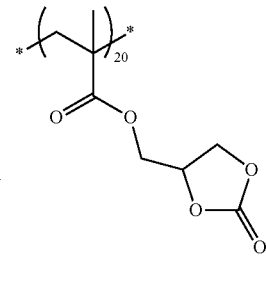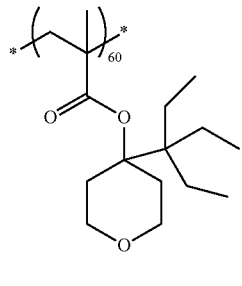
Mw: 17100
Mw/Mn: 1.5
Pol-7
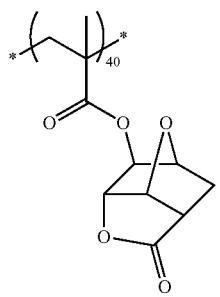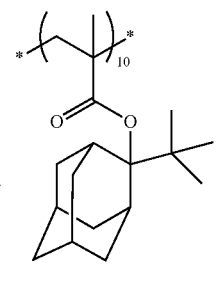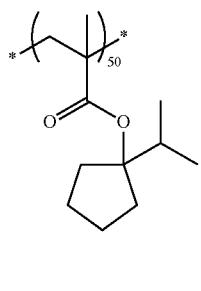
Mw: 10800
Mw/Mn: 1.6
Pol-8                                      Pol-9
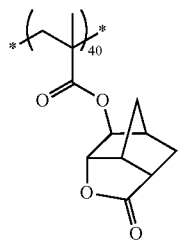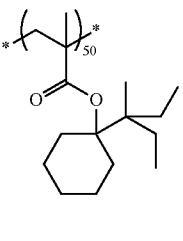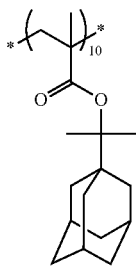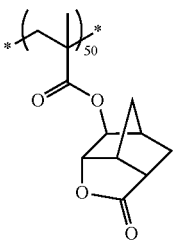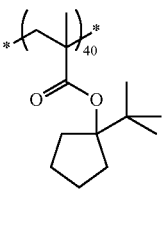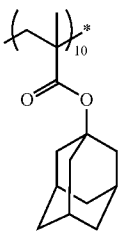
Mw: 16600      Mw: 8900
Mw/Mn: 1.5     Mw/Mn: 1.6
Pol-10
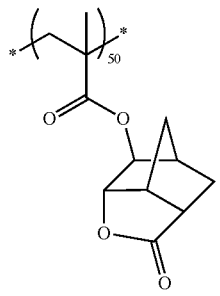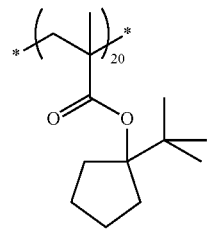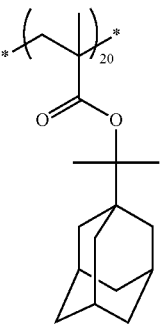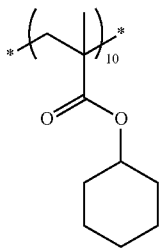
Mw: 11500
Mw/Mn: 1.5

Furthermore, as a resin used in Comparative Examples, the following resins were used.
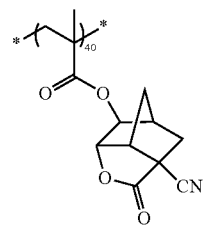 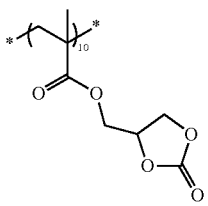 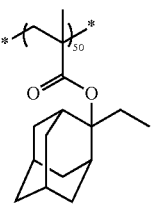
Pol-11
Mw: 12900
Mw/Mn: 1.5
As the acid generator, the following compounds were used.
PAG1
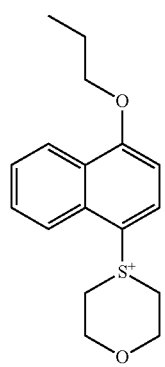 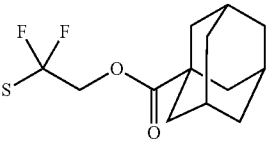
PAG2
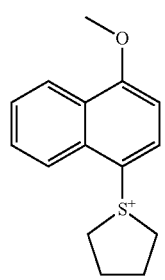
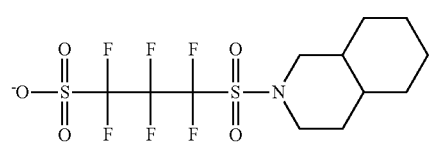
PAG3
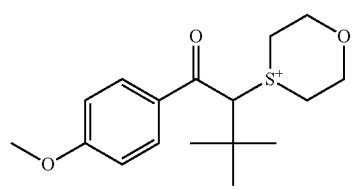
-continued
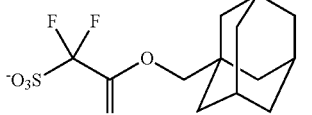
PAG4
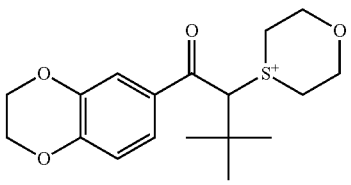
PAG5
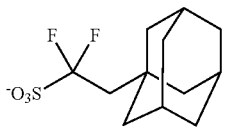
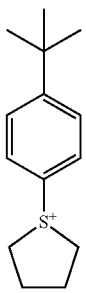
PAG6
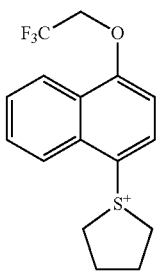 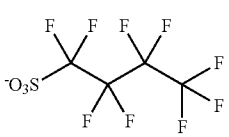
PAG7
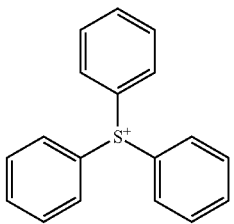
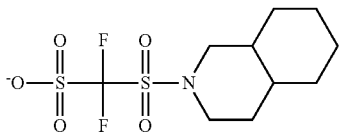
As the acid diffusion control agent, the following compounds were used.

Quencher 1

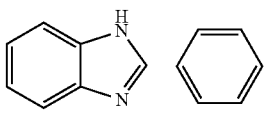

Quencher 2

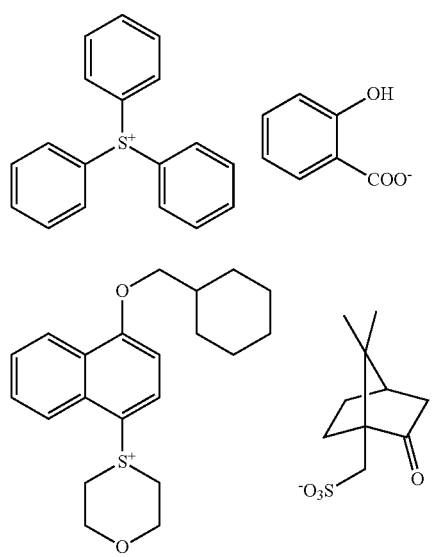

Quencher 3

Quencher 4

Quencher 5

Quencher 6

Quencher 7

Quencher 8

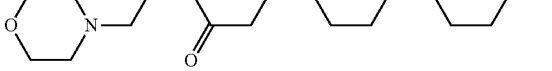
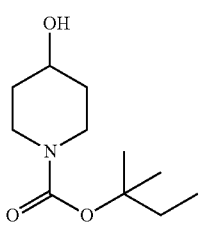

As the hydrophobic resin, the following resins were used. Further, the numeral values described on the right-handed side of the respective repeating units in the resin (1b) and the resin (2b) represent % by mole of the respective repeating units.

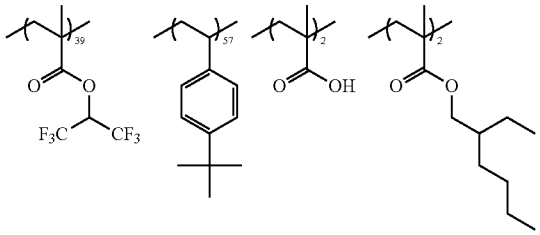

(1b)
Mw: 5800, Mw/Mn: 1.5

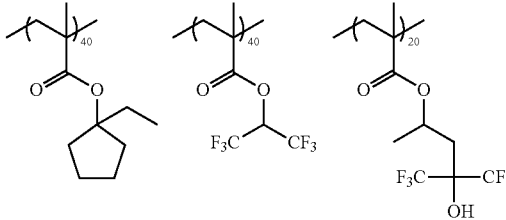

(2b)
Mw: 4800, Mw/Mn: 1.4

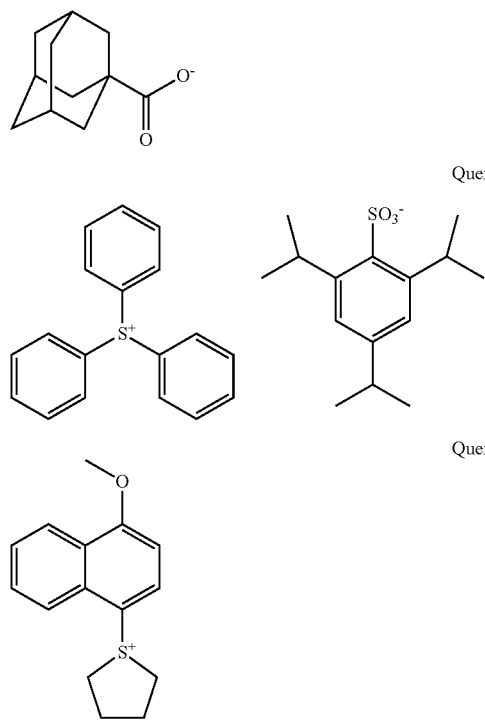
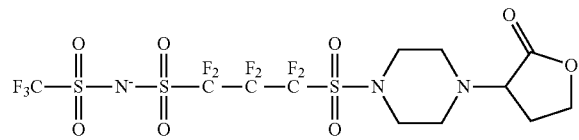

As the solvent, the following ones were used.
SL-1: Propylene glycol monomethyl ether acetate (PG-MEA)
SL-2: Butyl lactate
SL-3: Propylene glycol monomethyl ether (PGME)
SL-4: Cyclohexanone
SL-5: γ-Butyrolactone <Preparation of Composition (Resist Composition)>

The components shown in Table 1 below were dissolved in the solvents shown in the same tables such that the solid content became 3.5% by mass, and each of the solutions was filtered through a polyethylene filter having a pore size of 0.03 μm to prepare an actinic ray-sensitive or radiation-sensitive resin composition (resist composition).

TABLE 1

| Resist composition | Resin Type | Resin Addition amount (% by mass) | Acid generator 1 Type | Acid generator 1 Addition amount (% by mass) | Acid generator 2 Type | Acid generator 2 Addition amount (% by mass) | Acid diffusion control agent 1 Type | Acid diffusion control agent 1 Addition amount (% by mass) | Acid diffusion control agent 2 Type |
|---|---|---|---|---|---|---|---|---|---|
| Res-01 | Pol-1 | 81.4 | PAG 1 | 14.0 | | | Quencher 1 | 4.0 | |
| Res-02 | Pol-2 | 80.4 | PAG 2 | 15.0 | | | Quencher 2 | 4.0 | |
| Res-03 | Pol-3 | 79.4 | PAG 2 | 12.0 | PAG 7 | 3.0 | Quencher 3 | 5.0 | |
| Res-04 | Pol-4 | 82.9 | PAG 3 | 13.0 | | | Quencher 4 | 3.5 | |
| Res-05 | Pol-5 | 80.4 | PAG 4 | 16.0 | | | Quencher 1 | 2.0 | Quencher 6 |
| Res-06 | Pol-6 | 84.4 | PAG 5 | 11.0 | | | Quencher 4 | 4.0 | |
| Res-07 | Pol-8 | 83.4 | PAG 2 | 9.0 | PAG 7 | 3.0 | Quencher 3 | 3.0 | Quencher 1 |
| Res-08 | Pol-2 | 82.4 | PAG 2 | 7.0 | PAG 7 | 7.0 | Quencher 2 | 3.0 | |
| Res-09 | Pol-6 | 79.8 | PAG 2 | 15.0 | | | Quencher 5 | 3.0 | Quencher 8 |
| Rss-10 | Pol-3 | 81.4 | PAG 1 | 14.0 | | | Quencher 6 | 4.0 | |
| Res-11 | Pol-1 | 82.4 | PAG 2 | 12.0 | PAG 7 | 3.0 | Quencher 7 | 2.0 | |
| Res-12 | Pol-7 | 82.4 | PAG 6 | 13.0 | | | Quencher 2 | 4.0 | |
| Res-13 | Pol-9 | 89.4 | PAG 6 | 6.0 | | | Quencher 2 | 4.0 | |
| Res-14 | Pol-10 | 89.4 | PAG 6 | 6.0 | | | Quencher 2 | 4.0 | |
| Res-15 | Pol-4 | 85.4 | PAG 7 | 10.0 | | | Quencher 4 | 4.0 | |
| Res-16 | Pol-11 | 79.4 | PAG 2 | 15.0 | | | Quencher 1 | 5.0 | |

| Resist composition | Acid diffusion control agent 2 Addition amount (% by mass) | Hydrophobic resin 1 Type | Hydrophobic resin 1 Addition amount (% by mass) | Hydrophobic resin 2 Type | Hydrophobic resin 2 Addition amount (% by mass) | Solvent Type | Solvent Mass ratio |
|---|---|---|---|---|---|---|---|
| Res-01 | | 1b | 0.6 | | | SL-1/SL-4 | 80/20 |
| Res-02 | | 1b | 0.6 | | | SL-1/SL-2/SL-3 | 90/5/5 |
| Res-03 | | 1b | 0.6 | | | SL-1/SL-4/SL-5 | 90/5/5 |
| Res-04 | | 1b | 0.6 | | | SL-1/SL-4 | 80/20 |
| Res-05 | 1.0 | 1b | 0.4 | 2b | 0.2 | SL-1/SL-3 | 90/10 |
| Res-06 | | 1b | 0.6 | | | SL-1/SL-3 | 70/30 |
| Res-07 | 1.0 | 1b | 0.2 | 2b | 0.4 | SL-1/SL-4 | 65/35 |
| Res-08 | | 1b | 0.6 | | | SL-1/SL-4 | 70/30 |
| Res-09 | 1.0 | 1b | 0.6 | 2b | 0.6 | SL-1/SL-3 | 65/35 |
| Rss-10 | | 1b | 0.6 | | | SL-1/SL-3 | 60/40 |
| Res-11 | | 1b | 0.6 | | | SL-1/SL-2/SL-3 | 90/5/5 |
| Res-12 | | 1b | 0.6 | | | SL-1/SL-4/SL-5 | 90/5/5 |
| Res-13 | | 1b | 0.6 | | | SL-1/SL-4 | 80/20 |
| Res-14 | | 1b | 0.6 | | | SL-1/SL-4 | 80/20 |
| Res-15 | | 1b | 0.6 | | | SL-1/SL-4 | 80/20 |
| Res-16 | | 1b | 0.6 | | | SL-1/SL-4 | 80/20 |

The addition amount (% by mass) is an amount based on the total solid content of the resist composition.

[PEB Temperature Dependence (PEBs)]

Organic antireflection film-forming ARC29SR (manufactured by Nissan Chemical Industries, Ltd.) was coated on a silicon wafer and baked at 205° C. for 60 seconds to form an antireflection film having a film thickness of 95 nm. Then, the resist composition prepared above was coated thereon and baked (PB: Prebake) at 90° C. for 60 seconds to form a resist film having a film thickness of 100 nm.

The obtained resist film was subjected to pattern exposure through a 6% halftone mask having a 1:1 line-and-space pattern with a line width of 45 nm by using an ArF excimer laser liquid immersion scanner (manufactured by ASML; XT1700i, NA 1.20, C-Quad, outer sigma 0.960, inner sigma 0.709, and XY deflection). Further, ultrapure water was used as an immersion liquid. Thereafter, the resist film was heated (PEB) under three temperature conditions of 85° C., 90° C., and 95° C., each for 60 seconds.

Then, the resist film was subjected to paddle development with butyl acetate for 30 seconds to form a 1:1 line-and-space resist pattern with a line width of 45 nm. As compared with carrying out PEB at 90° C., the exposure dose (optimal exposure dose) for forming a 1:1 line-and-space resist pattern with a line width of 45 nm was determined by observing the pattern with a line-width length-measuring scanning electron microscope SEM (S-9380, Hitachi, Ltd.). At the optimal exposure dose, the resist film was subjected to exposure in the same manner as above, and then the line width in each line-and-space resist pattern formed by carrying out PEB under two temperature conditions of 85° C., and 95° C. was determined by observation with a line-width length-measuring scanning electron microscope SEM.

A dimensional change rate per 1° C. was calculated as temperature dependence by subtracting the line width of a resist pattern obtained by carrying out PEB at 85° C. from the line width of a resist pattern obtained by carrying out PEB at 95° C., and dividing the difference by a PEB temperature difference of 10° C. A smaller value of the PEB temperature dependence is more hard to be affected by a change in the PEB temperature, thereby obtaining good performance.

[Density Dependence]

In evaluation of PEBs above, the 1:1 line-and-space resist pattern with a line width of 45 nm obtained by carrying out PEB at 90° C. was used as a dense pattern. Further, with respect to the resist film, a resist pattern obtained by subjecting a light-shielding area having a line shape with a line width of 86 nm to the same exposure as above via a 6% half tone mask with a line-and-space pattern (line:space=50 nm:86 nm) having a pitch of 136 nm was taken as an isolated pattern.

The line width of the isolated pattern formed with the exposure dose (optimal exposure dose) for forming a dense pattern was determined by observation with a line-width length-measuring scanning electron microscope SEM (S-9380, Hitachi, Ltd.), and a difference between the line width of the isolated pattern and the line width of the dense pattern was determined and expressed as a density dependence. With the smaller value, the integrity to the density of a pattern in a mask is higher, thereby obtaining better performance.

The results of each of Examples and Comparative Examples are shown in Table 2 below.

TABLE 2

| Example No. | Resist composition | PEB temperature dependence (nm/° C.) | Density dependence (nm) |
|---|---|---|---|
| Example 1 | Res-01 | 1.1 | 8.1 |
| Example 2 | Res-02 | 1.1 | 7.8 |
| Example 3 | Res-03 | 1.0 | 8.0 |
| Example 4 | Res-04 | 1.2 | 8.2 |
| Example 5 | Res-05 | 1.3 | 8.5 |
| Example 6 | Res-06 | 1.3 | 8.7 |
| Example 7 | Res-07 | 1.5 | 9.1 |
| Example 8 | Res-08 | 1.6 | 9.8 |
| Example 9 | Res-09 | 1.8 | 10.6 |
| Example 10 | Res-10 | 1.9 | 11.0 |
| Example 11 | Res-11 | 1.9 | 10.8 |
| Example 12 | Res-12 | 2.1 | 12.1 |
| Example 13 | Res-13 | 2.1 | 12.3 |
| Example 14 | Res-14 | 2.1 | 12.2 |
| Comparative Example 1 | Res-15 | 2.5 | 14.6 |
| Comparative Example 2 | Res-16 | 2.6 | 15.3 |

As shown in Table 2, it could be seen that according to Examples 1 to 14, both of excellent PEB temperature dependence and excellent density dependence can be satisfied to a high degree, as compared with Comparative Example 1 in which the compound (B) in the present invention was not used and Comparative Example 2 in which the resin (A) in the present invention was not used.

Furthermore, it could be seen that according to Examples 1 to 11, in which a compound capable of generating the acid represented by General Formula (II) upon irradiation with actinic ray or radiation was used as the compound (B), the PEB temperature dependence and the density dependence were superior.

Moreover, it could be seen that according to Examples 1 to 8 using the actinic ray-sensitive or radiation-sensitive resin compositions further containing onium salts composed of relatively weak acids with respect to the acid generated from the compound (B) upon irradiation with actinic ray or radiation, among Examples 1 to 11, the PEB temperature dependence and the density dependence were superior.

In addition, it could be seen that according to Examples 1 to 7, in which the content of the compound (B) was 8% by mass or more with respect to the total solid content of the actinic ray-sensitive or radiation-sensitive resin composition, the PEB temperature dependence and the density dependence were superior, and according to Examples 1 to 6 in which the content of the compound (B) was 10% by mass or more, the PEB temperature dependence and the density dependence are even superior.

What is claimed is:

1. A pattern forming method comprising:
    forming a film using an actinic ray-sensitive or radiation-sensitive resin composition including (A) a resin which has an increase in the polarity by the action of an acid, and thus, has a decrease in the solubility in a developer containing an organic solvent, (B) a compound capable of generating an acid upon irradiation with actinic rays or radiation, represented by the following General Formula (ZI-3) or (ZI-4), (C) a solvent, and an onium salt composed of a relatively weak acid with respect to the acid generated from the compound (B) upon irradiation with actinic rays or radiation;
    exposing the film; and
    developing the exposed film using a developer including an organic solvent,
    wherein the resin (A) has a structure in which a polar group is protected with a leaving group that decomposes to leave by the action of an acid, and the leaving group is a group represented by the following General Formula (I), and
    wherein the onium salt is a compound represented by the following General Formulas (d1-1) to (d1-3) or a compound represented by the following General Formulas (C-1) to (C-3):

in General Formula (I), Z represents a group which is combined with a carbon atom to form a ring structure, Ra₁ to Ra₃ each independently represent an organic group, at least two members out of Ra₁ to Ra₃ may be bonded to each other to form a ring, and * represents a direct bond;

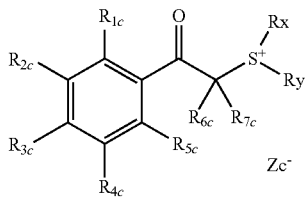

(ZI-3)

in General Formula (ZI-3), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group, $R_{6c}$ and $R_{7c}$ each independently represent a hydrogen atom, an alkyl group, a cycloalkyl group, a halogen atom, a cyano group, or an aryl group, Rx and Ry each independently represent an alkyl group, a cycloalkyl group, a 2-oxoalkyl group, a 2-oxocycloalkyl group, an alkoxycarbonylalkyl group, an allyl group, or a vinyl group, among any two or more members out of $R_{1c}$ to $R_{5c}$, $R_{5c}$ and $R_{6c}$, $R_{6c}$ and $R_{7c}$, $R_{5c}$ and Rx, and Rx and Ry each may be bonded to each other to form a ring structure, and the ring structure may contain an oxygen atom, a sulfur atom, a ketone group, an ester bond, or an amide bond, and Zc⁻ represents a non-nucleophilic anion;

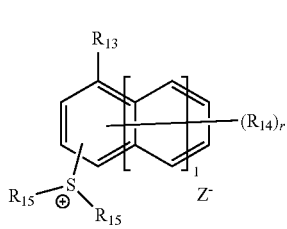

(ZI-4)

in General Formula (ZI-4), $R_{13}$ represents a group having a hydrogen atom, a fluorine atom, a hydroxyl group, an alkyl group, a cycloalkyl group, an alkoxy group, an alkoxycarbonyl group, or a cycloalkyl group, $R_{14}$'s, in the case where they are present in plural numbers, each independently represent a group having a hydroxyl group, an alkyl group, a cycloalkyl group, an alkoxy group, an alkoxycarbonyl group, an alkylcarbonyl group, an alkylsulfonyl group, a cycloalkylsulfonyl group, or a cycloalkyl group, $R_{15}$'s each independently represent an alkyl group, a cycloalkyl group, or a naphthyl group, two $R_{15}$'s may be bonded to each other to form a ring, and the ring structure may contain an oxygen atom, a sulfur atom, a ketone group, an ester bond, or an amide bond, l represents an integer of 0 to 2,
r represents an integer of 0 to 8, and
Z⁻ represents a non-nucleophilic anion;

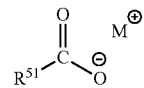

(d1-1)

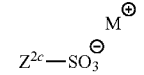

(d1-2)

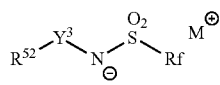

(d1-3)

in General Formulas (d1-1) to (d1-3), $R^{51}$ is a hydrocarbon group which may have a substituent, $Z^{2c}$ is a hydrocarbon group having 1 to 30 carbon atoms, which may have a substituent, provided that carbon adjacent to S is not substituted with a fluorine atom, $R^{52}$ is an organic group, $Y^3$ is a linear, branched, or cyclic alkylene group or arylene group, Rf is a hydrocarbon group containing a fluorine atom, and M⁺'s are each independently a sulfonium cation or an iodonium cation; and

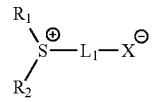

(C-1)

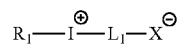

(C-2)

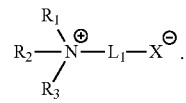

(C-3)

in General Formulas (C-1) to (C-3), $R_1$, $R_2$, and $R_3$ represent a substituent having 1 or more carbon atoms, $L_1$ represents a divalent linking group that links a cationic moiety with an anionic moiety, or a single bond, —X⁻ represents an anionic moiety selected from —COO⁻, —SO₃⁻, —SO₂⁻, and —N⁻—R₄, R₄ represents a monovalent substituent having a carbonyl group: —C(=O)—, a sulfonyl group: —S(=O)₂—, or a sulfinyl group: —S(=O)— at a site for linking to an adjacent N atom, $R_1$, $R_2$, $R_3$, $R_4$, and $L_1$ may be bonded to one another to form a ring structure, and in (C-3), two members out of $R_1$ to $R_3$ may be combined to form a double bond with an N atom.

2. The pattern forming method according to claim 1, wherein the compound (B) is a compound capable of generating an acid represented by the following General Formula (II) upon irradiation with actinic ray or radiation:

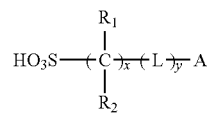

(II)

in General Formula (II), $R_1$ and $R_2$ each independently represents a hydrogen atom, a fluorine atom, or an alkyl group, and $R_1$ and $R_2$, in the case where they are present in plural numbers, may be the same as or different from each other, L represents a divalent linking group and L's in the case where they are present in plural numbers may be the same as or different from each other, A represents a cyclic organic group, x represents an integer of 0 to 20, and y represents an integer of 0 to 10.

3. The pattern forming method according to claim 1, wherein the content of the compound (B) is more than 5% by mass with respect to the total solids content of the actinic ray-sensitive or radiation-sensitive resin composition.

4. The pattern forming method according to claim 2, wherein the content of the compound (B) is more than 5% by mass with respect to the total solids content of the actinic ray-sensitive or radiation-sensitive resin composition.

5. The pattern forming method according to claim 1, wherein the developer including an organic solvent is a developer containing at least one kind of solvent selected from a ketone-based solvent, an ester-based solvent, an alcohol-based solvent, an amide-based solvent, and an ether-based solvent.

6. A method for manufacturing an electronic device, comprising the pattern forming method according to claim 1.

* * * * *